US 8,890,729 B2

(12) United States Patent
Lewis et al.

(10) Patent No.: US 8,890,729 B2
(45) Date of Patent: Nov. 18, 2014

(54) RANDOMIZED TIME-INTERLEAVED SAMPLE-AND-HOLD SYSTEM

(71) Applicant: Crest Semiconductors, Inc., San Jose, CA (US)

(72) Inventors: Donald E. Lewis, Nevada City, CA (US); Ryan James Kier, Salt Lake City, UT (US); Rex K. Hales, Riverton, UT (US); Yusuf A. Haque, Woodside, CA (US)

(73) Assignee: Crest Semiconductors, Inc., San Jose, CA (US)

( * ) Notice: Subject to any disclaimer, the term of this patent is extended or adjusted under 35 U.S.C. 154(b) by 0 days.

(21) Appl. No.: 13/751,062

(22) Filed: Jan. 26, 2013

(65) Prior Publication Data
US 2014/0152478 A1    Jun. 5, 2014

Related U.S. Application Data

(63) Continuation-in-part of application No. 13/706,035, filed on Dec. 5, 2012.

(51) Int. Cl.
*H03M 1/10* (2006.01)
*H03M 1/12* (2006.01)

(52) U.S. Cl.
CPC .................................. *H03M 1/1245* (2013.01)
USPC ........... 341/120; 341/118; 341/122; 341/155; 341/158

(58) Field of Classification Search
CPC ............ H03M 1/1215; H03M 1/0836; H03M 1/0673; H03M 3/474; H03M 1/1225; H03M 1/0607; H03M 1/1205; H03M 1/122; H03M 3/47

USPC .................. 341/118, 120, 122, 155, 172, 159
See application file for complete search history.

(56) References Cited

U.S. PATENT DOCUMENTS

| | | | | |
|---|---|---|---|---|
| 5,543,806 A * | 8/1996 | Wilkinson | ..................... | 342/368 |
| 6,160,508 A * | 12/2000 | Gustavsson et al. | .......... | 341/155 |
| 6,392,575 B1 * | 5/2002 | Eklund | .......................... | 341/141 |
| 6,407,687 B2 * | 6/2002 | Martin et al. | ................... | 341/122 |
| 6,542,017 B2 * | 4/2003 | Manganaro | .................... | 327/291 |
| 6,900,750 B1 * | 5/2005 | Nairn | .............................. | 341/118 |
| 8,094,050 B2 * | 1/2012 | Sestok et al. | .................... | 341/120 |
| 8,611,483 B2 * | 12/2013 | Zhu et al. | ........................ | 375/349 |
| 8,643,428 B2 * | 2/2014 | Dedic et al. | ..................... | 327/415 |
| 2001/0052864 A1 * | 12/2001 | Shimizu et al. | ................ | 341/141 |
| 2005/0068217 A1 * | 3/2005 | Tsujita | ............................ | 341/155 |
| 2005/0190089 A1 * | 9/2005 | Draxelmayr et al. | .......... | 341/141 |
| 2008/0284625 A1 * | 11/2008 | Joy et al. | ......................... | 341/123 |
| 2010/0253414 A1 * | 10/2010 | Dedic et al. | ..................... | 327/415 |
| 2011/0260898 A1 * | 10/2011 | Velazquez | ...................... | 341/110 |
| 2012/0268299 A1 * | 10/2012 | Kidambi | ......................... | 341/155 |
| 2012/0326904 A1 * | 12/2012 | Jensen et al. | ................... | 341/131 |

* cited by examiner

*Primary Examiner* — Linh Nguyen
(74) *Attorney, Agent, or Firm* — Steven L. Nichols; VanCott, Bagley, Cornwall & McCarthy P.C.

(57) ABSTRACT

A time interleaving Analog-to-Digital Converter (ADC) comprises a plurality of ADCs; a timing generator that generates a dock signal for each of the plurality of ADCs such that edges of said clock signals trigger sampling of an input signal by the plurality of ADCs; and a timing adjustment circuit to receive and adjust the dock signals before the dock signals are received by the ADCs such that samplings of said input signal are spaced in time and occur at a rate of 1/N times a desired sampling rate; and a random number generator to pseudo randomly select which ADC samples the input signal; and a circuit for adjusting the bandwidth of the plurality of ADCs.

36 Claims, 28 Drawing Sheets

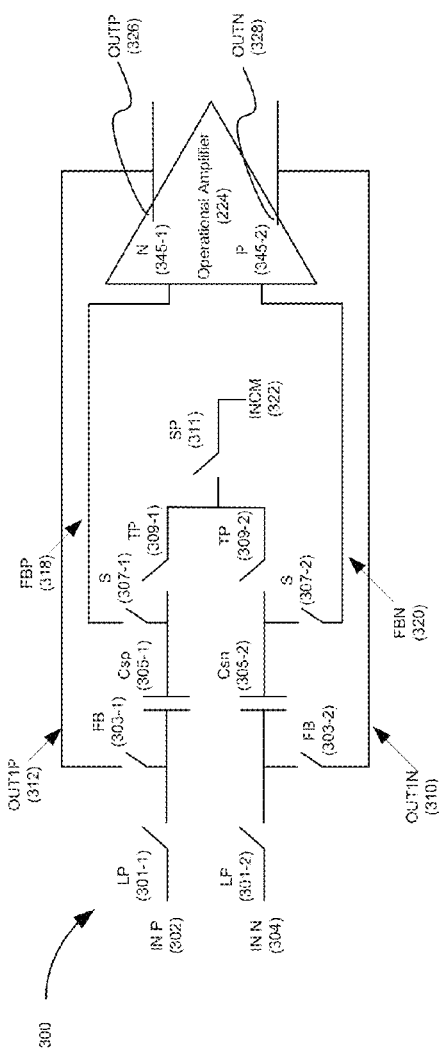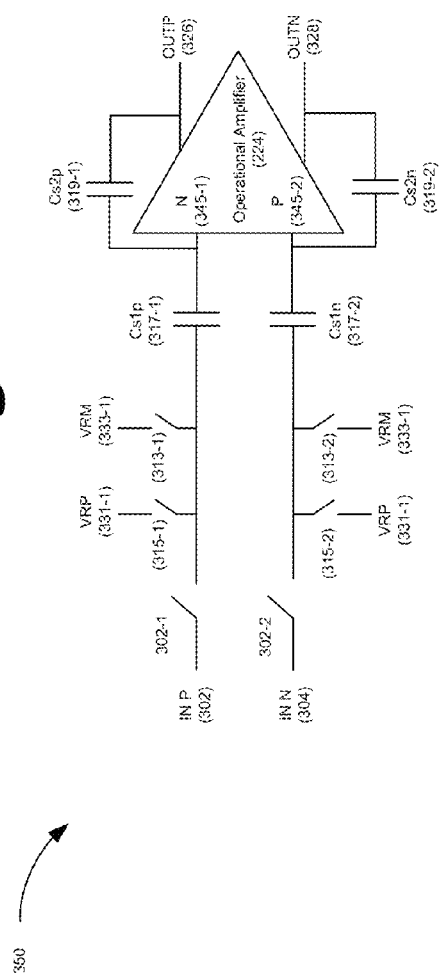
Fig. 3A
Fig. 3B

RANDOMIZED TIME-INTERLEAVED SAMPLE-AND-HOLD SYSTEM

RELATED DOCUMENTS

Present application is a continuation-in-part, and claims the benefit under 35 U.S.C. §120, of U.S. application Ser. No. 13/706,035, filed Dec. 5, 2012, entitled "Time Interleaving Analog-to-Digital converter" to Donald E. Lewis et al. This application is incorporated herein by reference in its entirety.

BACKGROUND

Electronic devices typically make use of both analog and digital signals. An analog signal is a continuous signal which may assume any value. A digital signal is one which may assume one of a discrete set of values. A signal may be in the form of an electrical current or a voltage. Electronic circuitry often includes devices for converting analog signals into digital signals and vice versa. For example, an Analog-to-Digital Converter (ADC) is used to capture an analog signal and produce an equivalent digital signal.

Time-interleaving is the coordination of multiple lower sample rate devices to achieve a higher sample rate result. For example, some time-interleaved analog-to-digital converters coordinate the operations of two or more lower sample rate analog-to-digital converters to produce a digital output at a higher sample rate, effectively replicating the effect of a single higher sample rate analog-to-digital converter. Time-interleaving allows for the use of slower, less-expensive components to produce high sample rate results that are prohibitively expensive or otherwise unfeasible to achieve with a single component.

BRIEF DESCRIPTION OF THE DRAWINGS

The accompanying drawings illustrate various examples of the principles described herein and are a part of the specification. The examples do not limit the scope of the claims.

FIG. 3A is a diagram showing an illustrative time-interleaved sample mode system, according to one example of principles described herein.

FIG. 3B is a diagram showing an illustrative time-interleaved hold mode system, according to one example of principles described herein.

Throughout the drawings, identical reference numbers designate similar, but not necessarily identical, elements.

DETAILED DESCRIPTION

Figure 1A:
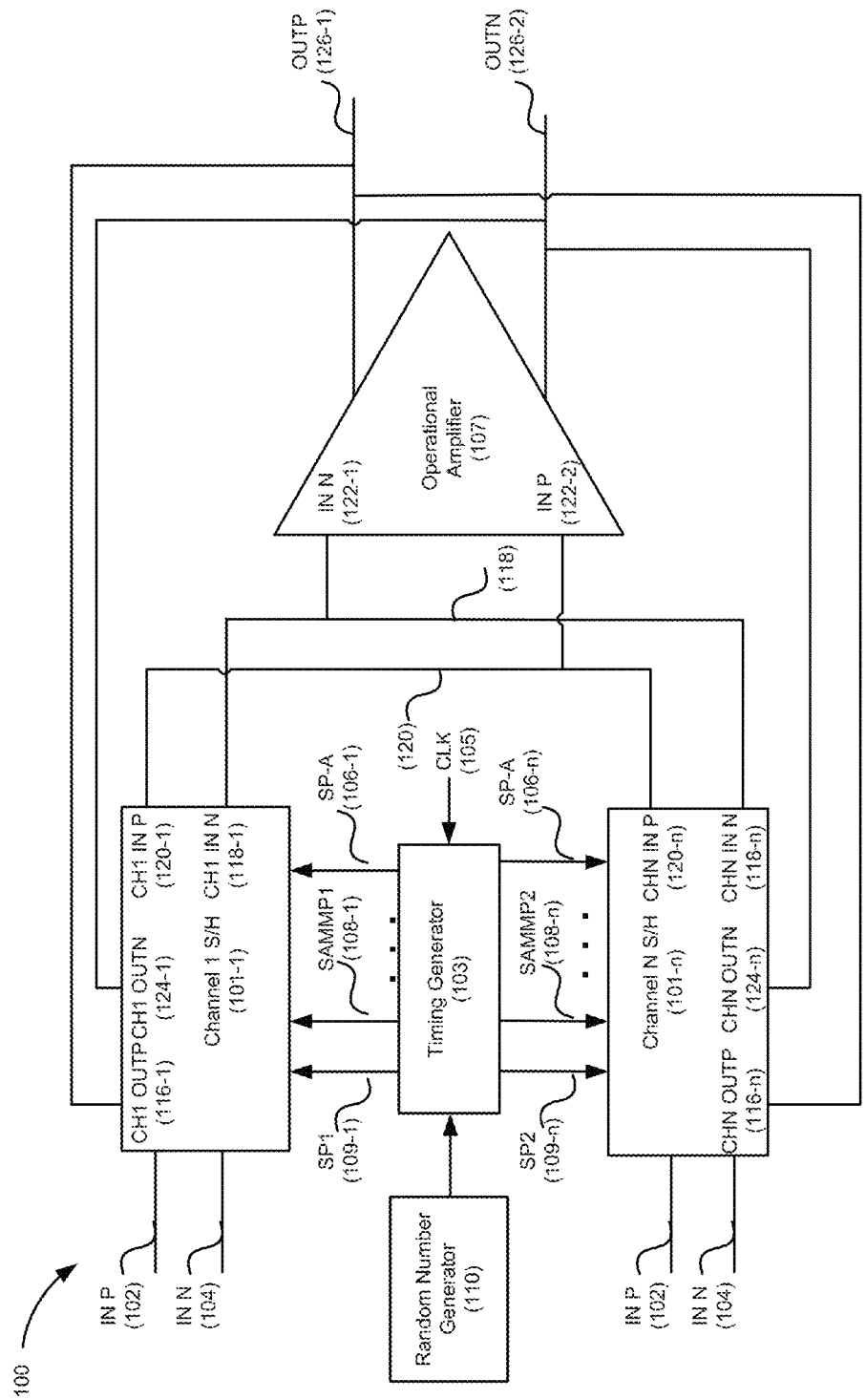
FIG. 1A is a diagram showing an illustrative time-interleaved sample-and-hold system, according to one example of principles described herein.

A time-interleaving analog-to-digital converter (ADC) is a special class of ADC which employs several low sampling rate ADCs to construct an ADC capable of sampling an input at a higher rate. For example, assume an input signal is sampled at a rate of Fs. According to certain principles it is difficult to construct an ADC capable of sampling at Fs due to technical limitations as well as cost efficiency. However, it is possible to use a number of (N) slower ADCs, each sampling at a rate of Fs/N, to build a composite ADC that has an effective sampling rate of Fs. In such a case, each of the N slower ADCs takes turns sampling the input such that the time interval between subsequent sampling events, Ts is equal to 1/Fs. Further, the time interval between two sampling events using any one of the N slower ADCs is never less than N*Ts. Despite the advantages associated with time-interleaving multiple ADC components, various issues accompany the implementation of time-interleaving. One of these issues is in the matching of certain properties and characteristics among the interleaved components. One of these issues is in the matching of various properties and characteristics among the interleaved components to optimize the time interleaved ADC's performance. Specifically, in a time interleaved ADC, there are conceptually two or more parallel ADC paths. As mentioned above, the outputs of these two or more ADCs are interleaved such that the two or more ADCs take turns sampling an input signal at consecutive intervals. All of these time interleaving ADCs should experience the same timing delay, signal gain, offset, and bandwidth when they are combined so as to form the final digital data stream that represents the sampled analog input.

In various examples of a time-interleaving ADC, if mismatch is present in a time interleaving ADC, the output of the time interleaving ADC will be a distorted version of the input signal. This particular type of distortion is referred to as intermodulation distortion. Intermodulation distortion is characterized in the frequency domain by the presence of energy or spurs at certain frequencies not present in the frequency spectrum of the time interleaving ADC's input signal. The locations of these undesired spurs are related to the input signal's frequency spectrum and the sampling rate of the time interleaving ADC. For example, assume an input signal to an N-way time-interleaving ADC is a pure sinusoid with a frequency of Fin. If the N ADCs comprising the N-way time-interleaving ADC are mismatched then the frequency spectrum of the time-interleaving ADC's output contains spurs at a number of frequencies such as n*Fs/N and n*Fs/N+/−Fin where n=0 ... N/2 and Fs is the effective sampling rate of the time-interleaving ADC. Further, a desired output is for the case of n=0 which corresponds to the input signal alone. Thus, other spurs are the undesired result of intermodulation distortion caused by various types of mismatch among a number of ADCs used to construct a time-interleaving ADC.

Often, there are four types of mismatch that create intermodulation distortion in the output of a time-interleaving ADC. Namely, bandwidth mismatch, sampling time mismatch, gain mismatch, and offset mismatch. Each type of mismatch will be discussed below, but first the concept of intermodulation distortion is introduced to provide a framework for understanding the impact of each mismatch type on the dynamic range of a time-interleaved ADC.

According to certain principles of the present specification, the impact of mismatches are best understood by considering their effects on the magnitude, phase, and offset of a purely sinusoidal analog input signal as the signal is converted from analog to digital by a time-interleaving ADC. Ideally the frequency spectrum of the output of any ADC would contain only the magnitude and phase information corresponding to the input signal. However, mismatches in the properties and characteristics of the ADCs within a time-interleaving ADC causes errors in the magnitude, phase, and offset of the input signal. When the output spectrum of a single ADC within the time interleaved ADCs is examined, the magnitude, phase, and offset information of the input signal are represented. However, because each ADC may have slightly different signal processing characteristics these three quantities are different for each ADC. The gain, phase, and offset errors may be characterized by arbitrarily choosing one of the ADC signal paths as a reference path against which the remaining N−1 ADC signal paths are compared. Magnitude and phase errors lead to distortion spurs at n*Fs/N+/−Fin for n=1 ... N/2. Offset errors lead to distortion spurs at n*Fs/N for n=1 ... N/2.

The presence of intermodulation distortion in the output of a time-interleaving ADC degrades a number of characteristics of the ADC performance, such as, spurious-free dynamic range (SFDR), and signal-to-noise and distortion ratio (SNDR). SFDR is defined to be the ratio of the magnitude of desired sinusoidal input signal to the magnitude of the largest spur at any frequency other than the input signal frequency and dc (zero frequency). SFDR may be expressed in decibels relative to the carrier (dBc) where the carrier is the magnitude of the signal located at the desired input frequency, or in decibels relative to the full-scale range of the ADC (dBFS). SNDR is defined to be the ratio of the power at the input sinusoidal input frequency to the sum of all of the remaining power except the power at dc. Like SFDR, SNDR may be expressed in units of dBc or dBFS.

Each of the four mismatch types mentioned above contributes differently to the magnitude, phase, and offset errors among the ADC signal paths comprising a time-interleaving ADC. Thus, each mismatch type contributes to intermodulation distortion that degrades the SFDR and SNDR of a time-interleaving ADC.

Bandwidth mismatch contributes to frequency-dependent magnitude and phase errors, but it does not contribute to offset errors. The analog input bandwidth of an ADC is the range of analog input signal frequencies over which the magnitude and phase of the output signal remain within certain bounds relative to the input signal. In various examples, bandwidth is the difference between the maximum and minimum frequencies for which the ratio of the output signal magnitude to the input signal magnitude is within +/−3 dB of a particular reference level. Often an ADC's input-to-output signal response is well approximated by a first-order low-pass filter (LPF). In this case, the magnitude of the output signal is equal to the input signal at dc (Fin=0 Hz) and it gradually decreases as the input signal frequency increases. As the input signal frequency passes beyond the frequency at which the output is 3 dB smaller than the input, the output signal is increasingly attenuated at a rate of 20 dB per decade. Just as the magnitude of the output signal differs from that of the input signal as a function of signal frequency, so too does the phase angle of the output signal. Consequently, the input signal experiences a change in magnitude and phase as it is processed by each ADC within a time-interleaving ADC. The amount of the magnitude and phase change experienced by the input signal is dependent on the 3-dB bandwidth of each ADC. Thus any mismatch in the bandwidths of the N ADCs within a time-interleaved ADC results in both magnitude and phase errors. Further, such errors are dependent on the input signal frequency. Consequently, bandwidth mismatches causes frequency-dependent intermodulation distortion spurs to be present in the output of a time-interleaved ADC.

Sampling time mismatch contributes to frequency-dependent phase error but does not contribute to offset error. In various examples the architecture of an ADC's sampling circuit and sampling time mismatch contributes to magnitude error which is often frequency dependent. Sampling time mismatch occurs when the time interval between subsequent sampling events in a time-interleaving ADC deviates from the ideal interval of N/Fs. This may occur, for example, if the clock signals routed to each of the N ADCs within a time-interleaving ADCs experience different delays. Such delays may be the result of small variations in the manufacturing process, or possibly due to design constraints on the layout of the circuitry. Consequently, the phase error versus input frequency will increase or decrease linearly with a slope equal to the sampling time mismatch between a pair of ADC signal paths within a time-interleaved ADC. Additionally, the structure of the sampling circuitry may be such that the sampled analog signal is weighted average of the input analog signal at two or more sampling times. Such a sampling structure is described below. Such weighted-average sampling results in a discrete-time filtering of the analog input signal. A consequence of such filtering is frequency-dependent magnitude and phase in the sampled signal. Thus if the sampling times of a number of ADCs within a time-interleaving ADC are mismatched, the output signals of each ADC will contain frequency-dependent phase and magnitude errors. Consequently, when these output signals are combined to form the output of the time-interleaving ADC, the resulting output frequency spectrum will contain frequency-dependent intermodulation distortions spurs.

Gain mismatch contributes to the magnitude errors and is frequency-independent. However, gain mismatch may be frequency-dependent, depending on the architecture of the ADC. In various examples, an ADC produces a quantized version of its analog input signal that has the same magnitude as the input signal. However, it is common for a difference in the magnitudes of the ADC's input and output signals to be present. The difference is referred to as the ADC's gain error, and there are many possible sources for this error that depend on the specific implementation of the ADC. In a time-interleaving ADC, the differences in the gain errors of the individual ADCs that comprise the time-interleaving ADC are called the gain mismatches. The gain mismatches result in magnitude errors in time-interleaving ADC's output. As described above, magnitude errors cause intermodulation distortion spurs to be present in the frequency spectrum of a time-interleaving ADC's output.

Finally, offset mismatch contributes to the offset errors and is frequency-independent. However, in various examples offset mismatch is frequency-dependent depending on the architecture of the ADC. In various examples, an ADC produces a quantized version of its analog input signal that has the same offset as the input signal. However, it is common for a difference in the offsets of the ADC's input and output signals to be present. This difference is referred to as the ADC's offset error, and there are many possible sources for this error that depend on the specific implementation of the ADC. In a time-interleaving ADC, the differences in the offset errors of the individual ADCs that comprise the time-interleaving ADC are called the offset mismatches. These offset mismatches result in offset errors in time-interleaving ADC's output. As described above, offset errors cause intermodulation distortion spurs to be present in the frequency spectrum of a time-interleaving ADC's output.

As the digital bit resolution of a time-interleaving ADC increases, the intermodulation distortion spurs introduced by various mismatched components become more and more relevant in determining a number of ADC performance metrics such as SFDR and SNDR. Specifically these performance metrics become limited by the intermodulation spurs. Consequently, special circuitry and calibration functions are used to identify and correct these mismatches to minimize intermodulation distortion spurs thereby maximizing the dynamic performance of time-interleaving ADCs.

Accordingly, the present specification discloses systems and methods for constructing and calibrating time-interleaved ADCs using special circuitry to reduce or eliminate bandwidth mismatch, sampling time mismatch, gain mismatch, and offset mismatch between a number of ADCs comprising a time-interleaving ADC. The systems and methods described herein mitigate bandwidth mismatch, sampling time mismatch, gain mismatch, and offset mismatch between two or more time-interleaved circuits.

Additionally, the introduction of pseudo-randomness into the sampling of a number of ADCs provides the advantage of spreading the energy of any generated intermodulation spurs in the output of a time-interleaved ADC such that these intermodulation spurs are indistinguishable from noise. Through use of methods and systems described herein, a time-interleaving ADC can be manufactured with a random number generator. During normal operation the random number generator randomly select which ADC in the time-interleaved ADC samples the analog input. For example, assume three ADCs are used to sample the analog input of the time-interleaved ADC system. Further assume the three ADCs are ADC 1, ADC 2, and ADC 3. Assume ADC is sampling process of the analog input is complete. The next ADC to sample the analog input is either ADC 2 or ADC 3. Assume the random number generator selects ADC 3 to sample the analog input. After ADC 3 samples the analog input, the next ADC to sample the analog input is either ADC 1 or ADC 2. Further, the next ADC is chosen randomly by the random number generator. This process is repeated a number of times. Additionally, if an ADC has sampled the analog input, the next ADC to sample the analog input cannot be the same ADC. Thus, by the introduction of pseudo-randomness, intermodulation spurs are reduced to noise.

Further, a time-interleaving ADC circuit can be manufactured with a component to adjust the bandwidth of each ADC therein. Specifically, during test mode or via calibration, the bandwidth mismatch of each ADC can be determined relative to an arbitrarily selected ADC to serve as a reference ADC. The bandwidth for each ADC may then be adjusted upward or downward until the bandwidth mismatches relative to the reference ADC are minimized. As described above, bandwidth mismatch causes frequency-dependent magnitude and phase errors which give rise to frequency-dependent intermodulation distortion spurs. Without bandwidth matching, adjustments to gain and timing are only valid to reduce distortion within a narrow region around one input frequency. Thus, with bandwidth adjustments, frequency-dependent distortion can be reduced over a wide range of input frequencies.

Through use of methods and systems embodying principles described herein, the bandwidth mismatches within a time-interleaving ADC can be measured and adjusted such that the bandwidths of the interleaved ADCs are equalized. Further, bandwidth mismatch correction coefficients can be determined without the need for special measurement instruments. Additionally, memory elements such as one time programmable (OTP) memory can be used for digitally storing bandwidth correction coefficients that are applied to analog circuits that modify the bandwidths of the sampling circuits in each of the ADCs comprising a time-interleaving ADC.

The bandwidth correction coefficients are determined by first sampling a number of input signals at various frequencies, and computing the resulting frequency-dependent magnitude and phase errors by applying a fast-Fourier-transform (FFT) to the digital output stream of each of the constituent ADCs. Next, the resulting magnitude and phase errors are processed by a mathematical function which identifies the magnitude of the bandwidth mismatches between each path of the constituent ADCs and the reference ADC. Subsequently, these extracted bandwidth mismatches are converted into the bandwidth correction coefficients based on the resolution of the analog bandwidth adjustment circuitry. Finally, the digital bandwidth correction coefficient is burned into the OTP, for example, during a test operation performed, for example, at the factory for a semiconductor chip. Thus, it is possible to measure the relative bandwidth mismatches without the need of special measurement instruments.

During normal operation of the time-interleaving ADC, the stored value or content of the memory elements are used to control the bandwidths of the constituent ADCs through analog bandwidth adjustment circuits. In one example, the digital bandwidth correction coefficients may control switches that are used to increase or decrease series resistance in the sampling circuits of the interleaved ADCs. Such increases or decreases in series resistance can adjust the bandwidths in the analog domain under digital control. Bandwidth mismatch in another example may also be corrected by adjusting capacitor values in a filter connected in front of a sample-and-hold circuit associated with each interleaved ADC. Digital bandwidth correction coefficients may control switches that are used to increase or decrease capacitance in filter circuits in the interleaved ADCs.

In addition to correcting bandwidth mismatches, it is also desirable to correct sampling time mismatches between the interleaved ADCs. As mentioned above, sampling time mismatches leads to frequency-dependent phase errors and possibly frequency-dependent amplitude errors, both of which create intermodulation spurs in the output of a time-interleaving ADC. It is possible to construct analog timing adjustment circuitry that is controlled by a digitally stored timing correction coefficient.

Through use of methods and systems embodying principles described herein, the sampling time mismatches within a time-interleaving ADC can be measured and adjusted such that the time intervals between any two sequential sampling events of the time-interleaving ADCs are equalized. Further, sampling time mismatch correction coefficients can be determined without the need for special measurement instruments. Memory elements such as one time programmable (OTP) memory can be used for digitally storing sampling time correction coefficients that are applied to analog circuits that modify the sampling times of the sampling circuits in each of the constituent ADCs comprising a time-interleaving ADC.

During test mode, the sampling time correction coefficients are determined by first sampling a number of input signals at various frequencies, and computing the resulting frequency-dependent magnitude and phase errors by applying a fast-Fourier-transform (FFT) to the digital output stream of each of the constituent ADCs. Next, the resulting magnitude and phase errors are processed by a mathematical function which identifies the magnitude of the sampling time mismatches between each of the constituent ADCs and the reference ADC. Subsequently, these extracted sampling time mismatches are converted into the sampling time correction coefficients based on the resolution of the analog sampling time adjustment circuitry. Finally, the digital sampling time correction coefficient is burned into the OTP, for example, during a test operation performed, for example, at the factory for a semiconductor chip. Thus, it is possible to measure the relative sampling mismatches without the need of special measurement instruments.

During normal operation of the time-interleaving ADC, the stored value or content of the memory elements are used to control the sampling times of the constituent ADCs through analog sampling time adjustment circuits. In one example, the digital sampling time correction coefficients may control switches that are used to increase or decrease shunt capacitances between various logic gates within the sampling time generation circuits of the interleaved ADCs. Such increases or decreases in shunt capacitances can adjust the sampling times in the analog domain under digital control.

As mentioned above, intermodulation distortion can reduce the SNDR of a time-interleaving ADC. Similarly, sampling time jitter can reduce the SNDR of a time-interleaving ADC. In contrast to the deterministic sampling time mismatches that give rise to intermodulation distortion, sampling time jitter is a random variation in the time interval between two sequential sampling events. Consequently, additional jitter is introduced in the sampling times that would otherwise not be present. Additional jitter can degrade the signal to noise ratio (SNR) of the ADC. However, it is possible to construct a sampling circuit in which the sampling time adjustment circuitry operates in a manner that significantly reduces the impact of jitter caused by the delay adjustment circuitry on the resulting SNR. Through use of methods and systems embodying principles described herein, jitter in the sampling time adjustment circuitry may be mitigated to achieve minimal impact to resulting SNR.

In contrast to the bandwidth and sampling time mismatches which are conveniently corrected in the analog domain, gain and offset mismatches are more easily corrected in the digital domain. Further, it is often possible to integrate the required correction circuitry with other required digital circuitry resulting in possible area and power reduction.

As described above, gain mismatches between the interleaved signal paths in a time-interleaving ADC produce magnitude errors in the constituent ADC outputs. If left uncorrected, the magnitude errors introduced by the gain mismatches will create intermodulation spurs in the output of a time-interleaving ADC. It is possible to construct digital gain adjustment circuitry that is controlled by a digitally-stored gain coefficient.

Through use of methods and systems embodying principles described herein, the gain mismatches within a time-interleaving ADC can be measured and adjusted such that the signal gains of each constituent ADC sampling path within a time-interleaving ADC are equalized. Further, gain mismatch correction coefficients can be determined without the need for special measurement instruments. Memory elements such as one time programmable (OTP) memory can be used for digitally storing gain correction coefficients that are applied to digital circuits that modify the signal gains of each of the ADCs comprising a time-interleaving ADC.

During test mode, the gain correction coefficients are determined by first sampling a number of input signals at various frequencies, and computing the resulting frequency-dependent magnitude and phase errors by applying a fast-Fourier-transform (FFT) to the digital output stream of each of the constituent ADCs. Next, the resulting magnitude and phase errors are processed by mathematical function which identifies the magnitude of the gain mismatches between each of the constituent ADCs and the reference ADC. Subsequently, these extracted gain mismatches are converted into the gain correction coefficients based on the resolution of the digital gain adjustment circuitry. Finally, the digital gain correction coefficient is burned into the OTP, for example, during a test operation performed, for example, at the factory for a semiconductor chip. Thus, relative gain mismatches are measured without the need of special measurement instruments.

Through use of methods and systems embodying principles described herein, during normal operation of the time-interleaving ADC, the stored value or content of the memory elements are used to control the signal gains of the constituent ADCs through digital gain adjustment circuits. In one example, the digital gain correction coefficients are passed to one input of a digital multiplier circuit which has its second input taken from either the output of an individual constituent ADC or the output of a digital multiplexer circuit that is used to interleave all of the outputs of the constituent ADCs. By providing the appropriate stored digital gain correction coefficients at the appropriate times, the gain mismatches in the constituent ADC signal paths may be reduced or eliminated.

As mentioned above, offset mismatches between the interleaved signal paths in a time-interleaving ADC produces offset errors in the constituent ADC outputs. If left uncorrected, these offset errors will create intermodulation spurs in the output of a time-interleaving ADC.

Through use of methods and systems embodying principles described herein, the offset mismatches within a time-interleaving ADC can be measured and adjusted such that the offsets of each constituent ADC sampling path within a time-interleaving ADC are equalized. Further, offset mismatch correction coefficients can be determined without the need for special measurement instruments. Memory elements such as one time programmable (OTP) memory can be used for digitally storing offset correction coefficients that are applied to digital circuits that modify the offsets of each of the ADCs comprising a time-interleaving ADC.

During test mode, the offset correction coefficients are determined by first sampling a number of input signals at various frequencies, and computing the resulting frequency-dependent magnitude and phase errors by applying a fast-Fourier-transform (FFT) to the digital output stream of each of the constituent ADCs. Next, the resulting input frequency dependent offset errors are processed by a mathematical function which identifies the magnitude of the offset mismatches between each of the constituent ADCs and the reference ADC. Subsequently, these extracted offset mismatches are converted into the offset correction coefficients based on the resolution of the digital offset adjustment circuitry. Finally, the digital offset correction coefficient is burned into the OTP, for example, during a test operation performed, for example, at the factory for a semiconductor chip. Thus, it is possible to measure the relative offset mismatches without the need of special measurement instruments.

During normal operation of the time-interleaving ADC, the stored value or content of the memory elements are used to control the offsets of each ADCs through digital offset adjustment circuits. In one example, the digital offset correction coefficients may be passed to one input of a digital adder circuit which has its second input taken from either the output of an individual constituent ADC or the output of a digital multiplexer circuit that is used to interleave all of the outputs of the constituent ADCs. By providing the appropriate stored digital offset correction coefficients at the appropriate times, the offset mismatches in the constituent ADC signal paths may be reduced or eliminated.

Although the descriptions above indicate that the digital correction coefficients are extracted from measurements obtained using various input signal frequencies, those measurements and the subsequent mathematical function processes need not be repeated to obtain each digital correction coefficient. Rather, it is possible to extract all digital gain correction coefficients from a single set of measurement and a single mathematical function processes.

As used in the present specification and in the appended claims, the term "memory element" refers broadly to a memory device in which digital correction values for bandwidth, timing, gain, and offset may be stored. A memory element may include, but is not limited to, a static random access memory (SRAM), one-time programmable memory (OTP), or any other memory device or method that may store data and in which stored data may be retrieved.

It should be understood that while the following examples and the attached Figures describe the principles of the present specification in the context of a time-interleaving ADC system using a number of separate ADC circuits, the principles described herein involving randomized sampling are applicable as long as three or more ADCs are used. The principles described herein may be successfully applied to time-interleaved systems of three or more ADC circuits, hence the notation –n in the accompanying figures. It is understood that these measurements and mathematical processing to determine the digital coefficients can also be done during actual use of the ADC as long as time is made available to collect and process the measurements and to write the digital coefficients into memory before proceeding with ADC operations. Alternatively, these mismatches may be reduced using background calibration and the remaining mismatches can be reduced by the randomized sampling technique as described here.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

In the following description, for purposes of explanation, the sampling of an analog input is performed by a number of Sample-and-Hold (S/H) circuits. The output of the S/H circuits is a sampled and held version of the analog input. An ADC employs a S/H circuit to sample and hold the input signal. For simplicity, in this specification, a S/H circuit, sampling an input signal, is referred to as an ADC.

Referring now to the figures, FIG. 1A is a diagram showing an illustrative time-interleaved sample-and-hold system, according to one example of principles described herein. The use of time-interleaving circuits can be applied to any circuit or application for which a high-bandwidth output is desirable. For example, time-interleaving system (100) may be used in a high-speed analog-to-digital converter to increase the SFDR of a digital representation of an analog signal. As mentioned above, a time interleaving ADC circuit is designed using a number of S/Hs (101-1, 101-n) to process more bits at a higher rate. According to certain illustrative principles, a random number generator (110) is used to select which S/H channel (101-1, 101-n, respectively) samples the analog input (102, 104). The random number generator (110) generates a random number used to select the next S/H channel (101-1, 101-n, respectively) to be sampled based on the current S/H channel (101-1, 101-n, respectively) just sampled. Further, a signal is sent to a timing generator (103) as described below to determine which S/H channel (101-1, 101-n, respectively) is to be sampled.

For example, assume four S/Hs channels (101-1, 101-2, 101-3, 101-4) are used in the time-interleaved ADC to sample the analog input IN P (102) and IN N (104). In keeping with the given example, assume at a first sampling instant, the random number generator (110) generates a 1, which determines the analog input signal (102, 104) is to be sampled by the first S/H channel (101-1). At the next sampling instant, the random number generator (110) generates a number other than 1, for example, a 3. This determines the analog input signal (102, 104) is to be sampled by the third S/H channel (101-3). This process continues as subsequent sampling instants are sampled in a pseudo-random manner. At the sampling instant immediately after the one sent to the third ADC (301-4), the analog input signal (102, 104) is again sampled in a pseudo random manner determined by the random number generator (110). Thus, a given ADC (101) samples the analog input (102, 104) in a pseudo random manner. As mentioned above, the introduction of pseudo randomness into the sampling of the time-interleaving system (100) provides the advantage of spreading the energy of any generated intermodulation spurs in the output of the time-interleaving system (100) such that these intermodulation spurs are indistinguishable from noise. Thus, the SFDR of the ADC can be improved at the cost of an increase in noise and a corresponding decrease in the SNR.

As noted above, a timing generator (103) is used to divide the analog input signal (102, 104) into different sub-signals according to time. The sub-signals are equally spaced in time and each S/H channel (101-1, 101-n) samples the analog input (102, 104) in a pseudo random manner as noted above by the random number generator (110). For example, assume the time-interleaving system (100) is to achieve 250 megabits per second (Msps) using three time-interleaved ADCs. Assume the first S/H channel (101-1) samples the analog input signal (102, 104) at Ons. Next, assume the third S/H channel (101-3) samples the analog input signal (102, 104) at 4 ns. Next, assume the second S/H channel (101-2) samples the analog input signal (102, 104) at 8 ns. Thus the sampling S/H channel (101) is evenly spaced at 4 ns in a pseudo random manner. As illustrated in FIG. 1A the timing generator (103) sends a number of control signal (106-1 to 109-1, 106-1 to 109-n) to each S/H channel (101-1, 101-n) to coordinate the sampling for a number of S/H channels (101). The timing for the control signals are described in connection with FIG. 1C.

Additionally, in order to incorporate pseudo random sampling in a time-interleaving system (100), at least three or more S/H channels must be used to sample the analog input. Further, the three or more S/H channels sample the analog input in a pseudo random time-interleaving manner as described above. If only two S/H channels are used to meet sampling speed needs and the advantages of pseudo randomization are desired, a third S/H channel is used as an auxiliary channel. The auxiliary S/H channel is used to add randomization to the sampling as described above. The auxiliary S/H channel is required so that while one S/H channel is sampled, the next S/H channel to be sampled can be random, provided there is an extra S/H channel.

As mentioned above, a number of parameters such as, bandwidth, timing, gain, and offset mismatch between the interleaved S/H channels are calibrated to ensure optimized performance of the time-interleaving system (100). The calibrations of these components are described in connection with FIGS. 4A, 4B, 5A, 5B, and 16.

According to certain illustrative examples, during a test operation, the pseudo random sampling is disabled in order for the time-interleaving system (100) to calibrate bandwidth, timing, gain, and offset mismatch as described above and in connection with FIGS. 4A, 4B, 5A, 5B, and 16. Thus, each S/H channel (101-1, 101-n) is matched with respect to one another.

When, the time-interleaved system (100) is in normal operation, a pseudo random sampling of the analog input signal (102, 104) is used. Further, bandwidth, timing, gain, and offset values, which were obtained while in test mode, are used to reduce mismatch between each S/H channel (101-1, 101-n) as mentioned above.

Assuming the time-interleaved system (100) is in normal operation mode, the outputs for each channel (116-1, 116-n, 118-1, 118-n, 120-1, 120-n, 124-1, 124-n) have considerably better matching bandwidth, timing, gain, and offset values. According to certain illustrative principles, CH1 IN N (118-1) and CHN IN N (118-n) are connected to the IN N (122-1) channel on the operational amplifier (107). CH1 IN P (120-1) and CHN IN P (120-n) are connected to the IN P (122-2) channel on the operational amplifier (107). Further, a signal corresponding to these channels (101) is connected to OUTN (126-2) and OUTP (126-1) respectively at corresponding appropriate time slot. At the appropriate time slot, CH1 OUTP (116-1) and CHN OUTP (116-n) are connected to OUTP (126-1). Additionally, CH1 OUTN (124-1) and CHN OUTN (124-n) also are connected to OUTN (126-2) as enabled by timing logic for the appropriate time slot.

In one example, if channel 1 S/H (101-1) is sampling the analog input (102, 104), the input is sampled on voltage storage elements in channel 1 S/H (101-1) and later connected to operational amplifier (107) to form a charge sensing amplifier. The charge sensing amplifier is used to sense the input signal sampled.

Additionally if channel N S/H (101-n) is sampling the analog input (102, 104), input is sampled on voltage storage elements in channel N S/H (101-n) and later connected to operational amplifier (107) to form a charge sensing amplifier. The charge sensing amplifier is used to sense the input signal sampled. Further detail of FIG. 1A is described below in FIG. 1B.

Figure 1B:
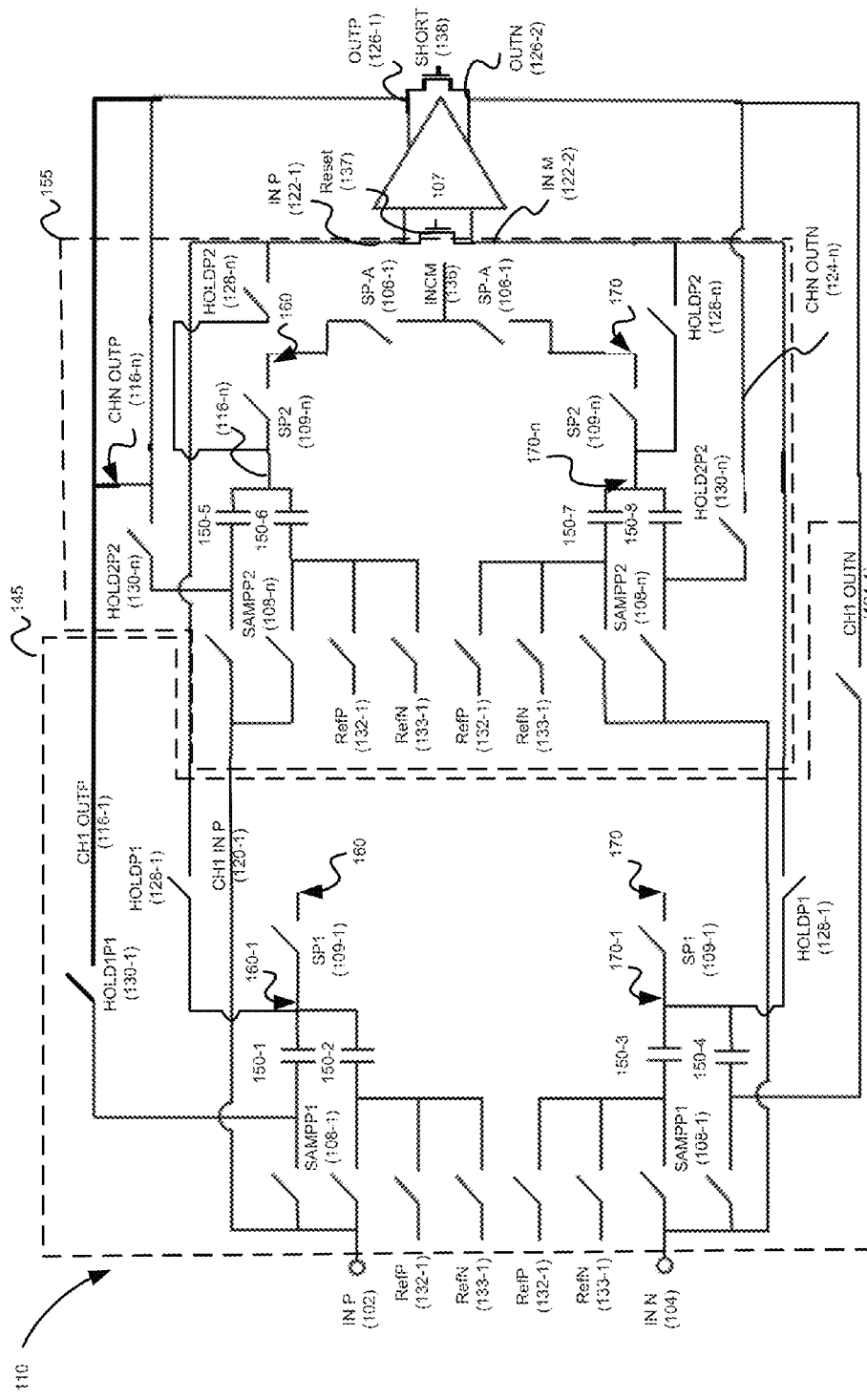
FIG. 1B is a diagram showing an illustrative time-interleaving sample-and-hold system embodied in FIG. 1A, according to one example of principles described herein.

FIG. 1B shows a diagram of illustrative first and Nth sample-and-hold circuits in a time-interleaved sample-and-hold system. Each of the sample-and-hold circuits (145, 155) includes a voltage storage element (150-1 to 150-8) for storing a voltage sampled from the input signal IN P (102) and IN N (104). As shown in FIG. 1B, the voltage storage elements (150-1 to 150-8) may be capacitors. A voltage-controlled common sampling switch, SP-A (106-1) may selectively couple each of the sample-and-hold (145, 155) circuits to a common node, or voltage bias INCM (136). Each sample-and-hold circuit (145, 155) may include a voltage-controlled input switch (109-1, 109-n, respectively) that selectively couples its respective voltage storage element (150-1 to 150-8) to the common sampling switch, and a voltage-controlled switch (108-1, 108-n, respectively) that selectively couples each voltage storage element (150-1 to 150-8) to the input signal IN P (102) and IN N (104).

Figure 1C:
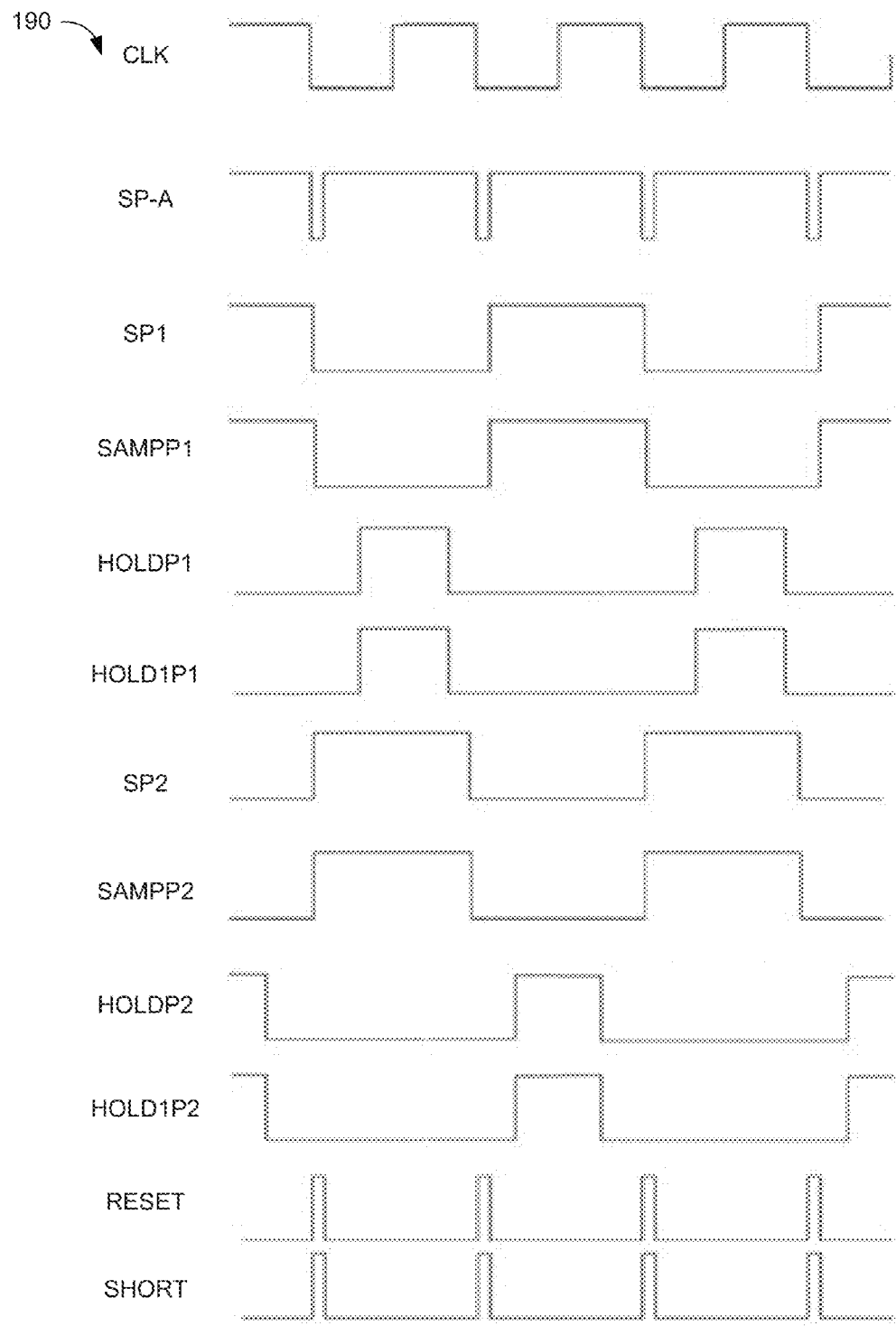
FIG. 1C is a diagram of an illustrative timing diagram for an illustrative time-interleaved sample-and-hold system, according to one example of principles described herein.

Each of the switches (106-1, 108-1, 108-n, 109-1, 109-n) shown in FIG. 1B may be controlled by a corresponding control signal, SP-A, SP1, SP2, SAMPP1, SAMPP2, respectively from a timing generator (FIG. 1A, 103). FIG. 1C shows an illustrative timing diagram for each of these controlled signals with reference to a clock signal. In the timing diagram of FIG. 1C, a high signal for a switch signifies that that switch will be closed.

The operation of the illustrative sample-and-hold circuits (145, 155) will now be explained with reference to FIGS. 1B and 1C. For the first sample, the common sampling switch (106-1) opens first to stop the sample, which triggers switch (109-1) to open, followed by switch (108-1). At this point the voltage from IN P (102) and IN N (104) is now stored in the voltage storage element (150-1 to 150-4) of the first sample-and-hold circuit (145). In one example, the analog signal IN P (102) and IN N (104) is also sampled and connected to a flash subADC (FIG. 6B, 640) as shown in FIG. 6B. The sub-ADC (FIG. 6B, 640) output is then converted back to analog using a sub DAC (FIG. 6B, 632) as shown in FIG. 6B. Further, this DAC function can also be designed as shown in FIG. 1B, where capacitor 150-3 can comprise of a bank of capacitors. Further, capacitor 150-3 inputs can be connected to the input signal during an input sampling, to RefN (133) or Refp (132) as determined by the digital output of the sub-ADC to implement the DAC function. This output of the amplifier represents the residue signal to be digitized by the next stage in the pipeline. The residue consists of the input signal subtracted from the DAC output. The ratio of capacitors 150-3, 150-4 and capacitors 150-1, 150-2 determine the gain applied to the residue signal. Switches HOLD1P1 (130-1), HOLDP1 (128-1) close, connecting the sampled signal on capacitors to the operational amplifier for the first sample-and-hold circuit (145). The output of the operational amplifier (107) at the output of the hold phase represents the residue output and is sampled by the next stage as shown in FIG. 1E. When the common sampling switch (106-1) opens, this ends the sampling cycle of the first sample-and-hold circuit (145) by triggering switches (109-1) to open, followed by switch (108-1).

After the switches of the first sample-and-hold circuit are open, the common sampling switch (106-1) closes, which triggers the switches (109-n, 108-n) to close, thereby beginning the sampling cycles of the next S/H to be sampled, for example, an Nth sample-and-hold circuit (155). At this point a voltage from IN P (102) and IN N (104) is now stored in the voltage storage element (150-5 to 150-8) of the Nth sample-and-hold circuit (155). Switches HOLD2P2 (130-n), HOLDP2 (128-n) close, to configure the circuit as a charge amplifier. The charge amplifier is described in detail in connection with FIG. 1D. The common sampling switch (106-1) then opens again, which ends the sampling cycle of the Nth sample-and-hold circuit (155) by triggering switches (109-n) to open, followed by switch (108-n). As mentioned above, certain capacitors from capacitor banks 150-6, 150-7 are appropriately connected to RefN (133) or RefP (132) as discussed previously.

Shortly thereafter, another S/H is selected randomly to be sampled. Assume the first S/H (145) is selected to be sampled. The common sampling switch (106-1) closes again, thereby triggering the switches (109-1, 108-1) of the first sample-and-hold circuit (145) to close, begin a new sampling cycle, causing the output from the Nth sample-and-hold circuit (155) to be provided to the output OUTP (126-1) and OUTN (126-n) as described in connection with FIG. 1A. This cycle continuously repeats to provide a time-interleaved sample-and-hold output to OUTP (126-1) and OUTN (126-2). Further, OUTP (126-1) and OUTN (126-2) are cleared at each falling edge of the clock signal by the use of a RESET (137) and SHORT (138) switch which clears the old voltage stored across the operational amplifier's (107) inputs and the operational amplifier's (107) outputs. The incorporation of a series common sampling switch (106-1) with the sample-and-hold circuits (145, 155) mitigates the timing problems associated with parasitic capacitance.

Figure 1D:
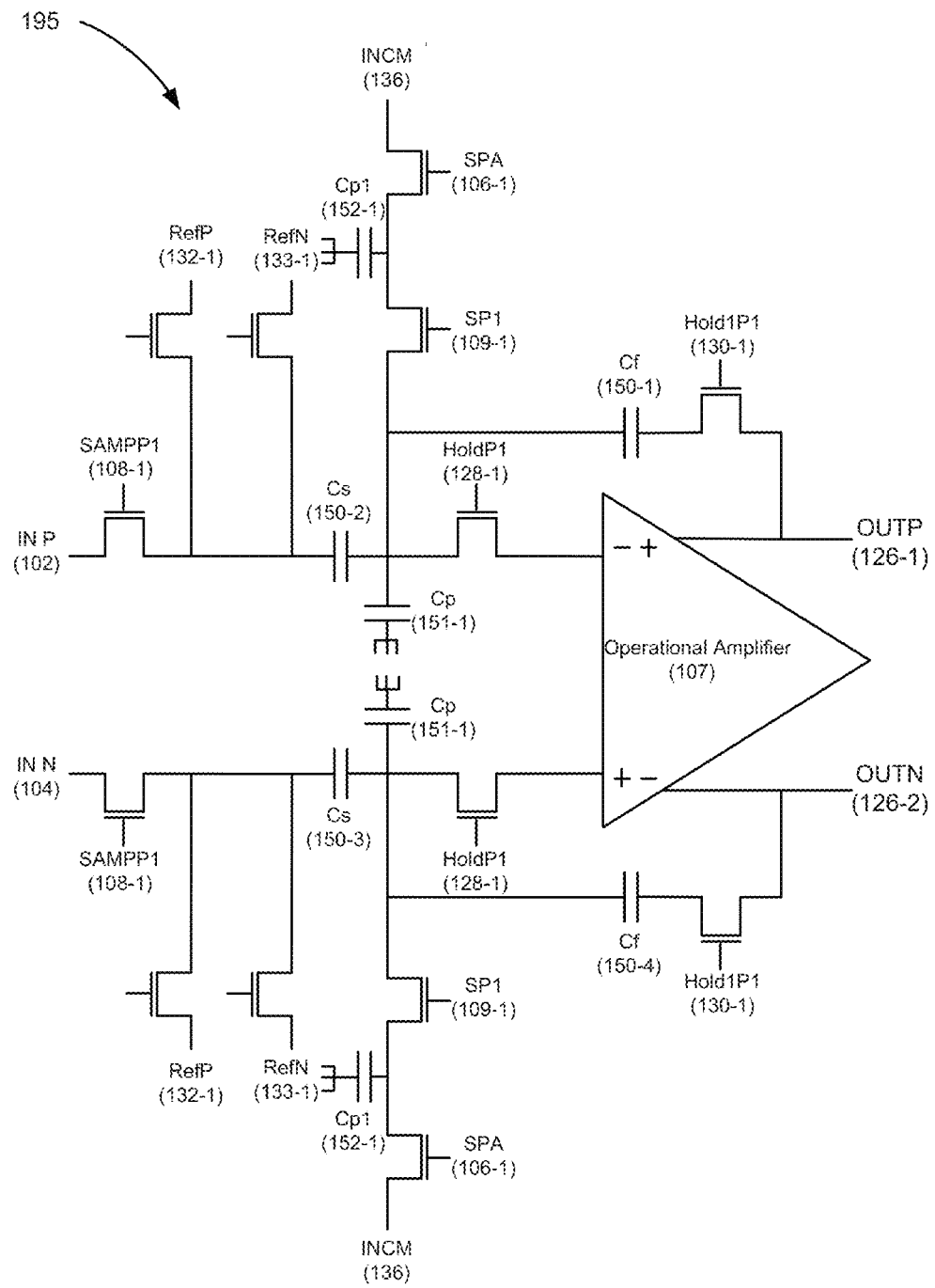
FIG. 1D is a diagram of an illustrative operation of charge sensing amplifier and parasitic capacitors, according to one example of principles described herein.
Figure 1E:
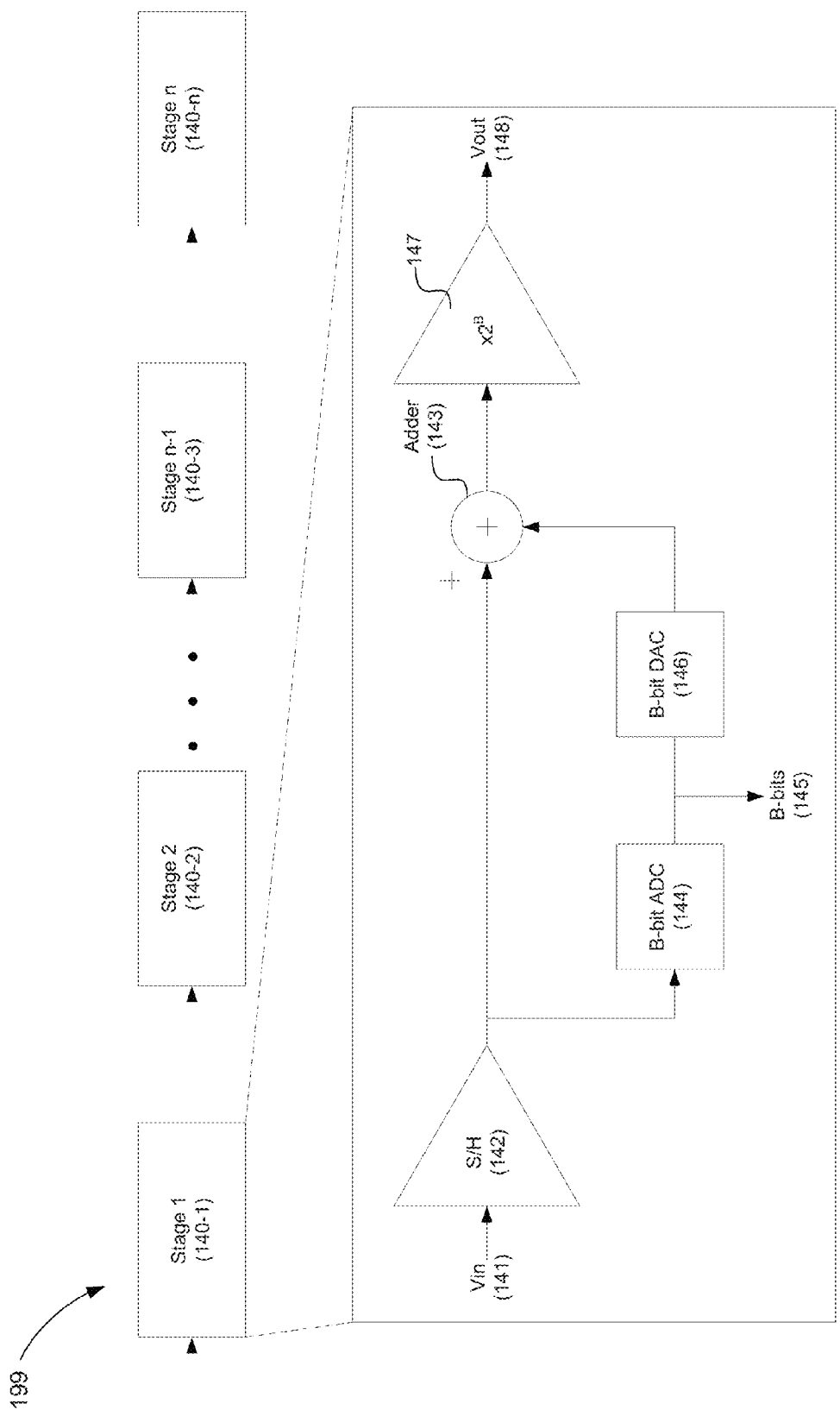
FIG. 1E is a diagram of an illustrative multistage pipelined ADC, according to one example of principles described herein.

FIG. 1D is a diagram of an illustrative of an operation of charge sensing amplifier and parasitic capacitors, according to one example of principles described herein. FIG. 1D is a redrawn version of FIG. 1B, to better illustrate operation of a charge amplifier. FIG. 1D is a fully differential circuit consisting of 2 similar half circuits. The following description is for only one half of the circuit. However, the other half of the circuit mirrors the operation of the first half of the circuit. Because the opening of the common sampling switch SP-A (106-1) triggers the opening of switch SP1 (109-1), an interval of time exists between the opening of the common sampling switch SP-A (106-1) and the opening of the switches SP1 (109-1), SAMPP1 (108-1) of the first sample-and-hold circuit (FIG. 1B, 145). According to certain illustrative principles, during this time interval, two events occur simultaneously. First, the redistribution of the charge stored on Cs (150-2, 150-3) at the time the common sampling switch SP-A (106-1) opened. This occurs due to the common sampling switch no longer shorting-out parasitic capacitances Cp (151-1) and Cp1 (152-1), where Cp (151-1) is the total parasitic capacitance between node (FIG. 1B, 160-1) and ground, and Cp1 (152-1) is the total parasitic capacitance between node (160) and ground and (170) and ground. Second, the value of the changing input signal is stored on the series-parallel combination of Cs (150-2), Cp (151-1), and Cp1 (152-1). Consequently, the total charge stored in Cs (150-2), Cp (151-1), and Cp1 (152-1), at the time the secondary sampling switch SP1 (109-1) opens is a weighted sum of the input signal at the times of the two switch openings. A similar argument applies to the subsequent opening of the final sampling switch SAMPP1 (108-1), however, the charge sampled at that time is contained only on the series combination of Cs (150-2) and Cp (151-1).

Once all of the sampling switches are opened, the charges on Cs (150-2, 150-3) and Cp (151-1) are transferred on to the Cf (150-1, 150-4) capacitors of a charge amplifier circuit built around operational amplifier 107. The output voltage of the charge amplifier is a weighted sum the input voltage at the times of the first two sampling events. Specifically, the input voltage at the time that the common sampling switch SP-A (106-1) is opened is weighted by the capacitor ratio $(Cs+Cp)/(Cs+Cp+Cp1)$, while the input voltage at the time the secondary sampling switch SP1(109-1) is opened is weighted by the capacitor ratio $Cp1(Cs+Cp+Cp1)$. The effect of the parasitic capacitances of the other sample-and-hold circuit (155) mirror those described with respect to the first sample-and-hold circuit (145).

Further, variations in these ratios, for different sample and holds, can cause intermodulation distortion.

In one example, a frequency-domain analysis of the resulting discrete-time filter reveals the time-interleaving sample-and-hold circuit of FIG. 1B has decreased sensitivity to the timing variations on the sampling clocks SP1 and SP2. Specifically differences in the relative delays between the falling edges of SP1 and SP2 to the falling edge on SP is reduced by the factor $Cp1/(Cs+Cp+Cp1)$ as compared to the timing sensitivity of the circuit if the common sampling switch (106-1) is not used. In one example, the factor $Cp1/(Cs+Cp+Cp1)$ is on the order of 0.1 for a typical implementation corresponding to a 10 times the reduction in the circuit's timing sensitivity. The result has two further implications. First, the timing trim circuitry required to null-out the timing mismatch between the two sampling circuits may have 10 times coarser resolution to achieve the same effective change in the aperture delay. This is significant because the required timing delays are often so small as to be strongly dependent on parasitic capacitances. Thus, it is possible to construct timing delay circuitry that is more robust to parasitic effects. Second, the sampling jitter degradation that always accompanies timing delay circuitry is mitigated by the sensitivity reduction. As described above, sampling jitter is a random variation in the sampling intervals and reduces high-frequency SNDR, a key performance metric for time-interleaving ADCs. Without the use of the common sampling switch, the additional sampling jitter introduced by timing delay circuitry would have a significantly larger impact on the performance of the time-interleaving ADO.

The use of a common sampling switch (106-1) reduces the extent to which the aforementioned time intervals for the first and second sample-and-hold circuits (145, 155) must match. In other words, the degree to which the aforementioned time intervals must match is significantly reduced by the use of a common sampling switch (106-1) instead of a separate sampling switch for each sample-and-hold circuit (145, 155). In a practical circuit, the timing match of 50 fs may be used to interleave two switches. In one example, this is equivalent to a timing match of 500 fs to interleave two sample-and-hold circuits (145, 155) with a common sampling switch (106-1), assuming the capacitive ratios mentioned earlier.

As mentioned above, in an ADC system, the sampling frequency is normally assumed to be constant where input samples are converted at equal time intervals. Often undesired jitter is introduced by adding additional circuitry or loads into the ADC's sampling clock to generate timing delays resulting in an undesired signal to noise ratio (SNR). In one example, the main sampling clock, SP-A, is designed to be a low noise, low jitter clock. However, generating clock signals to add delay to the system by use of control signals SP1 and SP2 resulting in more jitter added to SP1 and SP2 than SP-A. Thus, a separate sampling transistor is used to achieve the delayed sampling. According to certain illustrative principles, the jitter sensitivity of the second sampling transistor (109-1, 109-n) can be designed to be much lower compared to the first transistor (106-1). Consequently, even if the jitter on the second transistor (109-1, 109-n) is larger than on the first transistor (106-1), its impact is attenuated and does not substantially increase the effective jitter in the delayed sampling clocks (109-1, 109-n). Thus, jitter may be mitigated in order to provide a more desirable SNR to reduce conversion errors from the analog domain into the digital domain.

FIG. 1E is a diagram of an illustrative multistage pipelined ADC, according to one example of principles described herein. FIG. 1E shows the block diagram of a pipelined ADC (199). For illustrative purposes, only the operation of stage 1 (140-1) is shown. However, stage 2 (140-2) to stage n (140-n) operations are the same. The input signal Vin (141), shown in single ended form, connects to the input of a sample-and-hold (142) circuit. The sample-and-hold signal output of the sample-and-hold (142) circuit is then digitized by a sub-ADC (144). For illustrative purposes the sub-ADC (144) has B bits of resolution. Next, the digitized sample-and-hold signal is then converted it back to analog signal using a sub-DAC (146). The output of the sub-DAC (146) is then subtracted from the output of the sample-and-hold (142) circuit using an adder (143) to create a residue signal. Next, the residue signal is multiplied by an amplifier (147) up to $2^B$, where B is the number of bits resolved and the residue is fed into the next stage as its input signal.

Figure 2A:
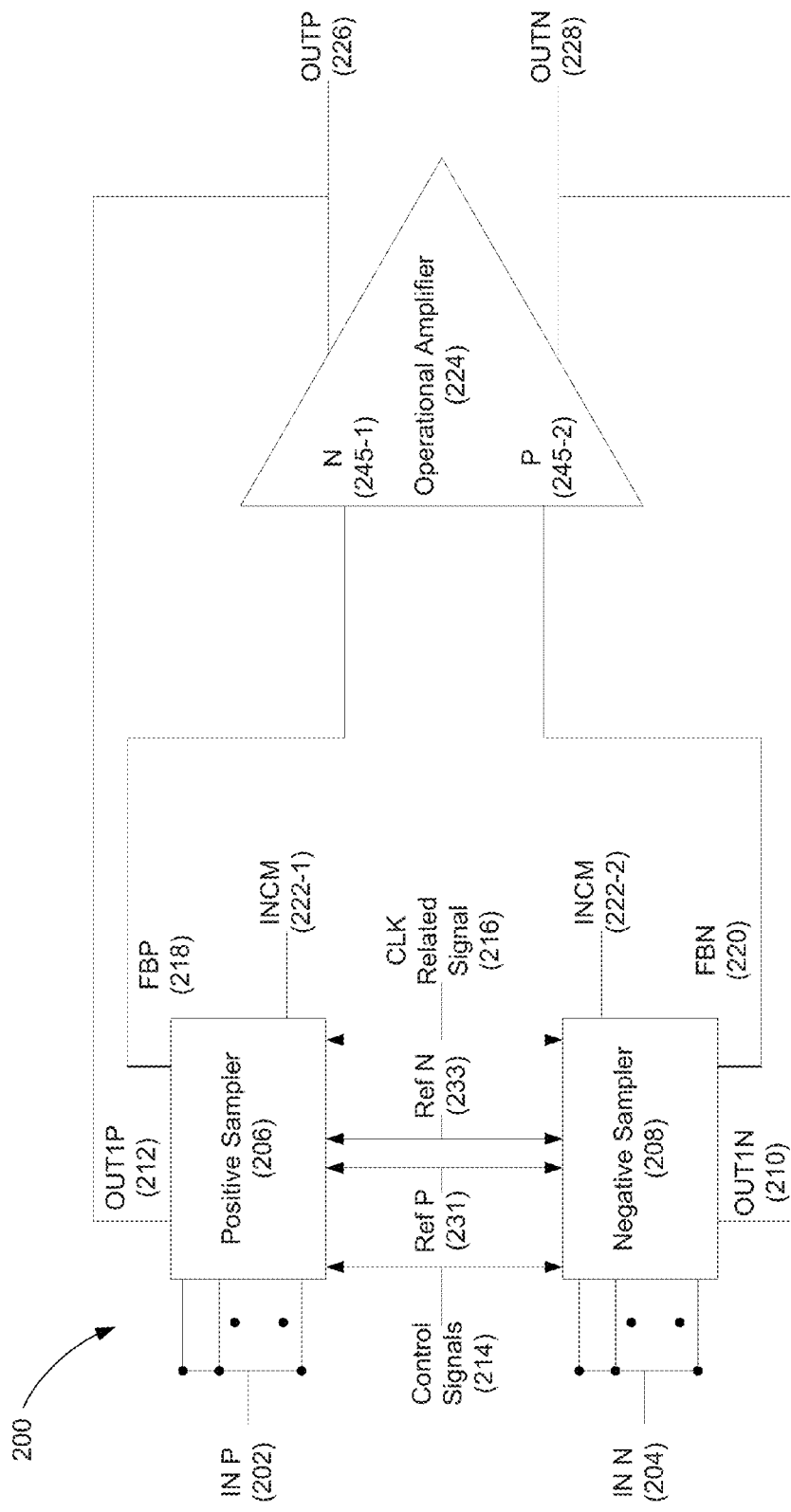
FIG. 2A is a diagram showing an illustrative time-interleaved sample-and-hold system, according to one example of principles described herein.

FIG. 2A is a diagram showing an illustrative time-interleaved sample-and-hold system, according to one example of principles described herein. FIG. 2A shows a time-interleaved sample-and-hold system (200) that uses one operational amplifier (224) to interleave inputs IN P (202) and IN N (204). Further, the time-interleaved sample-and-hold system (200) is differential.

As noted in FIG. 1A, a random number generator (FIG. 1A, 110) generates a random number between 1 and the maximum number of S/H used in the system (FIG. 1, 100) and sends the random number generated to a timing generator (FIG. 1A, 103). The timing generator (FIG. 1A, 102) is used to divide the analog input signal (FIG. 1A, 102-1, 104-1) into different sub-signals according to time. Further, the sub-signals are equally spaced in time and each S/H corresponding to its ADC (FIG. 1A, 101-1, 101-n) samples the analog input (FIG. 1A, 102-1, 104-1) in a pseudo random manner as determined by the random number generator (FIG. 1A, 110). As illustrated in FIG. 1A the timing generator (FIG. 1A, 103) sends a number of timing and control signal (FIG. 1A, 106-1 to 109-n) to each S/H (FIG. 1A, 101-1, 101-n) to coordinate a number of S/Hs (FIG. 1A, 101) such that each S/H (FIG. 1A, 101-1, 101-n) samples the analog input (FIG. 1A, 102-1, 104-1) in a pseudo random manner. The same process is mirrored in FIG. 2A. For example, FIG. 2A uses control signal (214) to designate the action of the random number generator (FIG. 1A, 110), together with CL K related signal (216), generates the needed timing and control signals shown in FIG. 1A to sample the analog input IN P (202) and IN N (204) in a pseudo random manner. The method for sampling the analog input IN P (202) and IN N (204) is described in connection with FIG. 23. However, for illustrative purposes of FIG. 2A, a positive sampler (206) samples the analog input IN P (202). The positive sampler (206) includes a number of sampling channels as described in connection with FIG. 23 to interleave the analog input IN P (202). Further, the positive sampler (206) and negative sampler (208) are connected to an operational amplifier (224) to form a charge sensing differential amplifier. FBP (218) is connected to input N (245-1) of an operational amplifier (224). The OUT1P (212) port of sampler 206 is connected to the OUTP (226) of the operational amplifier.

The same process is mirrored for the analog IN N (204) input. For example, a negative sampler (208) samples the analog input IN N (204). The negative sampler (208) includes a number of sampling channels as described in connection with FIG. 23 to interleave the analog input IN N (204). FBN (220) is connected to input P (245-2) of the operational amplifier (224). Similarly output OUT1N (210) of negative sampler (208) is connected to OUTN (228) of the operational amplifier (224). Reference inputs RefP (231) and RefN (233) are switched on selectively as determined by values of the sub-ADC (FIG. 63, 640) it is associated with, as shown for example in FIG. 63. The output of the operational amplifier (224), after the input sampling is complete and the appropriate RefP (231) and RefN (233) inputs are switched, results in a residue output. This residue output is sampled and processed by the next pipeline stage (140) as shown in FIG. 1E.

As mentioned above, a number of components such as, bandwidth, timing, gain, and offset are calibrated to ensure optimized performance of the time-interleaved sample-and-hold system (200). The calibrations of these components are described in connection with FIGS. 4A, 4B, 5A, 5B, and 16.

Figure 2B:
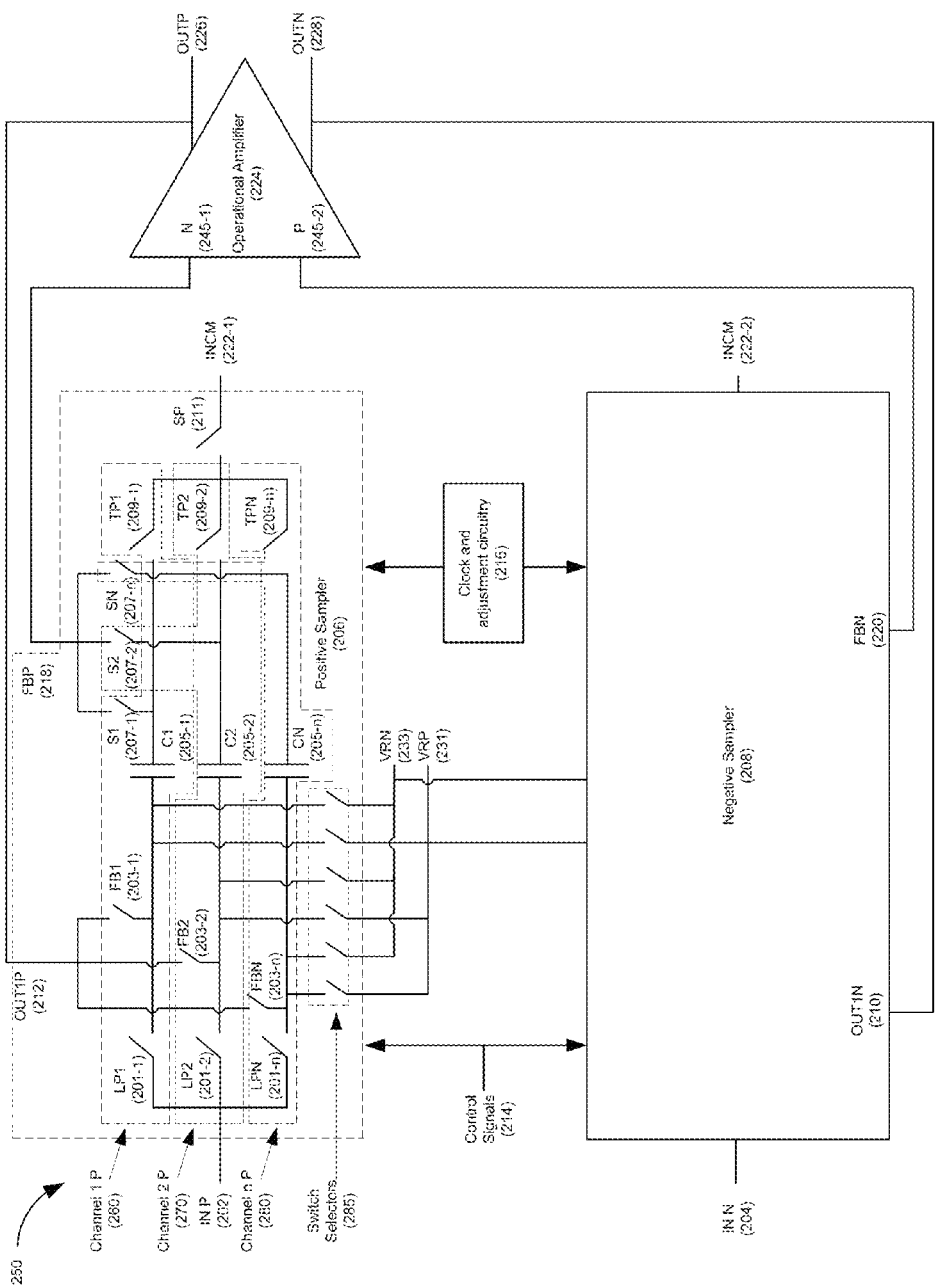
FIG. 2B is a diagram showing an illustrative time-interleaving sample-and-hold system embodied in FIG. 2A, according to one example of principles described herein.

FIG. 2B is a diagram showing an illustrative time-interleaving sample-and-hold system embodied in FIG. 2A, according to one example of principles described herein. FIG. 23 illustrates the operation of the positive sampler (FIG. 2A, 206) from FIG. 2A. For illustrative purposes only the operation of the positive sampler (206) is described. However, the operation of the negative sampler (208) mirrors the operation of the positive sampler (206).

As noted in FIG. 2A, the analog input IN P (202) is sampled by the positive sampler (206). Further, a number of sampling channels (260, 270, 280) samples the analog input IN P (202) such that the analog input IN P (202) is time-interleaved. FIG. 2B shows three sampling channels, namely channel 1 P (260), channel 2 P (270), and channel n P (280). Each channel (260, 270, 280) pseudo randomly samples the analog input IN P (202) as determined by the CLK related signals (FIG. 2A 216) as described in connection with FIG. 2A. For illustrative purposes, only the operation of channel 1P (260) will be described. However, the operation of channel 2 P (270) and channel n P (280) mirrors the operation of channel 1 P (260).

Channel 1 P (260) includes of a number of switches such as, LP1 (201-1), FB1 (203-1), S1 (207-1), and TP1 (209-1) and a voltage storage element C1 (205-1). Capacitors C1 (205-1) C2 (205-2) and CN (205-n) each includes a bank of capacitors connected to switches as shown in the example of C1. Assume channel 1 P (260) is to sample the analog input IN P (270). In one example, the input INP (202) is connected to switch LP1 (201-1). Switch LP1 (201-1) is connected to one side of the capacitor C1 (205-1). The other side of C1 (205-1) is connected to switch TP1 (209-1). Although, C1 (205-1) is illustrated as a single capacitor, C1 (205-1) may take the form of a number of capacitors or a capacitor bank. The other side of switch TP1 (209-1) is connected to switch SP (211). The other side of switch SP (211) is connected to a bias voltage INCM (222-1). The bias voltage INCM (222-1) may range from a number of millivolts to a number of volts depending on the intended operation of the system (250). One side of switch S1 (207-1) is connected to C1 (205-1) and TP1 (209-1). The other side of switch S1 (207-1) is connected to FBP (218). Switch FB1 (203-1) is also connected to one side of C1 (205-1) and switch LP1 (201-1), FBP's (218) output is connected to input N (245-1) of the operational amplifier.

Similarly channel 2 P (270) includes switches LP2 (201-2), FB2 (203-2), S2 (207-2), TP2 (209-2) and a voltage storage element C2 (205-2) connected to the common switch SP (211) as illustrated in FIG. 2B. Further, there are similar sampling paths up to N channels both in the positive sampler (206) and the negative sampler (208). For example, channel n P (280) includes switches LPN (201-n), FBN (203-n), SN (207-n), TPN (209-n) and a voltage storage element CN (205-n) connected to the common switch SP (211). FBN's (220) output of negative sampler (208) is connected to input P (245-2) of the operational amplifier.

As noted above, the positive sampler (206) has the positive input signal, IN P (202), connected to it and the negative sampler (208) has the negative input signal, IN N (204), connected to it. Further, a dock and adjustment circuitry (FIG. 2A, 216) is coupled to both the positive sampler (206) and the negative sampler (208). The dock and adjustment circuitry (FIG. 2A, 216) enables adjustment of timing and bandwidth mismatch between the interleaved channels (260, 270, and 280) as described in connection with FIG. 4A. Control signals (FIG. 2A, 214) are also applied to both the positive sampler (206) and the negative sampler (208) to select which channel (260, 270, and 280) in the positive sampler (206) and the negative sampler (208) is to sample and hold randomly or pseudo randomly the analog input IN P (202) and IN N (204). The operations of the switches for channel 1 P (260) for sample mode and hold mode are described in connection with FIGS. 3A and 3B respectively.

Additionally, assume channel 1 P (260) has finished sampling mode. Further, assume channel 2 P (270) is to sample the analog input IN P (202) next as selected randomly. After channel 1 P (260) has finished sampling mode, channel 2 P (270) may enter sample mode.

FIG. 3A is a diagram showing an illustrative time-interleaved sample mode circuit, according to one example of principles described herein. FIG. 3A illustrates the operation of sampling the analog input IN P (302) and the analog input IN N (304). For illustrative purposes, the system (300) shows only one positive sampling channel and one negative sampling channel. However, a number of positive and negative sampling channels may be used. Further, INCM (322) is a bias voltage. As mentioned above, when a sampling instance occurs, switches LP (301-1, 301-2), TP (309-1, 309-2), and SP (311) close. Further, switches FB (303-1, 303-2) and switches S (30T-307-2) remain open. By closing switches LP (301-1, 301-2), TP (309-1, 309-2), and SP (311), the voltage storage elements, Csp (305-1) and Csn (305-2), store the voltage value of IN P (302) and IN N (304) respectively. As noted above, Csp (305-1) and Csn (305-2) includes a number of capacitors or a bank of capacitors with separate switches similar to the shown capacitors Csp (305-1) and Csn (305-2). By closing switches LP (301-1, 301-2), TP (309-1, 309-2), and SP (311) allows Csp (305-1) to be charged between IN P (302) and INCM (322) across its two terminals and Csn (305-2) to be charged between IN N (304) and INCM (322) across its two terminals. Once the voltage value of IN P (302) and IN N (304) have been stored in Csp (305-1) and in Csn (305-2), switches LP (301-1, 301-2), TP (309-1, 309-2), and SP (311) open in a sequence where SP (311) opens first, then TP (307-1) opens and finally LP (301-1) opens. Thus, the sample mode cycle is complete.

FIG. 3B is a diagram showing an illustrative time-interleaved hold mode circuit, according to one example of principles described herein. After sampling is completed as described in FIG. 3A, the time-interleaving system (200) goes into hold mode as shown in FIG. 3B. Hold mode will now be illustrated using both the sample mode circuit (300) and the hold mode circuit (350). After the voltage value of IN P (302) and IN N (304) have been stored Csp (305-1) and Csn (305-2) switches FB (303-1, 303-2) and S (307-1, 307-2) close for the capacitors intended to be placed across the operational amplifier (224). For example FB (303-1) closes for the Cs2p (319-1) portion of the Csp (305-1) capacitor bank. Similarly, the FB (303-2) switches associated with Cs2n portion of the Csn (303-2) capacitor bank is closed. The circuit is now connected to act as a charge sensing differential amplifier. Only a portion of capacitor Csp (305-1) is connected across the operational amplifier (224) as shown as Cs2p (319-1) in FIG. 3B. Further, a part of Csp (305-1) is connected in series with the operational amplifier input N (345-1) and is shown as Cs1 p (317-1) in FIG. 3B.

Figure 3C:
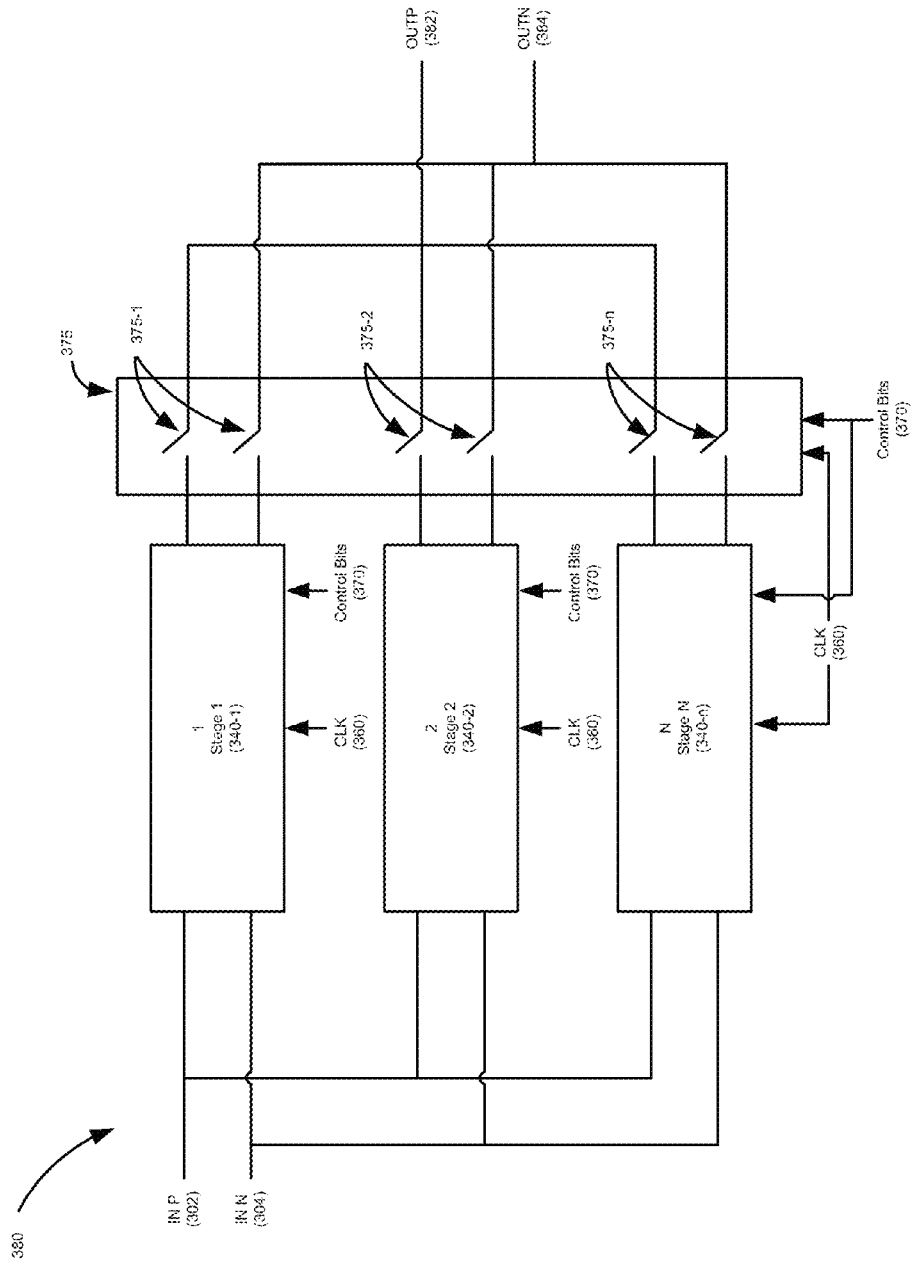
FIG. 3C is a diagram showing an illustrative time-interleaved sample-and-hold multi-stage system, according to one example of principles described herein.

Next, switches 315-1, 315-2, 313-1, 313-2 associated with Cs1p (317-1) and Cs1n (317-2) capacitors close. This allows the capacitors Cs1p (317-1). Cs1n (317-2) to be charged to a voltage reference positive (VRP) (331-1), or a voltage reference minus (VRM) (333-1), as determined by a sub-ADC (FIG. 6B, 640) of FIG. 6B associated with the system (390) of FIG. 6B. VRP (331-1) of FIG. 3B is the same as RefP (132-1) in FIG. 1B and VRM (333-1) in FIG. 3B is the same as RefN (133-1) in FIG. 1B. The output of the operational amplifier now is known as the residue output. The residue represents the difference of the analog inputs IN P (302) and IN N (304) and the output of the sub-DAC for the stage (FIG. 6B, 632). This output is amplified by the ratio of the capacitors Cs1p/Cs2p, Cs1n/Cs2n. FIG. 3C is a diagram showing an illustrative time-interleaved sample-and-hold multi-stage system, according to one example of principles described herein. The time-interleaved sample-and-hold multi-stage system (380) shows a number of sampling stages (340). Each sampling stage (340) includes a time-interleaved sample mode circuit (300) and a time-interleaved hold mode circuit (350) and operates as described in FIGS. 3A and 3B respectively. In FIG. 3C, the analog input signals IN P (302) and IN N (304) are connected to each sampling stage (340). Each sampling stage (340) randomly samples the analog input signals IN P (302) and IN N (304) as described above. The sampling of the analog input signals IN P (302) and IN N (304) are as described in connection with FIGS. 3A and 3B. Assume stage 1 (340-1) is sampling the analog input signals IN P (302) and IN N (304). When stage 1 (340-1) sampling is complete, control bits (370) are used to open switches 375-2 and 375-n and close switches 375-1. Similarly, when other stages (340-2, 340-n) are randomly sampled, their outputs are selectively connected to OUTP (382) and OUTN (384) by closing the proper switches (375) as determined by the control bits (370) and opening the proper switches (375). Each stage, stages 1 to stage N (340-1 to 340-n), have functionality described in FIGS. 3A and 3B. For example, the output of the each stage is OUTP (326) and OUTN (328). Switch 375 selects the residue output to select from the stages (340) to connect to OUTP (382) and OUTN (384). OUTP (382) and OUTN (384) can then be sampled by the next stage. Additionally, the next stage may not choose to be randomly sampled, since the randomization implemented in the earlier stage may already be sufficient to reduce interleaving spurs sufficiently low enough such that the spurs are no longer significant.

Figure 3D:
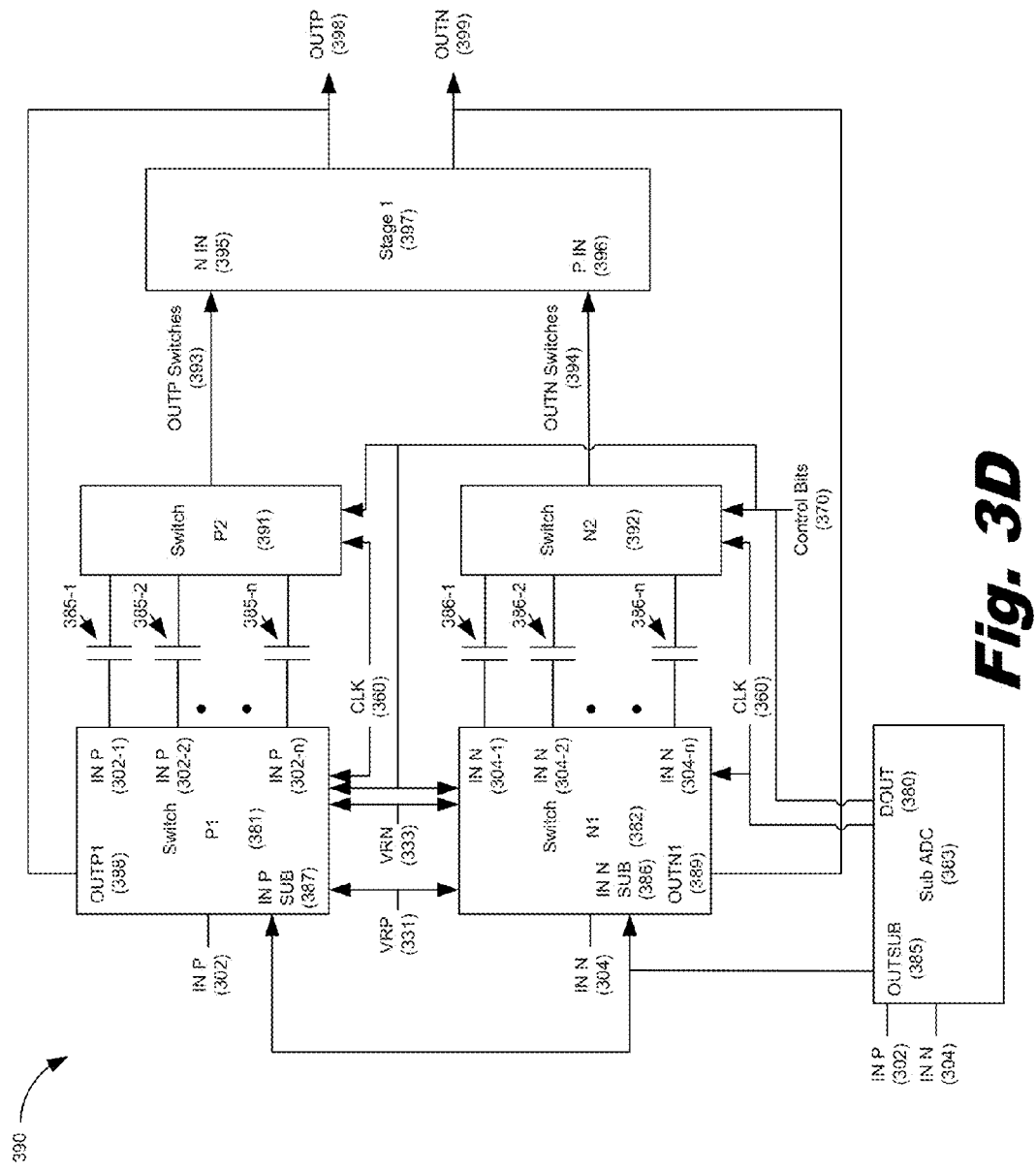
FIG. 3D is a diagram showing an illustrative time-interleaved sample-and-hold single-stage system, according to one example of principles described herein.

FIG. 3D is a diagram showing an illustrative time-interleaved sample-and-hold single-stage system, according to one example of principles described herein. The positive analog input IN P (302) is connected to a switch network P1 (381). The switch network P1 (381) has a number of outputs, IN P (302-1, 302-2, 302-n) and are connected to a number of storage capacitors (385-1,385-2,385-n). Further, switch P1 (381) is also connected to OUTP (398) of Stage 1 (397). Switch P1 (381) also has inputs, IN N SUB (386) and IN P SUB (387), to receive output data, OUTSUB (385), from a sub-ADC (383). The sub-ADC (383) also samples the analog input, IN P (302) and IN N (304), at the same time the P1 switch (381) and switch N1 (382) samples the analog input IN P (302) and IN N (304). Further, the sub-ADC (383) may be implemented in a variety of methods. A commonly used implementation is a flash architecture. A Flash ADC is a type of analog-to-digital converter that uses a linear voltage ladder with a comparator to compare the input voltage to successive reference voltages. The output of these comparators is generally fed into a digital encoder which converts the inputs into a binary value. The output of the flash ADC is then used to control switches 315-1,315-2,313-1,313-2 shown in FIG. 3B to selectively connect VRP (331) or VRN (333) to a portion of the input sampling capacitor Cs1p (FIG. 3B, 317-1), Cs1n (FIG. 3B, 317-2) arranged to act as a sub-DAC to remove the estimate of the quantized signal from the stage and thus create a residue value. The signal OUTP (398) and OUTN (399) from stage 1 (397) is the residue signal at the end of the hold mode as shown in FIG. 3B. The sub-ADO (383) samples its input at the same time as the switches P1 (381) and switches N1 (382). Generally the bandwidth of the sub-ADC's (383) path has to match the bandwidth in switch P1's (381) path and switch N1's (382) path as described for FIG. 6B. Further, if a common sample and hold is used that serves all signal paths, separate sampling of the signal input by the sub-ADC (383) is not required and the sub-ADC (383) would instead digitize the sampled and held input.

The digitized output is used to control switches in hold mode to connect VRP (331) and VRN (333) to one side of the sampling capacitor networks as shown in FIG. 3B. Further, switch P1 (381) is connect to VRP (331), VRN (333), Clk (360), and Control bits (370).

A number of sampling capacitors (385-1,385-2,385-n) are used to connect switch P1 (381) to switch P2 (391). Further In FIG. 3D, these sampling capacitors (385-1,385-2,385-n) are capacitor banks. In sample mode the analog signal is sampled across these sampling capacitors (385-1,385-2,385-n) for a channel that is being randomly sampled. In the hold mode a portion of the sampling capacitors (385-1,385-2,385-n) is arranged in a charge amplifier configuration as shown in FIG. 3B. Switch P1 (381) further includes a number of switches from the sample mode circuit (FIG. 3A, 300) and hold mode circuit (FIG. 3B, 350). Further, Switch P1 (381) operates as described in connection with FIGS. 3A and 3B. Additionally, control bits (370) are used to determine which channel is to be sampled. Further, switch P1 (381) and switch P2 (391) are connected to Clk (360) and Control bits (370) to control various timing components of switch P1 (381) and switch P2 (391). Switch P2 (391) operates to connect the selected channel to OUTP switches (393). Further, the output of switch P2 (391) is connected to the P IN input of the Stage 1 block (397).

Similarly, for the, negative input signal INN (304), switch N1 (382) operates like switch P1 (381), but for negative input signal IN N (304). Switch N2 (392) operates similar to switch P2 (391), but operates on the negative input signal, IN N (304). Further, switch N1 (382) includes a number of switches from a sample mode circuit (FIG. 3A, 300) and a hold mode circuit (FIG. 3B, 350). The switches in switch N1 (382) operate as described in connection with FIGS. 3A and 3B. Further, control bits (370) are used to determine which IN N (304) signal is to be sampled. Further, switch N2 (392) operate as described in FIGS. 3A and 3B.

Figure 4A:
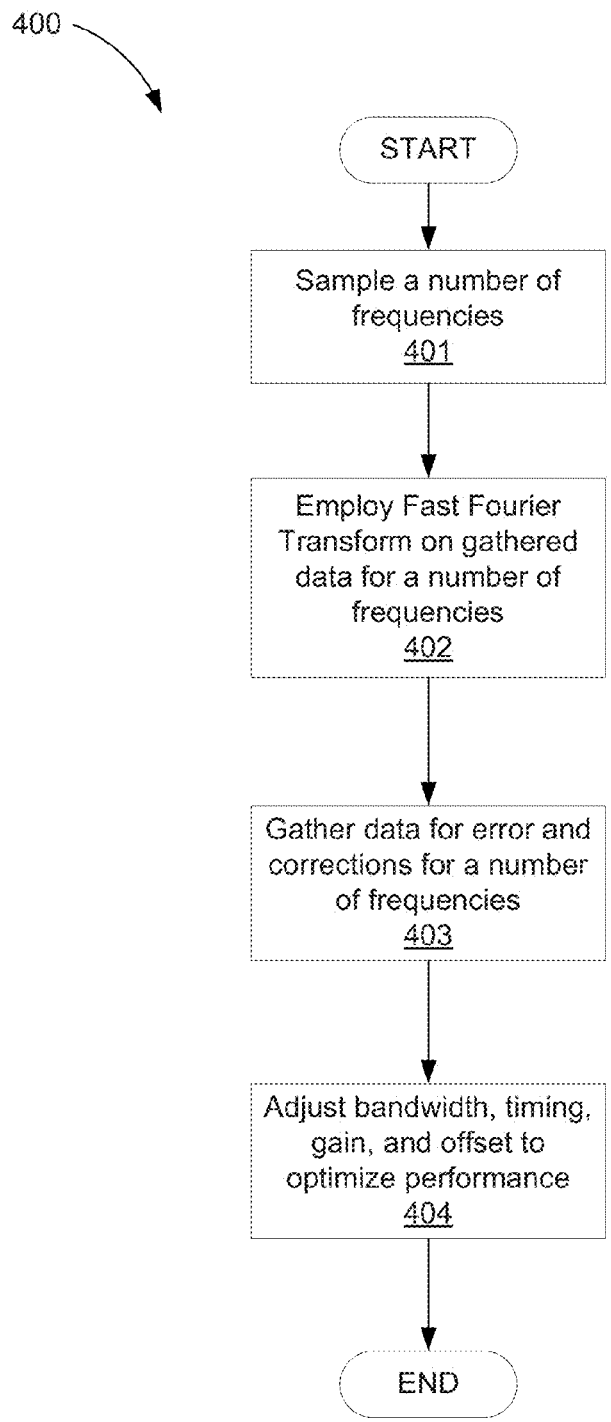
FIG. 4A is a flowchart showing an illustrative method for reducing mismatch in a time-interleaving ADC, according to one example of principles described herein.

Once the analog input IN P (302) has been sampled and held, the signal output, OUTP Switches (393), is connected to N IN (395) of Stage 1 (397). Additionally, once the analog input IN N (304) has been sampled and held, the signal output, OUTN Switches (394), is connected to P IN (396) of Stage 1 (397). Stage 1 (397) includes an operational amplifier (FIG. 3A, 224) that operates as described in FIG. 3A. Thus, the output of the stage 1 (397) is differential. The positive output is OUTP (398) and the negative output is OUTN (399). These outputs at the end of the hold period represent the residue signal and are sampled by the next stage as shown in FIG. 1 E. FIG. 4A is a flowchart showing a method for reducing mismatch in a time-interleaving ADC, according to one example of principles described herein. As mentioned above, matching of a time interleaving ADC can involve matching bandwidth, gain, timing, and offset in order to reduce a number of intermodulation distortions in the time-interleaved ADC. Further, the calibration of these components is done during test mode where pseudo random sampling of the analog input is not performed. Rather, sequential sampling of the analog input is performed. For example, assume 3 ADCs are used. The first ADC samples the analog input, Next the second ADC samples the analog input. Finally the third ADC samples the analog input.

According to certain examples, the method includes sampling (401) a signal at a number of frequencies, employing (402) Fast Fourier Transform (FFT) for a number of sampled frequencies, gathering (403) data for error analysis and corrections for the sampled frequencies, and adjusting (404) bandwidth, timing, gain and offset to optimize performance. The bandwidth, gain, timing, and offset errors are computed by using data obtained from the FFTs and entering the data into a mathematical model of the time interleaved sampling system to obtain the digital correction coefficients using error minimization functions as described in connection with FIG. 4B.

As mentioned above, these correction coefficients are used to adjust (404) bandwidth, timing, gain, and offset to optimize performance of the time interleaving ADC. Thus, optimizing performance includes matching each ADC's bandwidth, timing, gain, and offset. The better matched these components are, the more the performance is optimized, leading to reduced intermodulation distortion or the elimination of intermodulation distortion altogether.

In various examples of a time interleaving system, bandwidth, timing, gain, and offset are matched between ADCs to reduce frequency dependant signal distortion as described above. In one example, assume a times 2 interleaving is desired. An ADC is sampled every 125 MS/s (401) to achieve an overall 250 MS/s interleaved ADC. Assume a bandwidth is determined to be 600 MHz. An FFT (402) is performed on this data to determine corrections needed to match timing and bandwidth at this particular frequency. At this sampling rate, it is determined that bandwidth errors of 0.1% or larger can occur (403) and timing error of 500 fs to 1000 fs or larger (403) can also occur. As mentioned above, this analysis is done for a number of frequencies. Further, a mathematical minimization function is used on the set of frequencies to determine a coefficient for bandwidth mismatch correction and a coefficient for timing mismatch correction as described in connection with FIG. 4B. In keeping with the example given above, it is determined a frequency dependant error for bandwidth and timing will occur, thus the bandwidth and timing correction coefficients are used (404) to mitigate such errors.

Further, at this sample rate (401), an FFT (402) is performed on this data to determine corrections needed to match the gain at this particular frequency. It is determined a gain matching error of 0.003 dB or larger may occur. Thus, in order to reduce distortion of the signal due to gain, a gain mismatch correction coefficient is used to adjust (404) gain to optimize performance. As mentioned above, this analysis is done for a number of frequencies. Further, a mathematical minimization function is used on the set of frequencies to determine a gain mismatch correction coefficient as described in connection with FIG. 4B. In keeping with the example given above, it is determined a frequency dependant error for gain mismatch will occur, thus a gain mismatch coefficient is used (404) to mitigate such errors.

Keeping with the example above, an offset error can create an energy spur at Fs/2, in this case at 125 MHz. In order to reduce frequency-dependant distortion of the signal due to offset, an FFT (402) is performed on this data to determine corrections needed to match the offsets. Assume the height of the spur is determined to be −70 dB or larger (403). Further, a mathematical minimization function is used on the set of frequencies to determine an effective offset coefficient as described in connection with FIG. 4B. In keeping with the example given above, it is determined a frequency dependant error for offset will occur, thus the effective offset coefficient is used (404) to mitigate such errors.

Figure 4B:
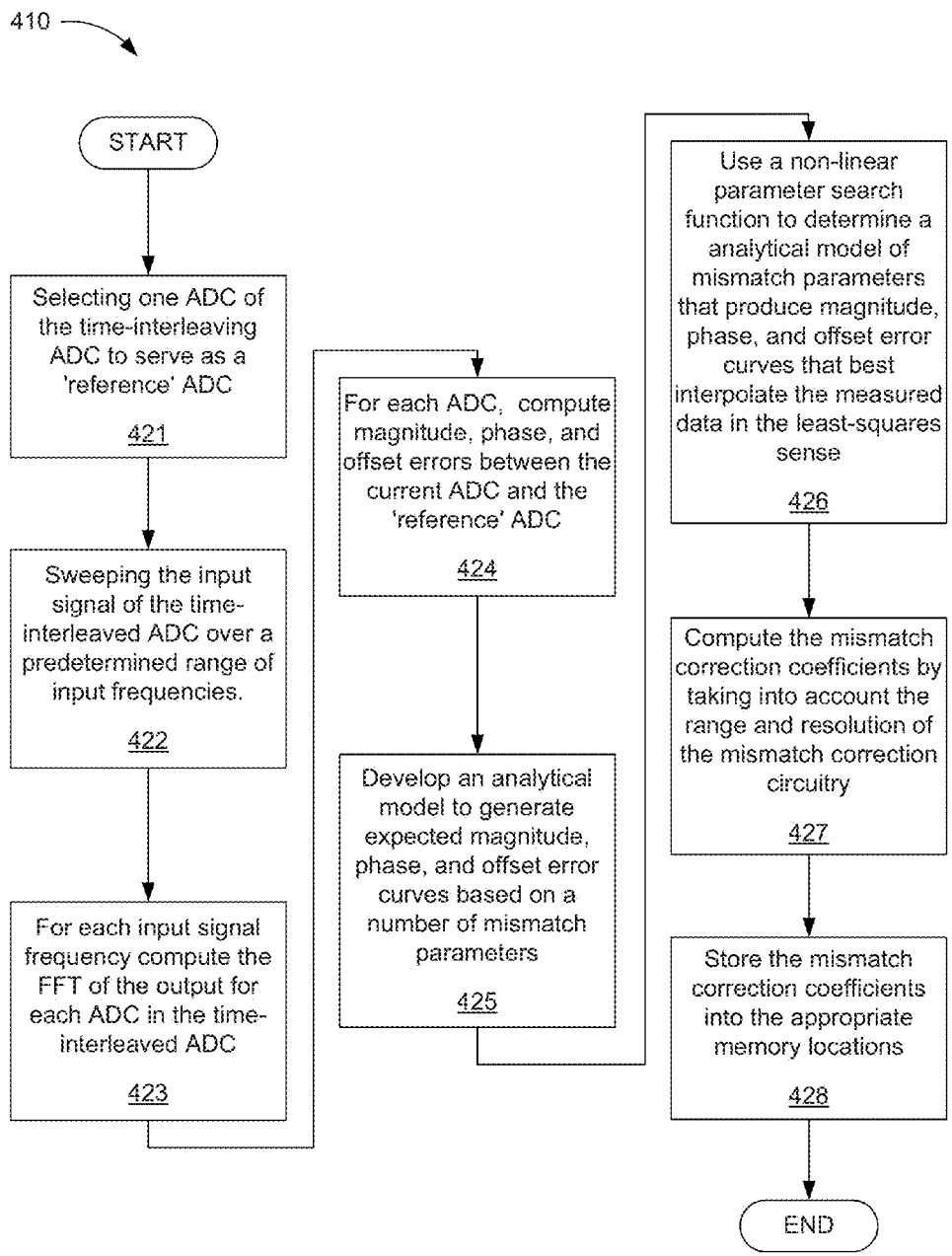
FIG. 4B is a flowchart showing an illustrative method to calculate correction coefficients for a time-interleaving ADC, according to one example of principles described herein.

FIG. 4B is a flowchart showing a method to calculate mismatch correction coefficients for a time-interleaving ADC. As mentioned above, mismatch correction coefficients for bandwidth, sampling time, gain, and offset are used to minimize frequency-dependent magnitude, phase, and offset errors which introduce intermodulation distortion in the output signal of a time-interleaving ADC system. As mentioned above, one correction coefficient is used for each parameter. Additionally, a particular correction coefficient is needed only if the magnitude of the mismatch in that particular parameter causes errors large enough to introduce significant intermodulation distortion as illustrated in the example of FIG. 4A.

According to certain examples, the method for obtaining mismatch correction coefficients includes selecting (421) one constituent ADC of the time-interleaving ADC to serve as a reference ADC. The ADC to serve as the reference ADC is arbitrary, thus any constituent ADC may be used in as a reference ADC in the time-interleaved ADC. Further, the reference ADC is used in subsequent calculations in the method to determine a number of mismatches between a number of parameters to determine the mismatch correction coefficients.

The method further includes sweeping (422) the input signal of the time-interleaving ADC over a predetermined range of input frequencies and storing the results. In various examples the input frequency is a sinusoid.

Next, for (423) each input signal frequency, the FFT of the output is computed for each constituent ADC in the time-interleaving ADC. Next, for (424) each ADC, magnitude, phase, and offset errors are computed between each constituent ADC and the reference ADC. These errors are computed from the magnitude and phase information from the DC and fundamental FFT bins. Further, for N number of time-interleaved ADCs, there are N−1 magnitude error curves, N−1 phase error curves, and N−1 offset error curves. In various examples, it is advantageous to transform the phase error curves into equivalent timing error curves by dividing the phase error curves by the vector of angular input signal frequencies.

Next, an analytical model (425) is developed to generate the expected magnitude, phase (or timing), and offset errors based on the architecture and operation of the constituent ADCs. The analytical model takes as its inputs a vector of input signal frequencies and a vector of mismatch parameters for each relevant type of mismatch. In one example, the vector of mismatch parameters consists of sampling time skews between ADCs, percent bandwidth mismatch between ADCs, gain mismatch between ADCs, and offset mismatch between ADCs. Given such inputs, the analytical model generates the predicted N−1 magnitude error versus frequency curves, the N−1 phase error or timing error versus frequency curves, and the N−1 offset error versus frequency curves.

Next, a non-linear (426) parameter optimization function is used to determine a set of mismatch parameters such that when input to the analytical model (425), generates N−1 magnitude, phase/timing, and offset curves that best interpolate the measured curves from the previous process in the least-squares sense. Once this set of mismatch parameters are obtained, they may be mapped into the appropriate mismatch (427) correction coefficients taking into account the range and resolution of the mismatch adjustment circuitry. Finally, the correction coefficients are stored (428) in appropriate memory locations.

Once the correct correction coefficients are stored a time-interleaving ADC system may uses these correction coefficients during normal operation. As mentioned above, normal operation uses a random number generator (FIG. 1A, 110) to pseudo randomly select which ADC (FIG. 1A, 101) is to sample the analog input (FIG. 1A, 102, 104).

Figure 5A:
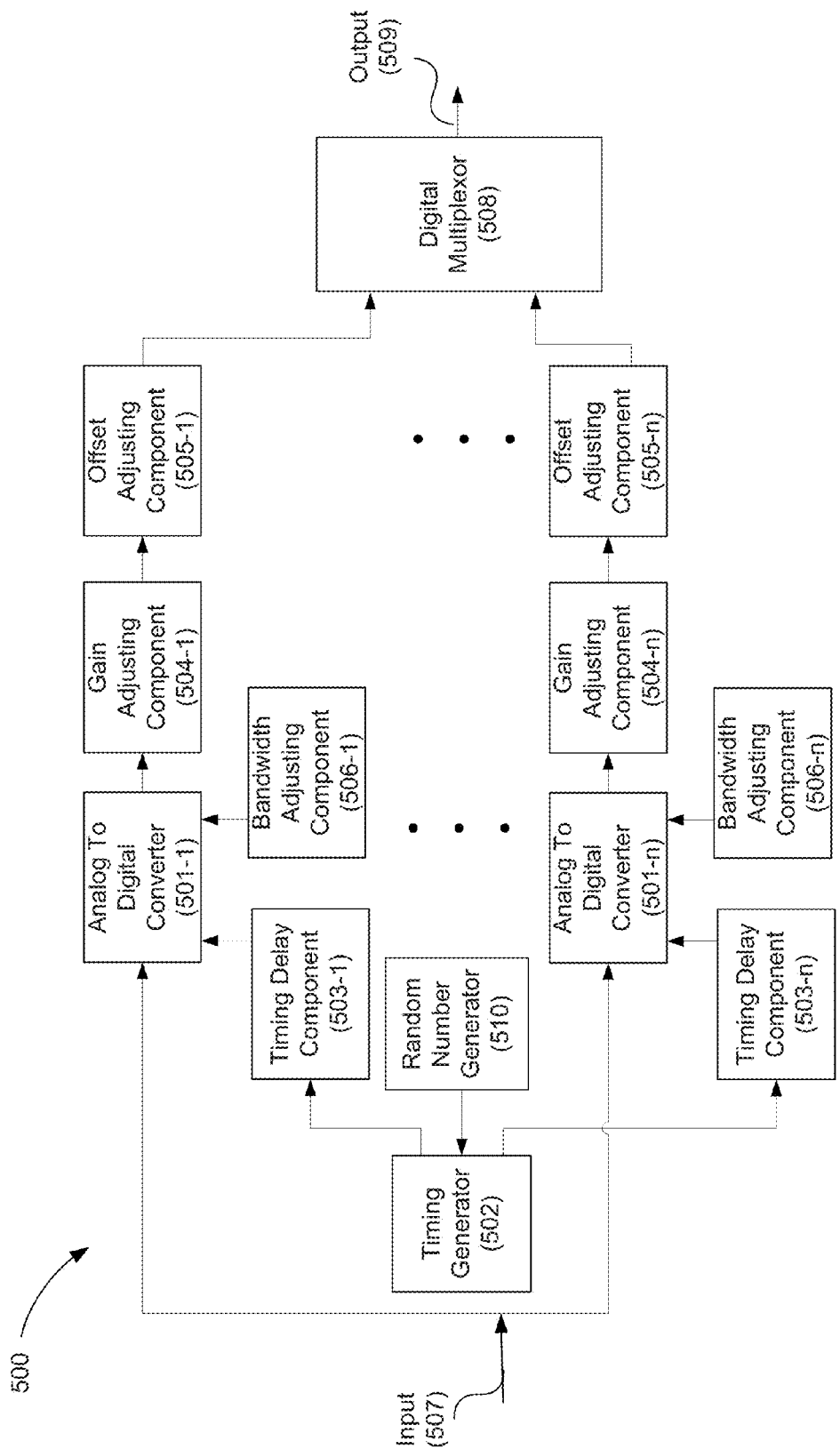
FIG. 5A is a diagram showing an illustrative time-interleaved sample-and-hold system for component matching, according to one example of principles described herein.

FIG. 5A is a diagram showing a time interleaving ADC with components for adjusting bandwidth, timing, gain, and offset to optimize performance. As mentioned above, each of the ADCs in a time interleaved ADC take turn sampling the analog input. Assume four ADC (501-1, 501-2, 501-3, 501-4) are used. In keeping with the given example, during the test condition, for example at the factory, sequential sampling is performed. At a first sampling instant, the analog input signal (507) is sampled by the first ADC (501-1). At the next sampling instant, the analog input signal (507) is sampled by a second ADC (501-2). This process continues as subsequent sampling instants are sampled by a third ADC (501-3) and a fourth ADC (501-4). At the sampling instant immediately after the one sent to a fourth ADC (501-4), the analog input signal (507) is again sampled by the first ADC (501-1). Thus, a given ADC (501) samples every fourth sampling instant. Because each ADC (501) processes every fourth sampling instant, the overall sampling frequency of the time-interleaved ADC (500) can be increased. As mentioned above, a number of factors may result in mismatch between a number of ADCs (501-1, 501-n). Each type of mismatch contributes differently to the gain, phase, and offset errors among the ADC signal paths comprising a time-interleaving ADC. Thus, each mismatch type contributes to intermodulation distortion that degrades the SFDR and SNDR of a time-interleaving ADC. As mentioned in FIG. 4A, a number of input frequencies (FIG. 4, 401) are processed by the ADC and an FFT (FIG. 4, 402) is performed on the outputs. Further, a mathematical function is used to determine the mismatch error errors that exist between the interleaved ADCs. As mentioned in FIG. 4B, a least means square function (FIG. 4B, 426) is used to determine optimal coefficients that minimize these mismatch errors. These coefficients are then written into the ADC and may be for example burnt into OTP memory on chip. The ADC is now configured to operate with much smaller mismatch errors. The remaining mismatch errors are converted to random noise by enabling random sampling. This eliminates spurs in the frequency domain caused by the interleaving. However, this method adds noise, thus degrading the SNR. Further, as explained below, by minimizing these mismatches the SNR degradation is minimized.

As mentioned above, to reduce intermodulation distortion, an ADC adjusts various components, by using the correction coefficients for the various components as described in connection with FIGS. 4A-4B. According to certain concepts, a time interleaving (500) system is able to reduce intermodulation distortion by adjusting bandwidth (506-1, 506-n) by using a bandwidth mismatch correction coefficient as described above. As mentioned above, bandwidth mismatch contributes to frequency-dependent gain and phase errors, but it does not contribute to offset errors. The analog input bandwidth of an ADC is the range of analog input signal frequencies over which the magnitude and phase of the output signal remain within certain bounds relative to the input signal. In various examples, bandwidth is the difference between the maximum and minimum frequencies for which the ratio of the output signal magnitude to the input signal magnitude is within +/−3 dB of a particular reference level. As the input signal frequency passes beyond the frequency at which the output is 3 dB smaller than the input, the output signal is increasingly attenuated at a rate of 20 dB per decade. Consequently, the input signal experiences a change in magnitude and phase as it is processed by each ADC within a time-interleaving ADC. The amount of the magnitude and phase change experienced by the input signal is dependent on the 3-dB bandwidth of each ADC. Thus any mismatch in the bandwidths of the N ADCs within a time-interleaved ADC will result in both magnitude and phase errors. Further, such errors are dependent on the input signal frequency. Consequently, bandwidth mismatches causes frequency-dependent intermodulation distortion spurs to be present in the output of a time-interleaved ADC.

Thus, a bandwidth adjusting component (506-1, 506-n) is used to better match the ADCs (501-1, 501-n), thereby reducing intermodulation distortion. As mentioned above. When the signals from each ADC's (501-1, 501-n) are recombined using a digital multiplexor (508), the digital output signal (509) will have matching bandwidth outputs because all the signal's bandwidth mismatches are adjusted for each path in the time-interleaved ADC (500). Thus, bandwidth is matched for each ADC (501-1, 501-n) in the system (500). The method this adjusting component is described in connection with FIG. 5B and FIG. 6A.

As mentioned above, sampling time mismatch contributes to frequency-dependent phase error but does not contribute to offset error. In various examples the architecture of an ADC's sampling circuit and sampling time mismatch contributes to amplitude error. Amplitude error is often frequency dependent. Sampling time mismatch occurs when time interval between subsequent sampling events in a time-interleaving ADC deviates from the ideal interval of N/Fs. If the sampling times of a number of ADCs within a time-interleaving ADC are mismatched, the output signals of each ADC contain frequency-dependent phase and magnitude errors. Consequently, when these output signals are combined to form the output of the time-interleaving ADC, the resulting output frequency spectrum contains frequency-dependent intermodulation distortions spurs.

Figure 9:
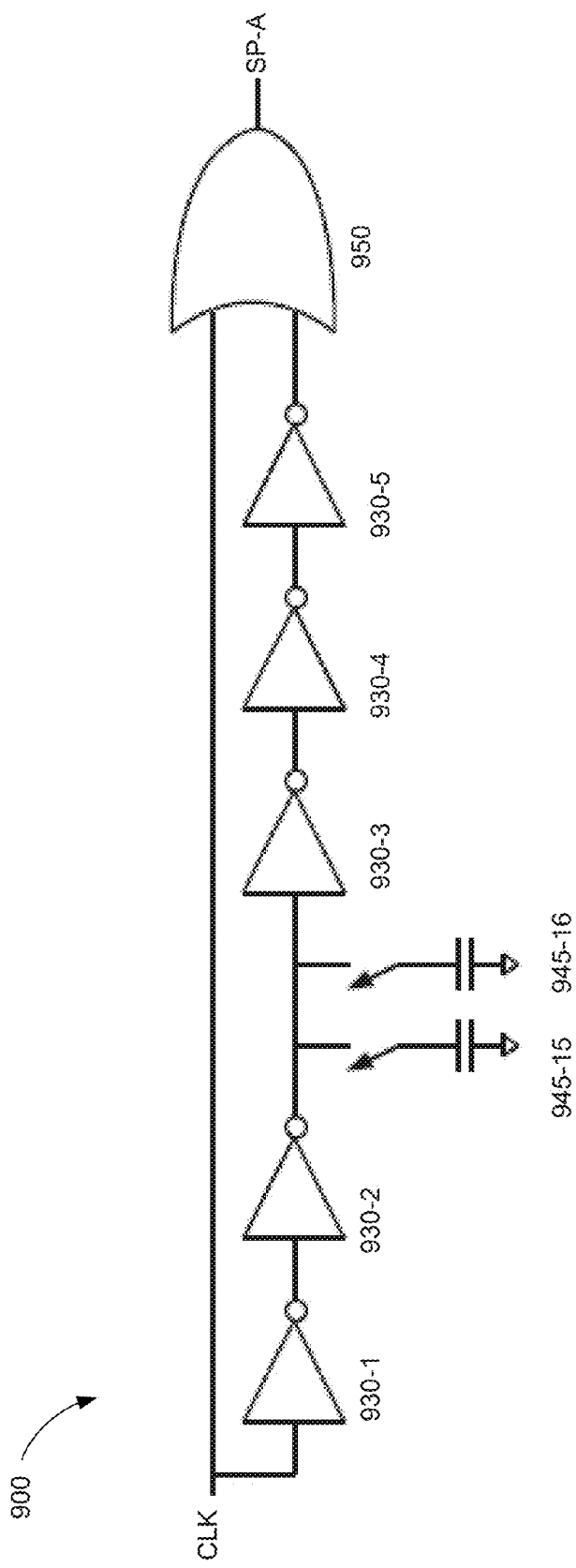
FIG. 9 is a diagram of an illustrative timing circuitry for an illustrative time-interleaved sample-and-hold system, according to one example of principles described herein.
Figure 10:
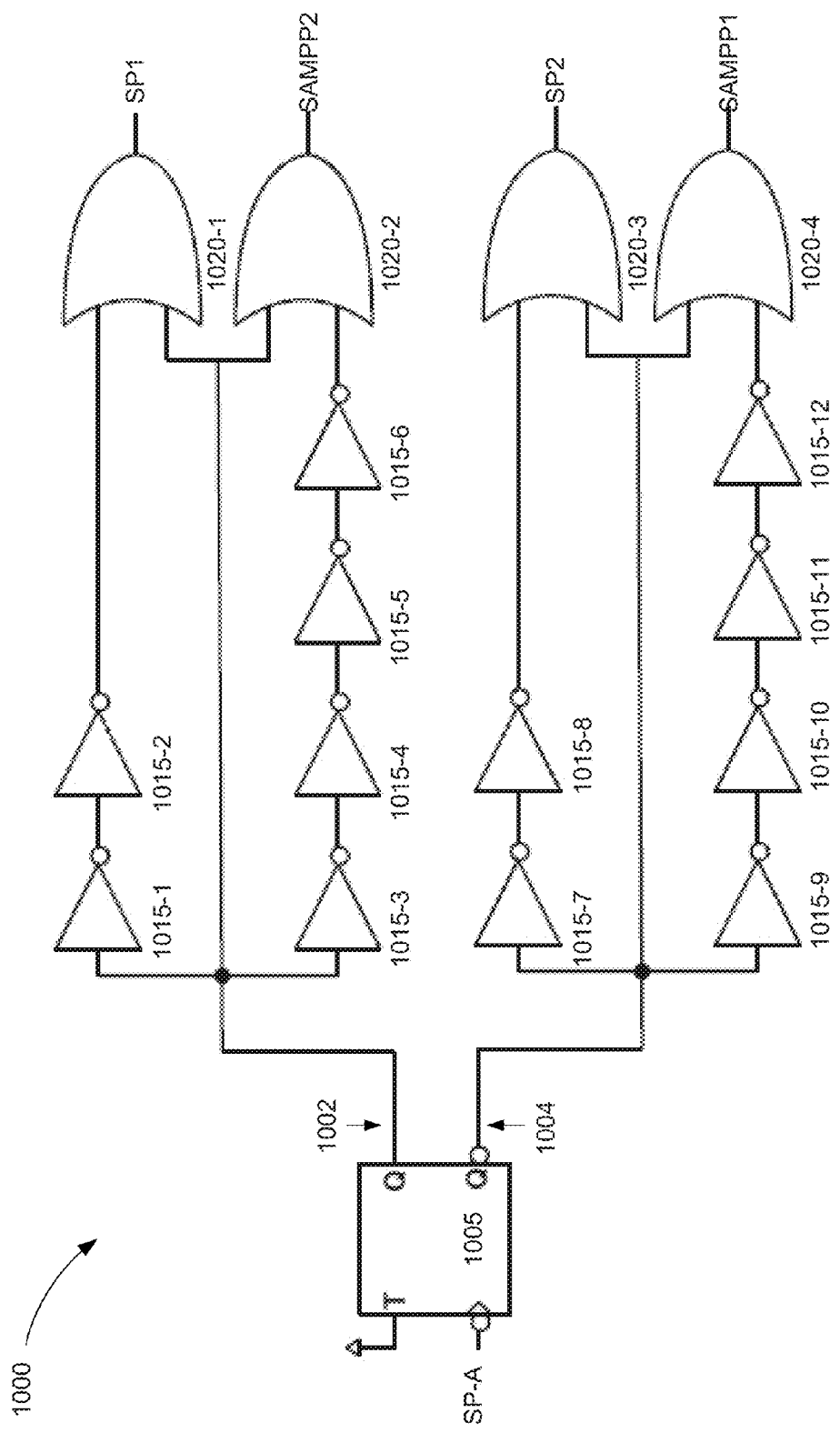
FIG. 10 is a diagram of an illustrative adjustable timing circuitry for an illustrative time-interleaved sample-and-hold system, according to one example of principles described herein.
Figure 11:
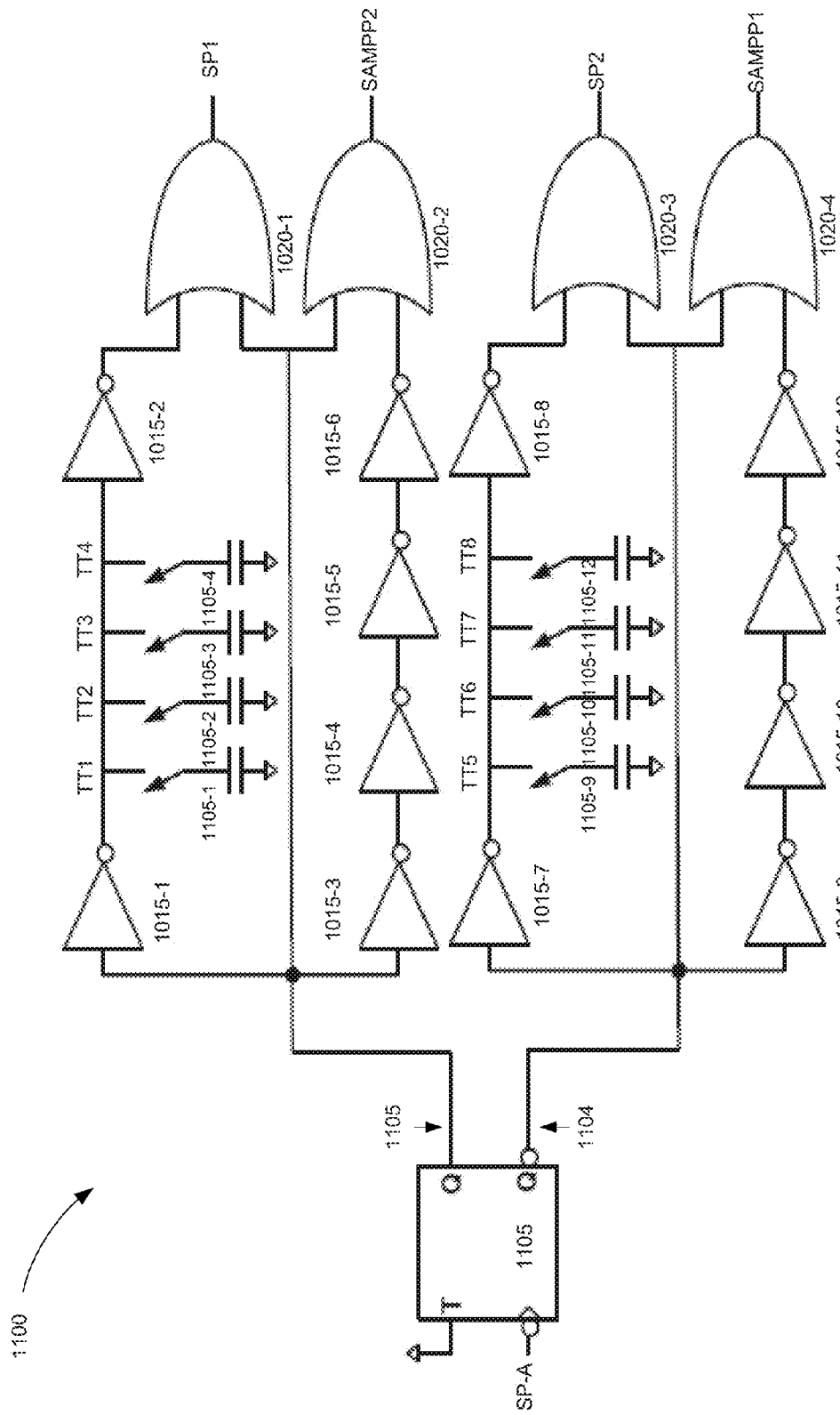
FIG. 11 is a diagram of an illustrative adjustable timing circuitry for an illustrative time-interleaved sample-and-hold system, according to one example of principles described herein.

As illustrated in FIG. 5A, a time-interleaving (500) system is able to evenly space the timing samples of the analog input (507) to the ADCs (501-1, 501-n) such that these timing signals reflect the waveform of FIG. 1C by using a timing mismatch correction coefficient as described above. A timing generator (502) sends clock signals to the timing delay component (503-1, 503-n) in which the timing delay component (503-1, 503-n) evenly spaces the sample times in a time interleaving manner as described in FIG. 5B using a timing mismatch correction coefficient and memory to adjust sampling time. Further, a number of timing circuits may be used to adjust the timing delay such as a timing trim knob. Additionally, FIGS. 9, 10 and 11 illustrate various circuits used to adjust timing samples for the ADC system.

Figure 5B:
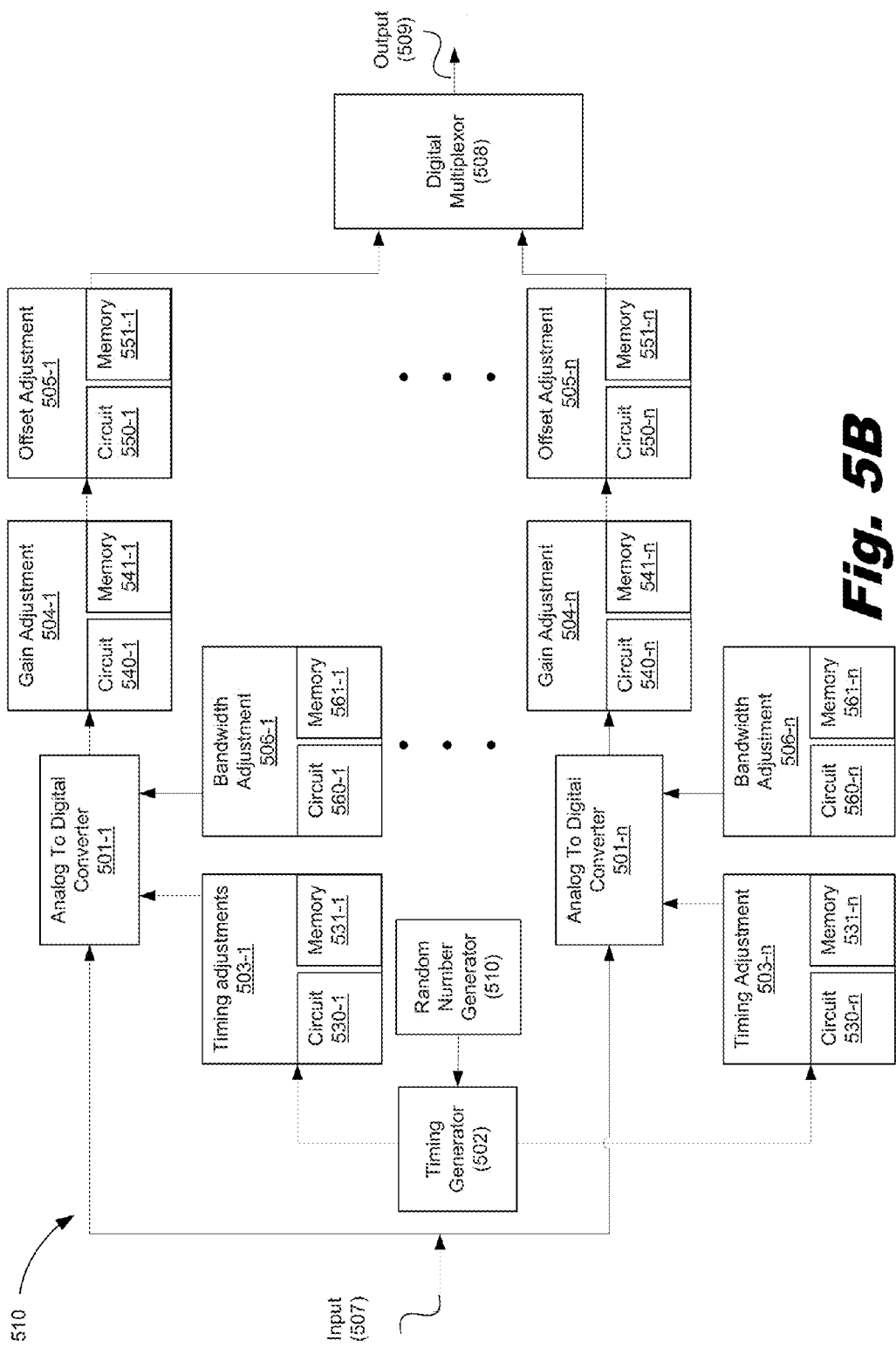
FIG. 5B is a diagram showing an illustrative time interleaving ADC system embodied in FIG. 5A, according to one example of principles described herein.

In one example, as shown in FIG. 5B, assume the analog input signal (507) is operating at 100 MHz. Further, assume the sample rate is 250 MHz. This is equivalent to a 4 nsec sample timing period. The timing delay component (503-1) adjusts its sample clock edge relative to sample clock edge (503-n) of the other ADCs by small amounts such as 50 fsec increments with a range of 1000 fsec. Thus, a timing delay adjusting component (503-1, 503-n) is used to better match the timing of the sampling of the analog input (507) by the various ADCs. Consequently, by matching the timing, timing mismatch is reduced, uneven sample spacing of the signal no longer occurs, and frequency-dependent intermodulation distortions spurs are reduced or eliminated completely. As mentioned above a timing mismatch correction coefficient may be used to reduce frequency-dependent intermodulation distortions spurs that may occur. The method of this adjusting component is as described below in connection with FIG. 5B.

Additionally, a time interleaving (500) system is capable of adjusting the gain of the interleaved ADC. As mentioned above, gain mismatch contributes to the magnitude errors and is frequency-independent. However, in various examples gain mismatch is frequency-dependent, depending on the architecture of the ADC. The gain mismatches result in magnitude errors in time-interleaving ADC's output. As described above, magnitude errors cause intermodulation distortion spurs to be present in the frequency spectrum of a time-interleaving ADC's output.

A gain adjusting component (504-1, 504-*n*) is used to better match the different gains for each ADC (501-1, 501-*n*), thereby reducing frequency magnitude errors caused by intermodulation distortion spurs of the signal. The method of this adjusting component is as described further below in connection with FIG. 5B.

Finally, a time interleaving (500) system adjusts the DC bias offset for each ADC (501-1, 501-*n*). As mentioned above, offset mismatch contributes to the offset errors and is frequency-independent. However, in various examples offset mismatch is frequency-dependent depending on the architecture of the ADC. Offset errors cause intermodulation distortion spurs to be present in the frequency spectrum of a time-interleaving ADC's output.

If the ADC gives different DC signal outputs, a component that is half the sample rate may be observed at the output for a system using two ADCs and a more complicated output if more than two ADCs are used. Thus, an offset adjusting component (505-1, 505-*n*) is used to reduce intermodulation distortion spurs of the signal at half the sample rate for the example of a system interleaving 2 ADCs. When the signals from each ADC (501-1, 501-*n*) are recombined using a digital multiplexor (508), the digital output signal (509) will have matching offset outputs. Consequently, all the offset signals are matched. The method of this adjusting component is described further in connection with FIG. 5B.

FIG. 5B is a diagram showing a time-interleaving ADC with components for adjusting bandwidth, timing, gain, and offset to optimize performance according to one example of the principles described herein. To reduce intermodulation distortion spurs, a time-interleaving ADC comprises various adjustable components as described above. Digital mismatch correction coefficients may be supplied to these adjustable components, if needed, to optimize the performance of a time-interleaving ADC wherein memory components are used to store correction coefficients and circuitry is used to adjust each component. As described in connection with FIGS. 4A and 4B correction coefficients are determined by first sampling a number of input signals at various frequencies, and computing the resulting frequency-dependent magnitude and phase errors by applying a fast-Fourier-transform (FFT) to the digital output stream of each of the constituent ADCs. Next, the resulting offset errors are processed by mathematical function which identifies the magnitude and phase of the various mismatches between each of the constituent ADCs and the reference ADC. Subsequently, these extracted mismatches are converted into correction coefficients based on the resolution of the digital offset adjustment circuitry. The digital offset correction coefficient is then burned into the OTP, for example, during a test operation performed, for example, at the factory for a semiconductor chip.

According to certain concepts, a time interleaving (510) system is able to reduce frequency dependent intermodulation distortion by adjusting the bandwidths (506-1, 506-*n*) of the constituent ADCs (501-1, 501-*n*). This bandwidth adjustment is accomplished by applying a digital bandwidth correction coefficient stored in a memory (561-1, 561-*n*) to an analog bandwidth adjustment circuit (560-1, 560-*n*). Such an analog bandwidth adjustment circuit may, for example, increase or decrease the bandwidth of a ADC (501-1, 501-*n*) by decreasing or increasing a series resistance in the ADC's sampling circuit or by changing capacitance values in a filter in the signal path of the ADC. Consequently, when the signals from each constituent ADC (501-1, 501-*n*) are recombined using a digital multiplexor (508), the digital output signal (509) will have reduced intermodulation distortion because all the ADC output signals will have been passed through circuits with the same bandwidth. Thus, bandwidth is matched for each ADC (501-1, 501-*n*) in the time-interleaving ADC system (510) and frequency-dependent intermodulation distortion due to bandwidth mismatch is reduced or eliminated.

Additionally, as noted above, a time-interleaving (510) system is able to reduce intermodulation distortion, which may be frequency-dependent, by evenly spacing the sampling times of the analog input (507). This sampling time adjustment is accomplished by applying a digital sampling time correction coefficient stored in a memory (531-1, 531-*n*) to analog sampling time adjustment circuit (530-1, 530-*n*). Simultaneously, the analog sampling time adjustment circuit receives a sampling clock input from a timing generator circuit (502). This sampling time generator circuit (502) is responsible for orchestrating the sampling events of the constituent ADCs (501-1, 501-*n*) such that the analog input (507) is sampled at an effective sampling rate a factor of N times faster than the sampling rate of the constituent ADCs. However, due to manufacturing inconsistencies, for example, the sampling clocks generated by the timing generator circuit (502) may be skewed such that sampling times of the analog input (502) are not equally spaced in time. Accordingly, the analog sampling time adjustment circuits (530-1, 530-*n*) may adjust the delay experienced by the clock outputs of the timing generator (502) based on the digital sampling time mismatch correction coefficients stored in memory (531-1, 531-*n*). Such a delay may be introduced, for example, by increasing or decreasing the amount of shunt capacitance loading the output of a logic gate in the sampling clock path. Consequently, when the signals from each constituent ADC (501-1, 501-*n*) are recombined using a digital multiplexor (508), the digital output signal (509) will have reduced intermodulation distortion because all the sampling times of the analog input (507) will be evenly spaced in time. As mentioned above, each ADC (501-1, 501-*n*) is responsible for converting a subset of the analog input (507) signal to a digital signal. Thus, the output of the ADC (501-1, 501-*n*) is a digital signal. The output of the ADC (501-1, 501-*n*) is is connected to a gain adjusting component (504-1, 504-*n*) that performs a digital multiplication on the digital output to compensate for the gain error. As mentioned above, part of the matching process involves adjusting the gains of the ADCs (501-1, 501-*n*) comprising a time-interleaving ADC (510) using gain correction coefficients as described in connection with FIG. 4A and FIG. 4B.

A method for gain matching between a number of constituent ADCs (501-1, 501-*n*) uses a memory element (541-1, 541-*n*) to store a gain correction coefficient for each constituent ADC (501-1, 501-*n*) comprising the time-interleaving ADC (510) system. The stored gain correction coefficient is supplied to an input of a digital gain adjustment circuit (540-1, 540-*n*) which adjusts the magnitude of the ADC output signal such that the magnitude errors between the outputs of the constituent ADCs are reduced or eliminated. Consequently, when the signals from each constituent ADC (501-1, 501-*n*) are recombined using a digital multiplexor (508), the digital output signal (509) will have reduced intermodulation distortion because all the gains of the constituent ADCs (501-1, 501-*n*) will be equal.

The output of the gain adjustment component (504-1, 504-*n*) is connected to an offset adjusting component (505-1) that performs a signed digital addition on the digital output to compensate for the offset error. As mentioned above, part of the matching process involves adjusting the offsets of the ADCs (501-1, 501-*n*) comprising a time-interleaving ADC (510) using offset correction coefficients as described in connection with FIGS. 4A and 4B.

A method for offset matching between a number of constituent ADCs (501-1, 501-n) uses a memory element (551-1, 551-n) to store a offset correction coefficient for each constituent ADC (501-1, 501-n) comprising the time-interleaving ADC (510) system. The stored offset correction coefficient is supplied to an input of a digital offset adjustment circuit (550-1, 550-n) which adjusts the offset of the ADC output signal such that the offset errors between the outputs of the constituent ADCs are reduced or eliminated. Consequently, when the signals from each constituent ADC (501-1, 501-n) are recombined using a digital multiplexor (508), the digital output signal (509) will have reduced intermodulation distortion because all the offsets of the constituent ADCs (501-1, 501-n) will be equal.

Thus, after all the matching adjustments have been made using correction coefficients, if needed, frequency dependent errors between the outputs of the constituent ADCs (501-1, 501-n) are reduced or eliminated. The output signal (509) signal is formed using a digital multiplexor (508) which combines the mismatch-corrected output signals of the constituent ADCs. Thus the reduction of intermodulation distortion in the output of a time-interleaving ADC is mitigated.

Figure 6A:
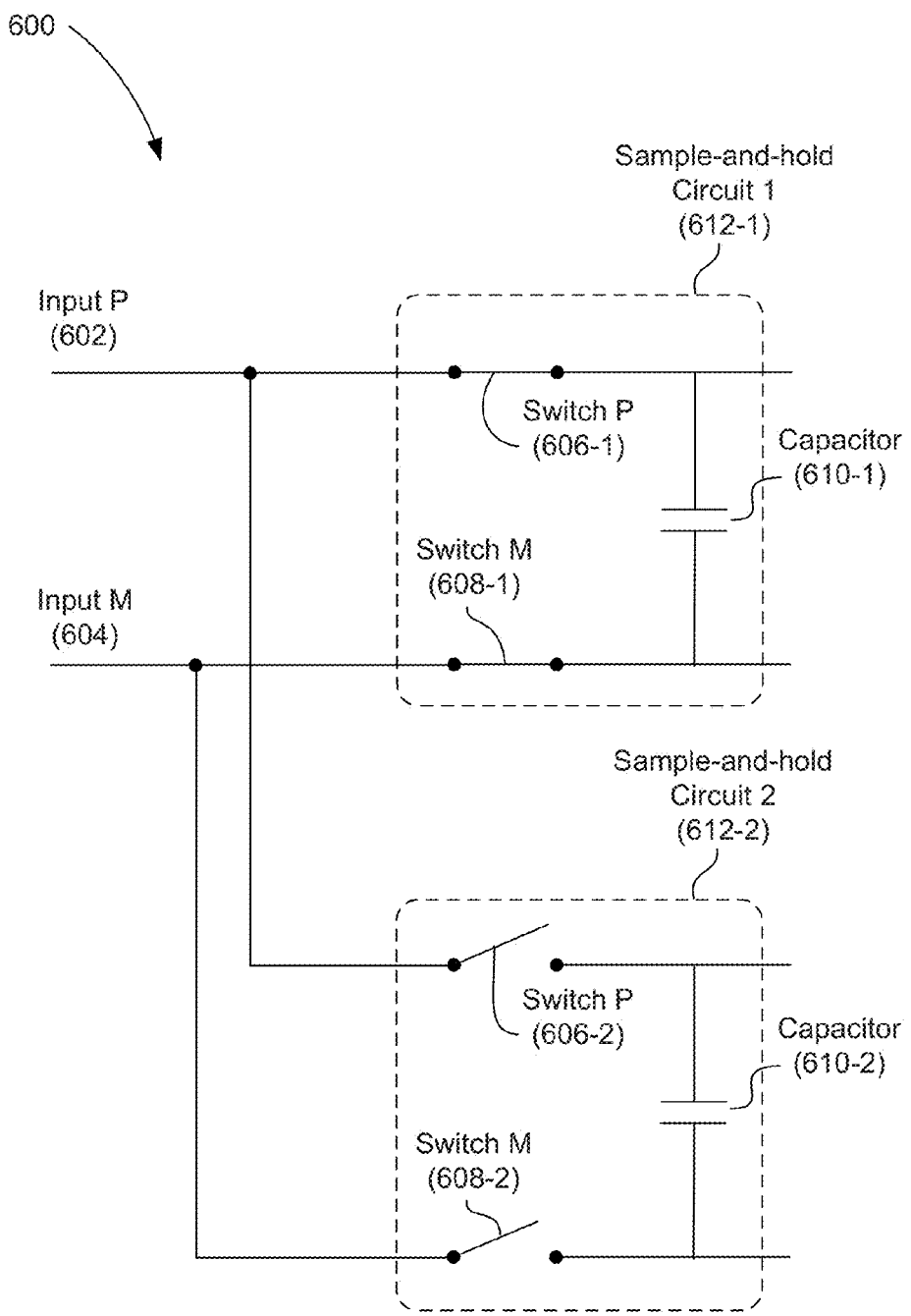
FIG. 6A is a diagram showing an illustrative schematic for sample-and-hold circuits for an ADC circuit for matching bandwidth, according to one example of principles described herein.
Figure 6B:
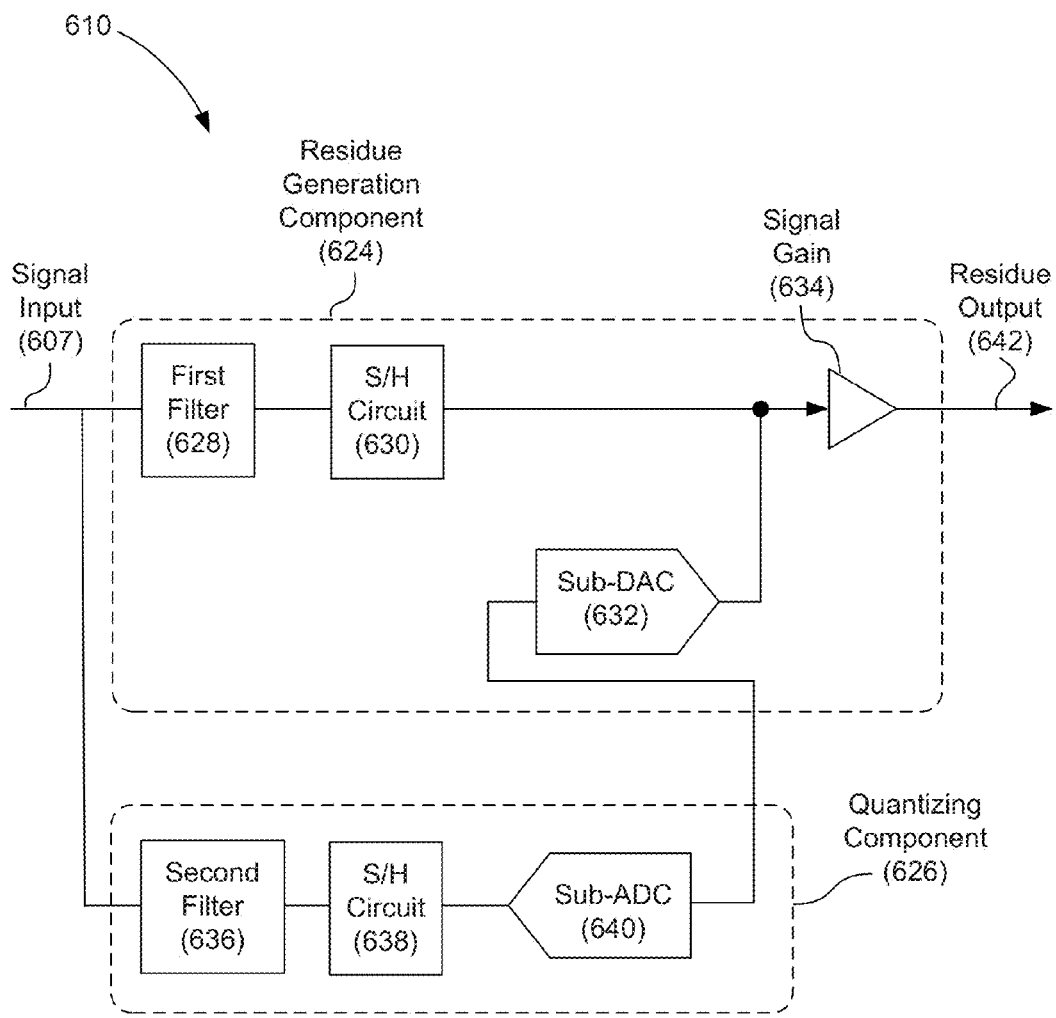
FIG. 6B is a diagram showing an illustrative pipelined ADC stage, according to one example of principles described herein.

FIG. 6A is a diagram showing a schematic for Sample-and-Hold circuits for an ADC (FIG. 5, 501-1, 501-n) circuit for matching bandwidth. The sample- and hold circuits (612) illustrated in FIG. 6A are part of a differential time-interleaved ADC that shows two interleaved ADC (FIG. 5, 501-1, 501-n) circuits. A differential S/H measures the difference between two input signals and outputs a signal equivalent to that difference. The two inputs are referred to as Input P (602) and Input M (604).

A Sample-and-Hold circuit is a commonly used circuit within an ADC. The Sample-and-Hold circuit operates by alternating between a track mode or sampling mode and a hold mode. While in the sampling mode, the output of the Sample-and-Hold circuit matches the input of the Sample-and-Hold circuit. While in the hold mode, the output of the Sample-and-Hold circuit maintains a constant value. This value is the value which the input of the Sample-and-Hold circuit was at the time the Sample-and-Hold circuit made the switch from sample mode to hold mode. Upon returning to sample mode, the output returns to the level of the input signal and continues to track that input signal level.

A Sample-and-Hold circuit involves a switch and a capacitor. While the Sample-and-Hold circuit is in sampling mode, the switch is closed. Thus, the signal passes through the switch to the output. The voltage stored in the capacitor also tracks the input signal. When the Sample-and-Hold circuit switches to hold mode, the switch is opened. The value that was stored in the capacitor at this point now becomes the output signal. Based on the characteristics of the capacitor, this value will begin to drop during the hold mode. However, if the value of the capacitor is chosen correctly, this drop will be negligible for the duration of the hold mode.

In the example of FIG. 6A, Sample-and-Hold Circuit 1 (612-1) is in a sample mode. Both Switch P (606-1) and switch M (606-2) are closed. Thus, the difference between Input P (602) and Input M (604) will be stored across the capacitor (610-1). When Sample-and-Hold Circuit 1 (612-1) switches to hold mode, the output of Sample-and-Hold Circuit 1 (612-1) will be whatever value was stored in the capacitor at the instant in which the switches (606-1, 608-1) were opened. This output will remain relatively constant throughout the duration of the hold mode despite whatever signal variations are still occurring on the inputs (602, 604).

Sample-and-Hold Circuit 2 (612-2) is shown in the hold mode. Because the switches (606-2, 608-2) are open, the input signals do not pass through to the capacitor (610-2). Thus, the capacitor maintains whatever voltage level it was holding at the moment that Sample-and-Hold Circuit 2 (612-2) switched into hold mode. The duration of the hold mode is designed to be such that the rest of the circuitry within the ADC (FIG. 5, 501-1, 501-n) can determine the appropriate discrete digital signal level to which the sampled value is closest.

As mentioned above, the speed at which a ADC (FIG. 5, 501-1, 501-n) circuit is able to operate is dependent upon the characteristics of the Sample-and-Hold circuit associated with that ADC (FIG. 5, 501-1, 501-n). This is because the intrinsic resistance of the switch while in an ON position, in combination with the capacitor used to store a signal value, creates a low pass filter. A low-pass filter blocks signals of a higher frequency while allowing signals of a lower frequency to pass. Specifically, as the input signal frequency increases, the output signal will begin to attenuate. Due to manufacturing inconsistencies, the intrinsic resistance of each switch in the ON position and the capacitance values (610-1, 610-2) will be slightly different. This will cause the bandwidth of each ADC (FIG. 5, 501-1, 501-n) signal to be slightly different. As a result, at higher frequencies, the outputs of the Sample-and-Hold circuits for each of the ADCs (FIG. 5, 501-1, 501-n) will be attenuated and phase shifted in a slightly different manner leading to errors in the analog to digital conversion process.

ADCs may employ a Sample- and Hold circuit whose output drives the rest of the circuits used to digitize the held signal as shown in FIG. 1E. An alternate approach is shown in FIG. 6B, where a single Sample-and-Hold is replaced by 2 sample and hold circuits (630, 638). For proper operation both signal paths (628, 630 and 636, 638) have to match in bandwidth and be sampled at the same time. An advantage of this approach is it avoids an S/H amplifier preceding it and thus saves power and lowers noise. FIG. 6B is a diagram showing a pipelined ADC stage. The diagram may represent either a single ended or differential pipeline stage. A differential ADC measures the value between two input signals rather than the value of a single input signal with respect to ground.

FIG. 6B is a diagram showing a pipelined ADC stage (610). The diagram may represent either a single ended or differential pipeline stage (610). A differential ADC measures the value between two input signals rather than the value of a single input signal with respect to ground.

According to certain examples, the pipelined ADC stage comprises a signal input (607) that is connected to two main components. The first component is the residue generation component (624). This component corresponds to the main sampling path. The second component is the quantizing component (626). This component corresponds to the sub-ADC sampling path.

The residue generation component (624) comprises a first snubbing filter (628), a sample-and-hold circuit (630), and a sub-DAC (632). The first filter (628) is positioned between the signal input (607) and the sample-and-hold circuit. The sub-DAC (632) is connected to a node between the sample-and-hold circuit (630) and the residue output (642). In some cases, a signal gain component (634) may be placed between the node and the residue output (642). The combination of the sample-and-hold circuit (630) and the sub-DAC form a Multiplying Digital-to-Analog Converter (MDAC).

The quantizing component (626) includes a second snubbing filter (636), a sample-and-hold circuit (638), and a sub- ADO (640). The second filter (636) is connected between the signal input (607) and the sample-and-hold circuit (638). The sample-and-hold circuit (638) is connected to the input of a sub-ADC (640). The output of the sub-ADO (640) is connected to the sub-DAC (632) of the residue generation component (624). The following will describe the operation of the pipeline ADC stage.

As an input signal is received by the pipeline stage (610), it is sampled by both the sample-and-hold circuit (630) from the main sampling path and the sample-and-hold circuit (638) of the sub-ADC sampling path. A sample-and-hold circuit (638) alternates between a sample mode and a hold mode. While in sample mode, the output of the sample-and-hold circuit (638) mode tracks the input of the sample-and-hold circuit (638). While in hold mode, the output maintains the value of the input signal at the moment in which the circuit (638) was switched to hold mode. The hold mode is just long enough to allow processing of that signal by the other pipelined ADC stage (610) components.

The sample-and-hold circuit (638) of the sub-ADC path feeds the sampled input signal to the sub-ADC (640). The sub-ADC (640) may be a simple low resolution ADC designed to convert the received input signal (607) into a small number of bits. For example, the ADC may have a three or four bit resolution. In some cases, the sub-ADC (640) may be a flash ADC. Flash ADCs are able to operate at faster rates. However, they require the use of several comparator circuits. The output of the sub-ADC (640) is a quantized version of the sampled input signal. In some cases, the sample-and-hold circuit (638) is not a discrete circuit. Rather, components within the sub-ADO (640) perform the sample-and-hold functions. For example, the capacitors within the sub-ADC (640) may be used to store a voltage signal during the sample phase and maintain that value throughout the hold phase.

As mentioned above, the sampling process, whether performed by a discrete sample-and-hold circuit or a sample-and-hold circuit integrated with the sub-ADO (640), involves the opening and closing of sampling switches. This opening and closing can introduce spurious spikes in the sampled input signal. To counter this effect, the second filter (636) can be designed to snub out these signal spikes while allowing the input signal to pass relatively unaffected.

As mentioned above, the input signal is also fed into the residue generation component (624). In this component, the input signal is sampled by the sample-and-hold circuit (630). The output of the sample-and-hold circuit (630) is connected to a node that is also connected to the sub-DAC (632). The sub-DAC (632) may also be a low resolution device capable of handling the output of the sub-ADC. For example, the sub-DAC (632) may have a digital input of three or four bits. The sub-DAC (632) then produces an analog version of the quantized signal received from the sub-ADC (640). This analog signal will be slightly different than the input signal due to the lower resolution of the sub-ADO (640) and sub-DAC (632). This analog output of the sub-DAC (632) is then subtracted from the original sampled input signal. The difference between the original sampled input signal and the output of the sub-DAC (632) is referred to as the residue signal (642). This residue signal may be amplified by a signal gain component (634). Additionally, the residue output (642) is connected to a gain adjusting component (504-1, 504-n) as illustrated in FIGS. 5A and 5B.

Like the sample-and-hold circuit (638) from the quantizing component, the sample-and-hold circuit (630) from the main sampling path introduces spurious signal spikes as a result of the opening and closing of switches. Thus, a filter (628) is used to snub out these spurious signals. As will be described in connection with FIG. 6C, having separate filters for each path, greater freedom can be used in the design of the components while still providing frequency response matching between the main sampling path and the sub-ADO sampling path.

Figure 6C:
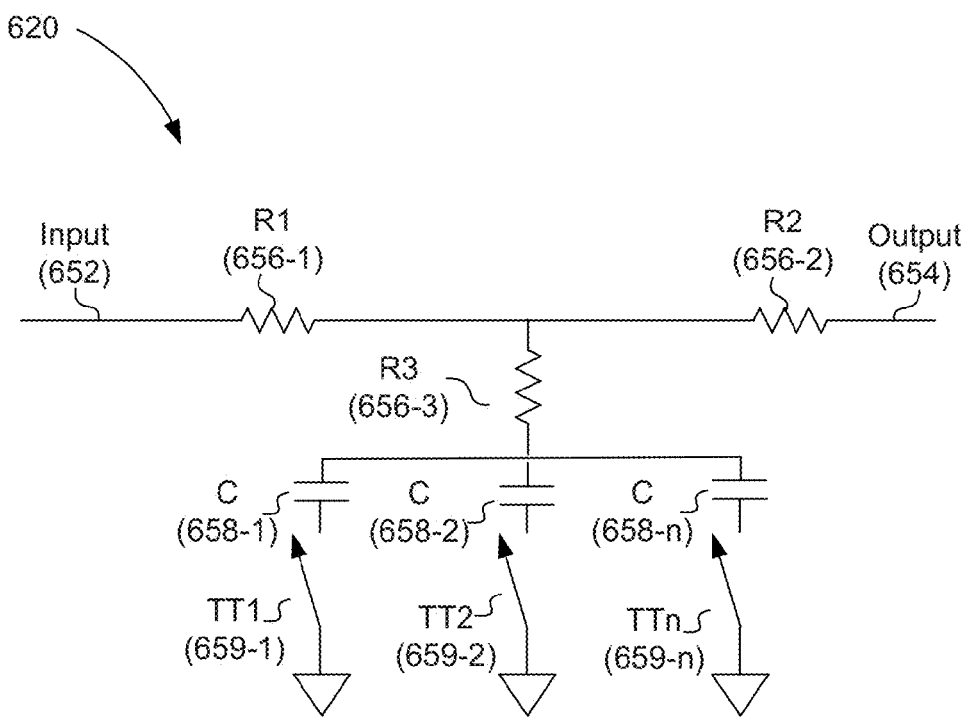
FIG. 6C is a diagram showing an illustrative single ended filter, according to one example of principles described herein.

FIG. 6C is a diagram showing n single ended filter (620) according to one example of the principles described herein. A single ended filter is one for use in a single ended pipelined ADC. For differential ADC, two paths exist and this single ended filter is repeated in both paths. In some cases, the capacitors shown in FIG. 6C can be shared in differential applications. A single ended ADC measures the value of an analog signal with respect to ground. According to certain examples, the filter (620) includes a set of resistors (656), a set of capacitors (658), and a set of switches (659) placed between an input (652) and an output (654).

The resistors (656) in combination with the capacitors (658) form a low pass filter. The resistance values and capacitance values are selected such that the filter removes the high frequency signal spikes caused by the charge injection from the opening and closing of sampling switches without substantially affecting the input signal (652). Additionally, the filter (620) can be programmable by using a number of capacitors (658-1 to 658-n) in which a number of switches (659-1 to 659-n) are used to toggle off and on a number of capacitors (658-1 to 658-n) such that by using different switch settings, the overall value of the capacitors (658) are altered and changes the bandwidth of the ADC signal path. A differential pipelined ADC may also use such single-ended filters. In such cases, a filter is placed between the positive signal and ground as well as between the negative signal and ground.

Figure 7:
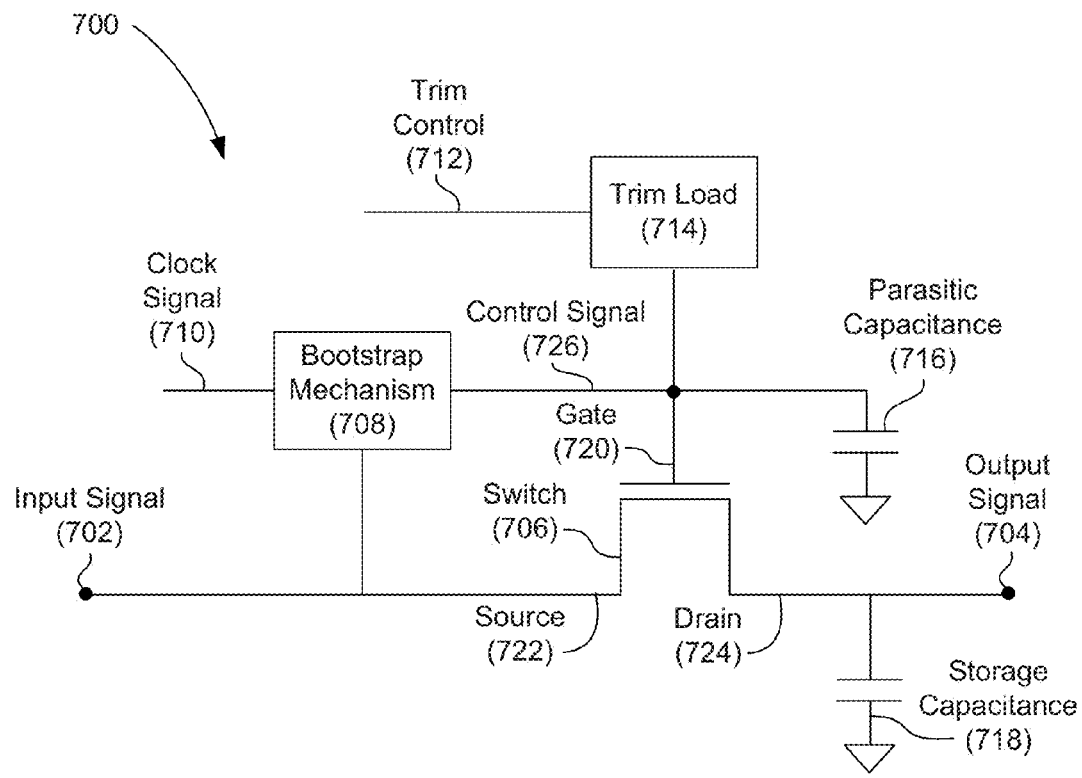
FIG. 7 is a diagram showing an illustrative schematic for a switch within a sample-and-hold circuit for matching bandwidth, according to one example of principles described herein.

FIG. 7 is a diagram showing an illustrative schematic (700) of a switch (706) within a track-and-hold circuit. Metal-oxide-semiconductor (MOS) transistors are often used as electronic switches within circuits. A MOS transistor can be simplified for analysis as a three terminal device that allows an electrical signal to pass between a source terminal and a drain terminal (724) depending on the electrical signal at the gate signal (720). In an N-type transistor, the electrical signal passes between the source terminal (722) and the drain terminal (724) when the signal at the gate terminal (720) is high, and the electrical signal is blocked when the signal at the gate terminal (720) is low. In a P-type transistor, the electrical signal passes between the source terminal (722) and the drain terminal (724) when the signal at the gate terminal (720) is low, and the electrical signal is blocked when the signal at the gate terminal (720) is high. Thus, the switch (706) is operated by a clock signal (710) that alternates between a low signal and a high signal.

The intrinsic resistance of the switch (706) while in an ON state is dependent upon the voltage between the gate terminal (720) and the source terminal (722). This voltage is referred to as $V_{GS}$. To maintain the linearity of the switch, the $V_{GS}$ is relatively constant. However, if the input signal varies while the signal which turns the switch ON remains constant, then the $V_{GS}$ will be different each time the switch is sampling a varying analog signal. In one example, a signal varies between 0.5 volts and 1.5 volts. A high clock signal may be at a value of 1.8 volts, which is equivalent to the voltage supply $V_{DD}$ of the circuit. If the switch is turned on while the input signal is at 1.5 volts, then the $V_{GS}$ is 0.3 volts (1.8-1.5). However, if the switch (706) is turned on while the input signal is 0.5 volts, then the $V_{GS}$ will be 1.3 volts. This difference in the $V_{GS}$ leads to a difference in the ON state intrinsic resistance of the switch (706). This non-linearity creates distortion specifically undesirable harmonics in the analog to digital conversion process. For example if a 10 MHz input signal is sampled by the ADO sampling at 250 MHz, a $2^{nd}$ harmonic distortion will creates an output component at 20 MHz and a third harmonic component will be created at 30 MHz. Both of these are undesirable components in the output.

To maintain a relatively constant $V_{GS}$ and thus a relatively constant ON state intrinsic resistance, a bootstrap mechanism (708) is used. The bootstrap mechanism (708) includes a capacitor that stores a desired $V_{GS}$ across the bootstrap capacitor. When the switch (706) is turned on, the input signal (702) appears at one terminal of the capacitor and the opposite terminal of the capacitor is connected to the gate terminal (720). Because the capacitor is floated (meaning that there is no path to discharge the capacitor), the input signal also appears on the gate terminal, thus not changing the $V_{GS}$ materially regardless of the input signal (702). Thus, $V_{GS}$ remains relatively constant.

As mentioned above, the frequency response of the track-and-hold circuit is dependent upon the intrinsic resistance of the switch (706) while in the ON state as well as the capacitance of the storage capacitor (718). The intrinsic resistance of the switch is dependent upon the $V_{GS}$ of the switch. The $V_{GS}$ can be adjusted by affecting the efficiency of the bootstrap. Specifically, by adding additional capacitance to the bootstrap control signal, the efficiency of the bootstrap mechanism (708) is reduced. Reducing the efficiency of the bootstrap (708) will decrease the $V_{GS}$ of the switch. This, in turn, will increase the ON state intrinsic resistance of the switch (706). Increasing the ON state intrinsic resistance of the switch (706) will affect the frequency response of the track-and-hold circuit. Specifically, it will reduce the bandwidth of the track-and-hold circuit. The bandwidth of a low-pass filter refers to the range of frequencies between 0 hertz and the frequency at which the signal attenuates to −3 decibels.

As noted, to reduce the efficiency of the bootstrap (708), additional capacitance is added to the line carrying the bootstrap control signal (726). A trim control signal (712) can be used to adjust a trim load (714) that will add a specified capacitance to the control signal line. This additional capacitance is in addition to any parasitic capacitance (716) already inherent in the physical control signal (726) line. In one example, the trim load (714) may be a capacitor bank.

Figure 8:
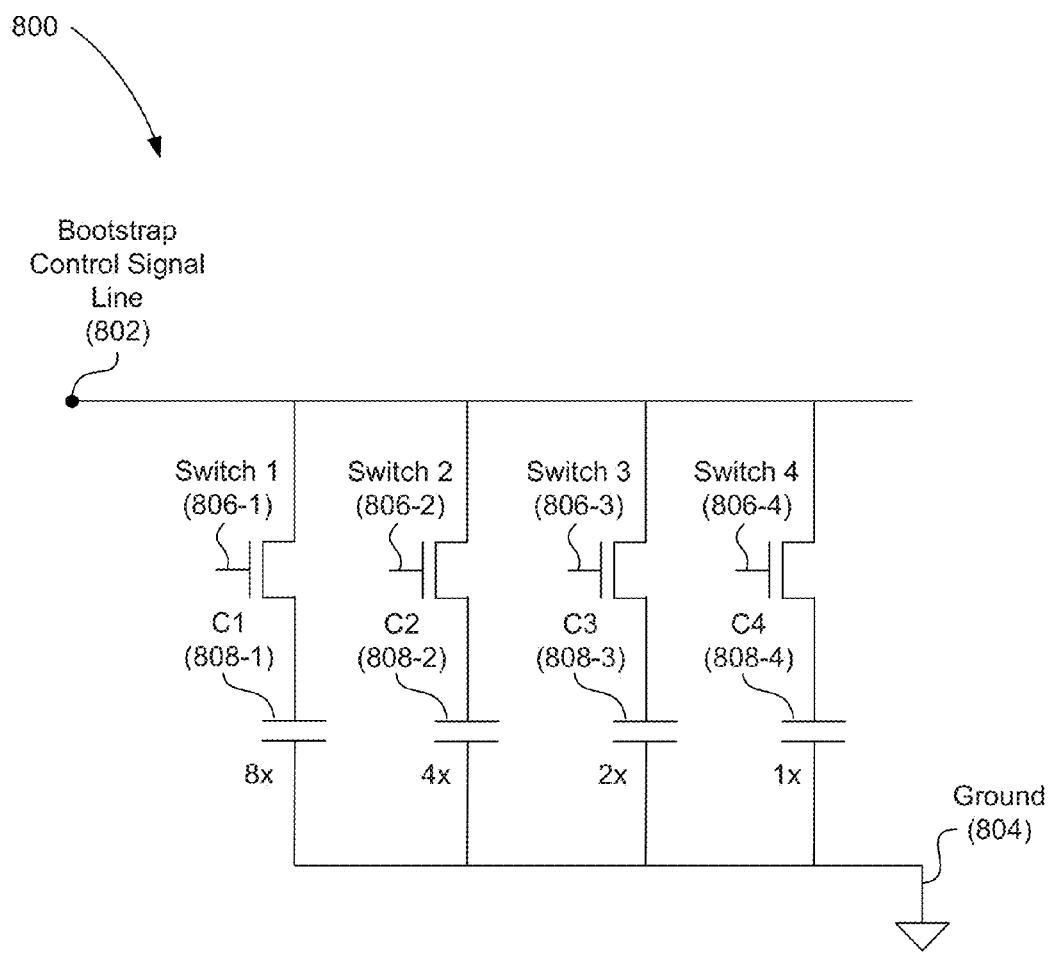
FIG. 8 is a diagram showing an illustrative capacitor bank for matching bandwidth, according to one example of principles described herein.

FIG. 8 is a diagram showing an illustrative capacitor bank (800). According to certain illustrative examples, the capacitor bank (800) includes a set of capacitors in parallel. These capacitors (808) are configured to selectively add to a total capacitance between the bootstrap control signal line (802) and ground (804).

In the capacitor bank (800) illustrated in FIG. 8, there are four capacitors (808) in parallel. Each capacitor is configured to selectively add to the total capacitance through use of a switch (806). Switch 1 (806-1) is connected to C1 (808-1), Switch 2 (806-2) is connected to C2 (808-2), Switch 3 (806-3) is connected to C3 (808-3), and Switch 4 (806-4) is connected to C4 (808-4). When a switch is in an ON state, and current is allowed to flow through that switch, then the capacitor associated with that switch will add to the total capacitance between the control line (802) and ground (804). If a particular switch is in an OFF state, then the capacitor associated with that switch will not add to the total capacitance between the control line (802) and ground (804). By selecting a particular combination of capacitors to add to the total capacitance, a set of discrete capacitance values will be added to the parasitic capacitance in the bootstrap control line. Additional capacitance will effectively reduce the bandwidth of the frequency response of the track-and-hold circuit.

In one example, the capacitor bank may be a binary weighted capacitor bank. In such a capacitor bank, each individual capacitor is twice the value of the next smallest capacitor. For example, C3 (808-3) may be twice the value of C4 (808-4), C2 (808-2) may be four times the value of C4 (808-4), and C1 may be eight times the value of C4 (808-4). Thus, a capacitor bank with four binary weighted capacitors can take on 16 discrete total capacitance values. In one example, a memory associated with the capacitor bank (800) may be used to store the setting for each switch (806). This memory may be, for example, a local digital register consisting of flip flops. This local register may bad its content from a One Time Programmable memory, where coefficients are burned in at a test step in the factory. Other types of memory which can permanently store the setting of the capacitor bank (800) may be used.

Using principles described herein, the frequency response for each ADC (FIGS. 5A and 5B, 501-1, 501-*n*) within a manufactured time-interleaved ADC may be determined. Each of the frequency responses will be slightly different due to manufacturing variations. Each of the frequency responses of the ADC (FIGS. 5A and 5B, 501-1, 501-*n*) may then be adjusted by setting the trim load associated with the track-and-hold circuit of those ADCs (FIGS. 5A and 5B, 501-1, 501-*n*). For example, the bandwidth of each Sample-and-Hold circuit may be reduced to match the bandwidth of the Sample-and-Hold circuit having the lowest bandwidth. The settings for each of the trim loads may then be stored in a memory. Thus, these Sample-and-Hold circuits will maintain the frequency responses to which they are set during operation of the time-interleaved ADC.

FIGS. 9 to 15 illustrate methods for adjusting timing on a time-interleaved ADC system. Although these methods are illustrated in reference to FIGS. 1A to 1C, similar methods may be included to adjust timing for the time-interleaved ADC systems illustrated in FIGS. 2A to 3D.

FIG. 9 shows an illustrative diagram of circuitry (900) that may be used to derive the SP-A signal of FIG. 1C, which controls the common sampling switch (FIG. 1B, 106), from a clock signal CLK. An OR gate (950) receives the unaltered CLK signal as one input and a delayed and inverted version of the CLK signal as its other input. The CLK signal may be delayed using, for example, a set of CMOS inverters (930-1 to 930-5). Further, through the inclusion of additional switchable capacitors (945-15, 945-16) the negative pulse width of SP-A may be selectively adjusted.

FIG. 10 shows a diagram of illustrative circuitry (1000) that may be used to derive the SP1, SAMPP2, SP2, and SAMPP1 control signals of FIG. 1C, which control switches (109-1, 108-*n*, 109-*n*, 108-1, respectively) of FIG. 1B. A toggle flip-flop (1005) may alternate between a high output and a low output at each falling edge cycle of its clock input, shown connected to the SP-A signal in FIG. 10.

A first OR gate (1020-1) takes the unaltered output of the toggle flip-flop Q (1002) with a delayed version of the output of the toggle flip-flop Q (1002) as inputs to produce the SP1 signal. A second OR gate (1020-2) takes the unaltered output of the toggle flip-flop Q (1002) with a slightly more delayed version of the output of the toggle flip-flop Q (1002) as inputs to produce the SAMPP2 signal. A third OR gate (1020-3) takes the unaltered output of the toggle flip-flop Q' (1004) with a delayed version of the output of the toggle flip-flop Q' (1004) as inputs to produce the SP2 signal. A fourth OR gate (1020-4) takes the unaltered output of the toggle flip-flop Q' (1004) with a slightly more delayed version of the output of the toggle flip-flop Q' (1004) as input to produce the SAMPP1 signal.

CMOS inverters (1015-1 to 1015-12) are used to introduce delay versions of the outputs of the toggle flip-flop Q (1002) and Q' (1004). By controlling these delays in the manner described above, the timing diagram of FIG. 1C can be implemented such that a falling edge of SP1 occurs slightly after a falling edge of SP-A on every odd clock cycle, and a falling edge of SAMPP1 occurs slightly after a falling edge of SP1. Similarly, a falling edge of SP2 occurs slightly after a falling edge of SP-A on every even clock cycle and a falling edge of SAMPP1 occurs slightly after a falling edge of SP2.

Referring now to FIG. 11, FIG. 11 is shows an alteration of the timing circuitry of FIG. 10 and is used to remedy timing mismatches between the first sample-and-hold circuit (FIG. 1B, 145 and the second sample-and-hold circuit (FIG. 1B, 155). The timing circuitry shown in FIG. 11 includes additional components that allow for the adjustment of the time interval between the falling edges of SP-A and SP1 to more closely match the time interval between the falling edges of SP-A and SP2, and vice versa. These adjustments may be controlled by timing trim control signals TT1 to TT8, as demonstrated in the Figure. The first and second OR gates (1020-1, 1020-2) of FIG. 10 are shown, with a separate set of switchable capacitors (1105-1 to 1105-4) between two inverters (1015-1-1 and 1015-2) for each OR gate (1020-1, 1020-2). The delay between SP-A and SP1 can be adjusted independently from the delay between SP-A and SAMPP2 such that the delay between SP1 and SAMPP2 can also be adjusted as needed to compensate for a timing offset between the first sample-and-hold circuits (FIG. 1B, 145) and the second sample-and-hold circuit (FIG. 1B, 155). The third and fourth OR gates (1020-3, 1020-4) of FIG. 10 are shown with the addition of two inverters (1015-7, 1015-8) and a plurality of switchable capacitors (1105-9 to 1105-12) to selectively adjust the delay between SP-A and SP2 at the end of the sampling cycle of the second sample-and-hold circuit (FIG. 1B, 155). Because the output from the toggle flip-flop Q (1102) is based on SP-A, the time interval between a change in SP and a corresponding change in SP1 can be modified by selectively opening or closing the switches of the switchable capacitors (1105-1 to 1105-4) to add or remove shunt capacitance. The switches of the switchable capacitors (1105-1 to 1105-4) may be selectively opened and closed using additional control signals. While four switchable shunt capacitors (1105-1 to 1105-4) are shown in FIG. 11, more or fewer switchable shunt capacitors may be used as may suit a particular application, and in accordance with a desired amount of flexibility in adjusting the delay between SP-A and SP1. Additionally, the value of each switchable capacitor (1105-1 to 1105-4) may vary according to a desired amount of delay to be associated with each capacitor (1105-1 to 1105-4). In certain examples, the value of each switchable capacitor (1105-1 to 1105-4) may be the same, while in other examples the value of different switchable capacitors (1105-1 to 1105-4) may be different.

As mentioned above, timing delay adjustments between the 2 ADC paths can be achieved by adjusting delays between relative sampling times between SP1 and SP2 as illustrated in FIG. 1D. These timing delays can be digitally adjusted as illustrated in FIG. 11. Typically, the resolution of the timing adjustment is determined by the timing delay obtained by enabling the smallest delay bit controlled by TT1 to TT4. According to certain illustrative principles, the actual delay obtained is smaller by a ratio that is approximately determined by the ratio of (Cs+Cp+Cp1)/Cp. Assume this ratio can be large, for example 10. Thus the generated delays are 10 times larger than the actual delay needed in the sampling process. In various examples generating smaller delays accurately is more difficult and more prone to parasitic capacitance than larger delays. Consequently, larger delays are less sensitive to parasitic capacitance, and building larger delays with integrated circuit technology has proven to be more practical.

In some cases, it may be desirable to generate delays that are smaller than can be achieved by simply adding an additional delay element. In such cases, it is possible to achieve a smaller effective delay by toggling the smallest delay element in such a manner that the achieved delay is proportional to the amount of time the smallest delay element is enabled.

According to certain illustrative principles, the delay resolution achieved is a function of the size of the transistors and capacitors in a particular stage whereas the range of the adjustment is dependent on the number of digital bits available for the adjustment.

Further, assume a delay has 5 bits of delay adjustment. 5 bits of delay adjustment allows the range of the delay to be adjusted by +/−32 delay units with a resolution of 1 unit. Each delay unit is arbitrary and is designed for specific values, for example 100 fs. Assume finer resolution than 100 fs is desired to optimize a time interleaved ADC. According to certain illustrative principles finer resolution is achieved by time-modulation of the least-significant-bit (LSB) of the 5-bit delay adjustment circuit.

Time-modulation of the LSB can achieve an effective delay resolution smaller than the resolution of the LSB alone. Consider a block of sampling times consisting of M sampling times. Denote the number of sampling times within the M-length block of sampling times for which the LSB is high as H. The effective delay value of the LSB would be equal to H/M times the delay of the LSB. Hence, the effective resolution would be 1/M times the delay of the LSB, so the resolution a time-modulated LSB may be designed to be arbitrarily small based on the length, M, of the modulating waveform. The modulating waveform may be generated by several means. For example, it may be taken as the output of pseudo random noise generator circuit, or it may be the output of a delta-sigma modulator.

This time-modulation technique is not limited to use with a delay generation circuit. Rather, it may be applied to bandwidth adjustment circuitry as well. Additionally, the modulation waveform need not be a pseudo-random waveform or a waveform generated by a delta-sigma modulator. However, such waveforms are preferred to avoid the introduction of unwanted spurs in the output spectrum of a time-interleaving ADC using time-modulated trim circuitry.

Figure 12:
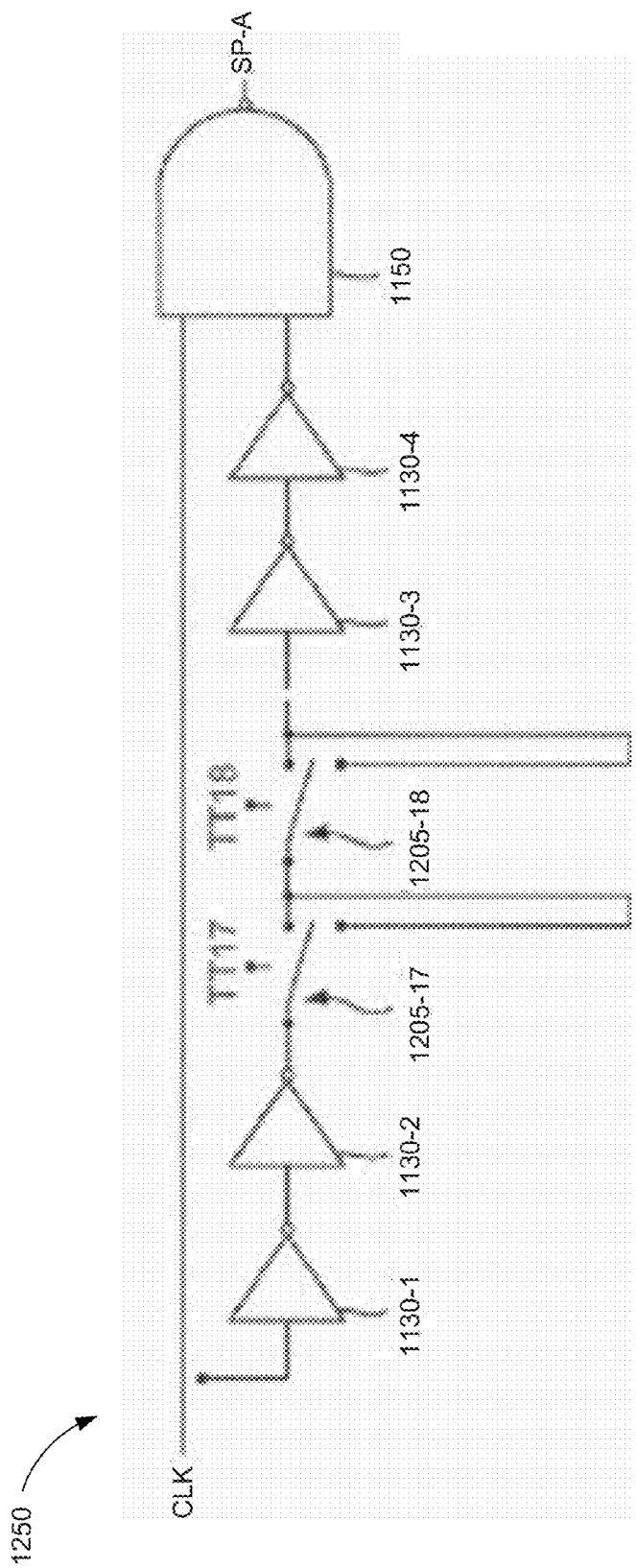
FIG. 12 is a diagram of an illustrative adjustable timing circuitry for an illustrative time-interleaved sample-and-hold system, according to one example of principles described herein.

FIG. 12 illustrates an approach in the context of the timing circuitry shown in FIG. 9. In FIG. 9, an additional delay results when capacitors (945-15, 945-16) are switched on. In FIG. 12, adding paths that have different lengths create delay difference. Each double throw switch (1205-17, 1205-18) allows for the selection between a short conductive path and a longer alternative conducing path. The method of these double throw switches (1205-17, 1205-18) may also be used controlled by timing trim control signals TT1-TT8 respectively of FIG. 11.

Figure 13A:
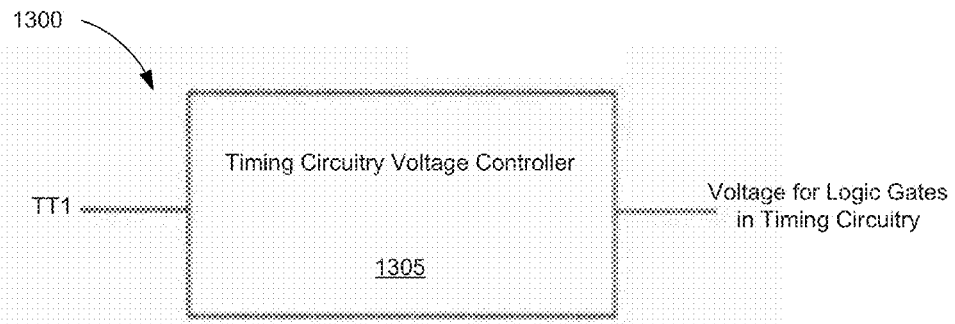
FIGS. 13A-13B are diagrams of illustrative control blocks for adjusting gate voltages of transistors in timing circuitry, according to one example of principles described herein.
Figure 13B:
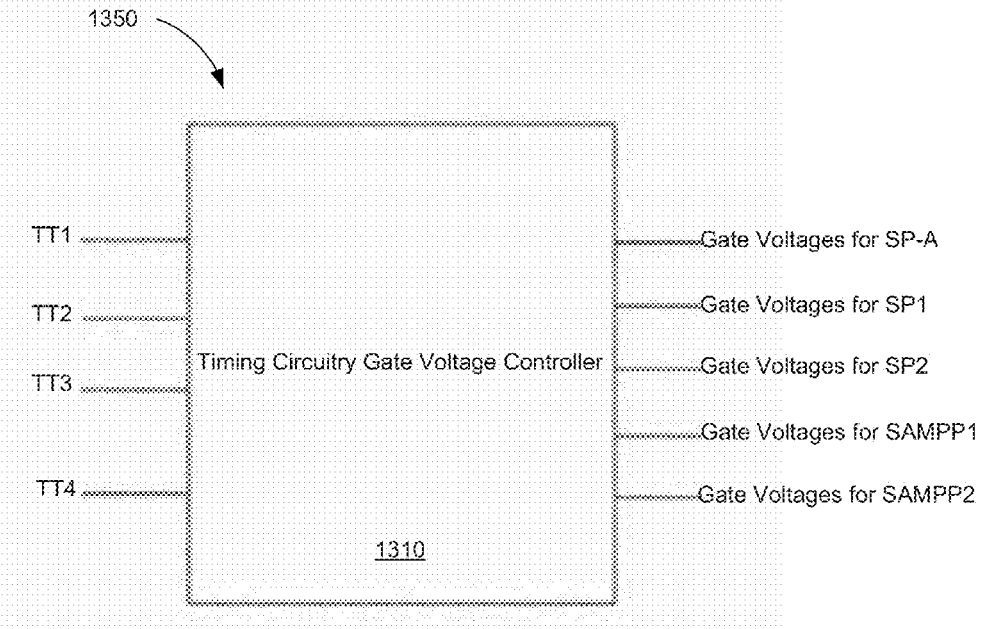

FIGS. 13A-13B are diagrams of illustrative control blocks for adjusting gate voltages of transistors in timing circuitry, according to one example of principles described herein. An additional or alternative method of selectively adjusting the timing of control signals for the sample-and-hold circuits (FIG. 1B, 145, 155) is to selectively adjust the gate voltage used to activate or deactivate transistors in the logic gates of the timing circuitry for the sample-and-hold circuits (FIG. 1B, 145, 155) and/or the common sampling switch (FIG. 1B, 106-1, 106-n). This method relies at least in part on the principle that a transistor will operate more slowly at lower voltages. Thus, by starving the gate voltage of one or more transistors in one or more of the logic gates shown in FIGS. 9-10, delay can be introduced into timing signals affected by that transistor.

FIG. 13A shows an exemplary timing circuit voltage controller block (1305) which receives a timing trim control signal TT1 and adjusts the voltage of each of the logic gates in the timing circuitry. This type of wholesale control over all gate voltages in the timing circuitry may be useful in increasing or decreasing the overall speed of the sample-and-hold circuits (FIG. 1B, 145, 155).

FIG. 13B shows an exemplary timing circuitry gate voltage controller block (1310) which uses timing trim control signals TT1-TT4 to selectively adjust the gate voltages of transistors in logic gates of the timing circuitry to individually introduce or remove delay from specific control signals (SP-A, SP1, SP2, SAMPP1, SAMPP2) for the switches (106-1, 109-1, 109-n, 108-1, 108-n) of the sample-and-hold circuits (FIG. 1B, 145, 155).

Figure 14A:
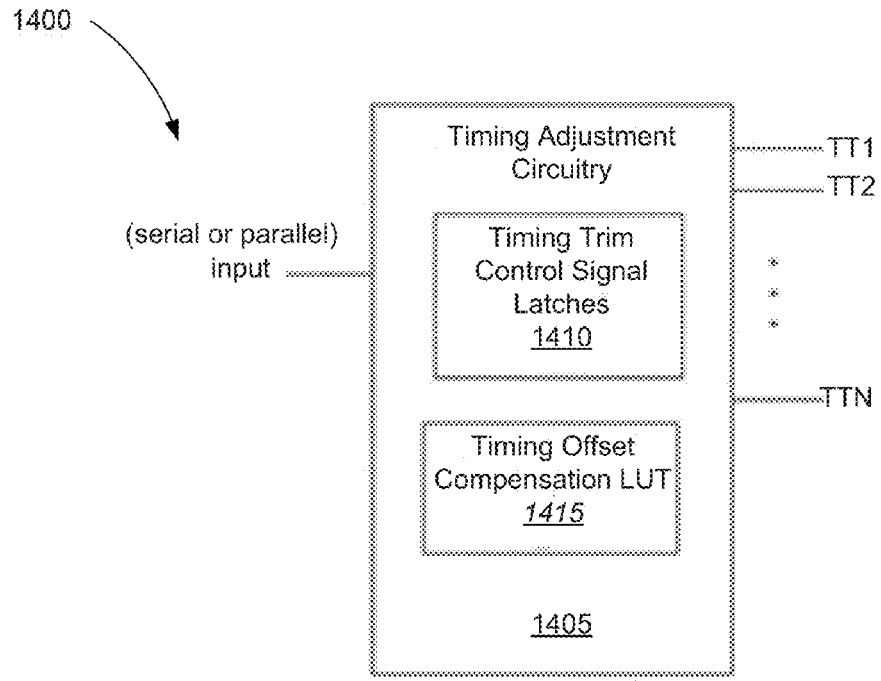
FIGS. 14A-14C are diagrams of illustrative control blocks for adjusting timing circuitry in an illustrative time-interleaved sample-and-hold system, according to one example of principles described herein.
Figure 14B:
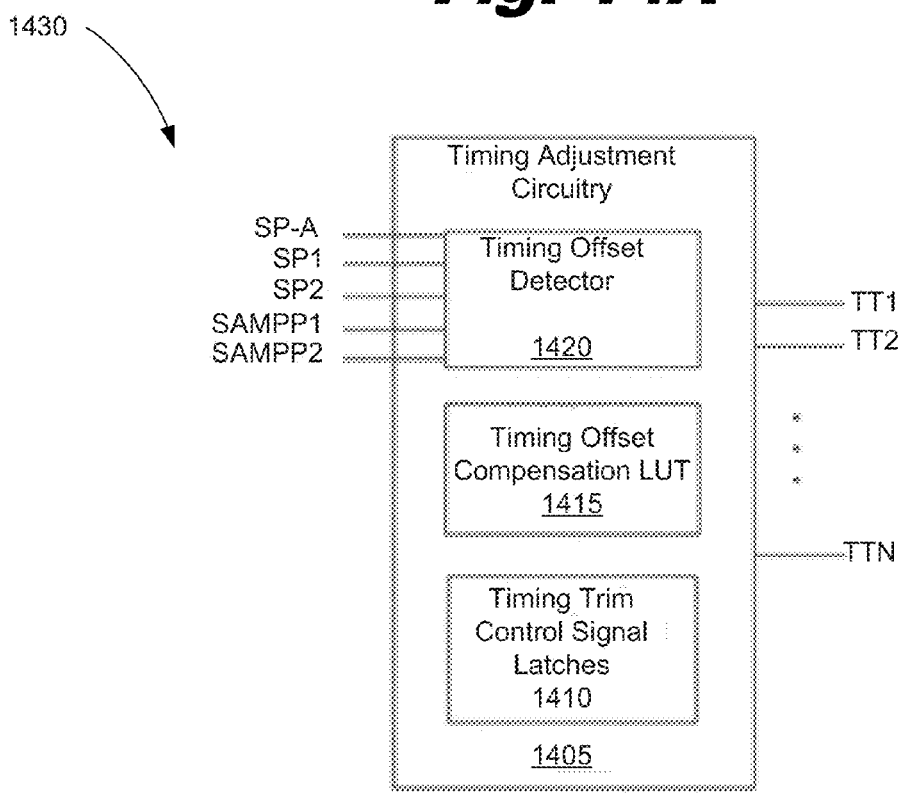
Figure 14C:
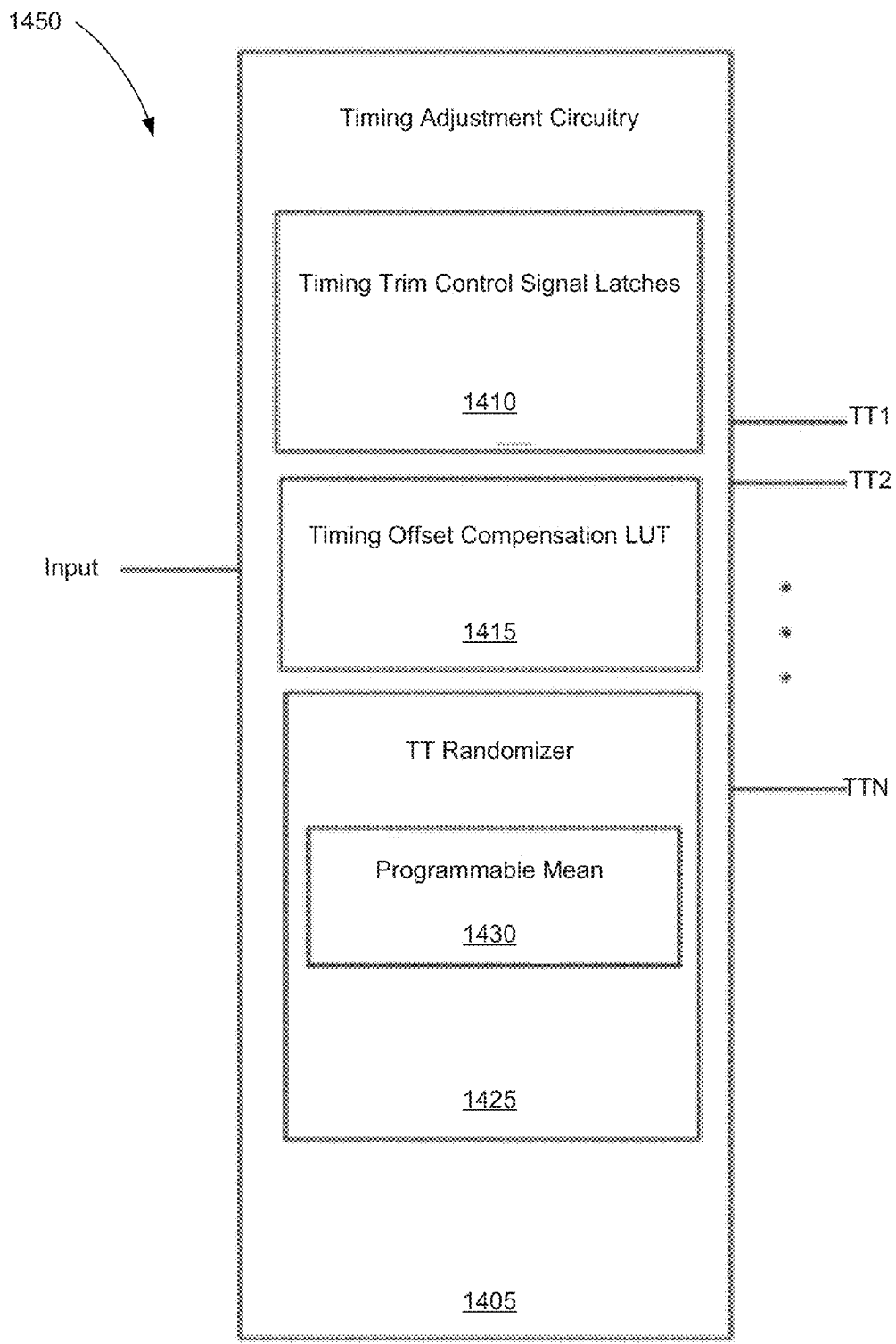

FIGS. 14A-14C are diagrams of illustrative control blocks for adjusting timing circuitry in an illustrative time-interleaved sample-and-hold system, according to one example of principles described herein. FIGS. 14A-14C show illustrative timing adjustment circuitry (1405) that can be used to selectively adjust the timing of control signals to compensate for timing offsets between first and second time-interleaved sample-and-hold circuits (FIG. 1B, 145, 155). The timing adjustment circuitry (1405) is configured to output timing trim control signals (TT1-TTN) to incrementally introduce or remove delay from timing circuitry that produces timing control signals for the sample-and-hold circuits (FIG. 1B, 145, 155) and/or the common sampling switch (FIG. 1B, 106-1). The timing adjustment circuitry (1405) may store a state of each of the timing trim control signals using some form of latches. For example, the timing adjustment circuitry (1405) may include a flip-flop, digital register, entry in volatile or non-volatile memory, or other form of storing a digital bit for each respective timing trim control signal (TT1 to TTN). In some examples, this stored state may be output as the timing trim control signals (TT1 to TTN).

The timing adjustment circuitry (1405) may be configured to change the state of each of timing trim control signal (TT1 to TTN) in order to adjust the timing delay between two control signals (e.g., SP-A and SP1) for the sample-and-hold circuits (FIG. 1B, 145, 155). For example, where each timing trim control signal (TT1 to TTN) controls the state of an individual switch for a switchable capacitor switch, the timing adjustment circuitry (1405) may include a memory controller or other circuitry that writes a new value to a bit corresponding to a timing trim control signal for a switch whose state needs to be changes. The new state may then be stored and output as a control signal to change the state of that switch.

In the example of FIG. 14A, the state timing trim control signals (TT1 to TTN) may be changed in response to a request or other input received from an external process. The input may specify a value for each of the timing trim control signals (TT1 to TTN), or simply a new value for the timing trim control signals (TT1 to TTN) for which a state change is to be made. In other examples, the instruction may simply specify a desired change in timing between a specified set of control signals (SP-A, SP1, SP2, SAMPP1, SAMPP2) for the sample-and-hold circuits (FIG. 1B, 145, 155) and/or the common sampling switch (FIG. 1B, 106-1). The timing adjustment circuitry (1405) may then determine one or more changes to be made to the state of the timing trim control signals (TT1 to TTN) to implement the requested timing change. In some examples, a timing offset compensation look-up table (1415) may specify switch configurations for switchable capacitors or selectively extensible conductive paths, or specific gate voltage values to implement desired timing changes.

In the example of FIG. 14B, the timing adjustment circuitry (1405) may be configured to monitor the control signals (SP-A, SP1, SP2, SAMPP1, SAMPP2) for the sample-and-hold circuits (FIG. 1B, 145, 155) and the common sampling switch (FIG. 1B, 106-1) and automatically change the state of one or more of the timing trim control signals (TT1 to TTN) in response to an undesirable timing offset between two or more of the control signals for the sample-and-hold circuits (FIG. 1B, 145, 155) as detected by an offset detector (1420). In other examples, the timing offset detector (1420) may perform a mathematical function on an output signal (Vout) from a time-interleaved sample-and-hold system to detect signal anomalies indicative of a timing mismatch between sample-and-hold circuits (FIG. 1B, 145, 155).

As shown in the example of FIG. 14C, timing adjustment circuitry (1405) may further include a timing trim control signal randomizer (1425). This randomizer may introduce and element of randomness or pseudo-randomness to at least one of the timing trim control signals (TT1 to TTN). For example, the value of the selected timing trim control signal(s) may randomly or pseudo-randomly change with each sampling cycle. The introduction of randomness or pseudo-randomness to one or more of the timing trim control signals (TT1 to TTN) in a random way, provides the advantage of spreading the energy of any generated spurs in the output of the time-interleaved sample-and-hold circuits (FIG. 1B, 145, 155) such that these spurs are indistinguishable from noise.

In certain embodiments, the mean on-time for the randomized timing trim control signal(s) may be programmable to zero or to another finite non-zero value. For example, a programmable mean value (1430) may be stored in the timing adjustment circuitry and used in the randomization of at least one of the timing trim control signals (TT1 to TTN). To illustrate the advantages associated with a programmable mean on-time, consider the example of a time-interleaved sample-and-hold system (100) with one or more randomized timing trim control signals (TT1 to TTN) for which an inter-modulation delay between the two sample-and-hold circuits (FIG. 1B, 145, 155) exists. By increasing or decreasing the mean on-time of the one or more randomized timing trim control signals (TT1 to TTN), the inter-modulation delay can be compensated for while preserving the benefits of randomization.

Figure 15:
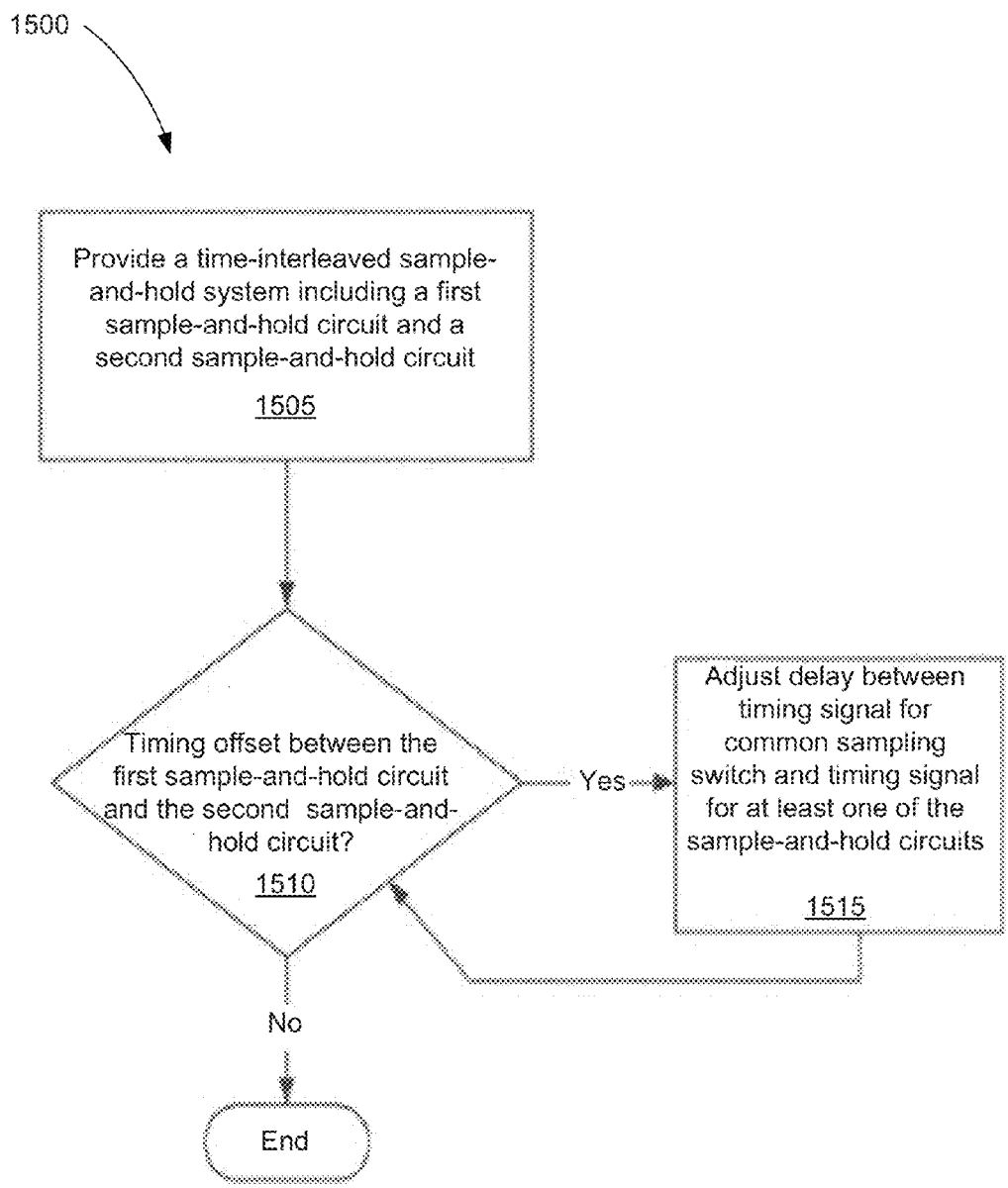
FIG. 15 is a flowchart diagram of an illustrative method of adjusting timing in an illustrative time-interleaved sample-and-hold system, according to one example of principles described herein.

Referring now to FIG. 15, a block diagram is shown of an illustrative method (1500) of remediating a timing offset between a first sample-and-hold circuit and a second sample-and-hold circuit in a time-interleaved sample-and-hold system. According to the method (1500), the aforementioned time-interleaved sample-and-hold system is provided (block 1505). It is then determined (block 1510) if a timing offset exists between the first sample-and-hold circuit and a second sample-and-hold circuit. For example, a timing offset may exist between the two sample-and-hold circuits if a time interval between common sampling switch closing and one of the switches of the first sample-and-hold circuit closing at the end of a sampling operation of the first sample-and-hold circuit does match the time interval between the common sampling switch closing and a corresponding switch of the second sample-and-hold circuit closing at the end of the sampling operation of the second sample-and-hold circuit. This timing offset may be detected automatically by timing adjustment circuitry in the time-interleaved sample-and-hold system. Alternatively, the timing offset may be detected by a process external to the time-interleaved sample-and-hold system. Further, this method is applied to more than 2 ADCs being used as well, by using 1 ADC as a reference and adjusting time differences with other interleaved ADCs.

If such a timing offset is found to exist (block 1510), an adjustment is made (block 1505) to the delay between a timing signal for the common sampling switch (FIG. 1B, 106-1) and a timing signal for at least one of the sample-and-hold circuits. In some examples, at least one timing trim control signal may be identified and adjusted automatically in response to determining if the timing offset exists. Additionally or alternatively, at least one timing trim control signal may be identified in a manual instruction received in the time-interleaved sample-and-hold system from an external process such that the time-interleaved sample-and-hold system adjusts the timing trim control signal identified in the manual instruction.

If an unacceptable timing offset still exists (block 1510) between the first sample-and-hold circuit and the second sample-and-hold circuit, the process of switching (block 1415) at least one shunt capacitor in the timing circuit of the time-interleaved sample-and-hold system may be repeated until the timing offset is negligible or within an acceptable range.

Figure 16:
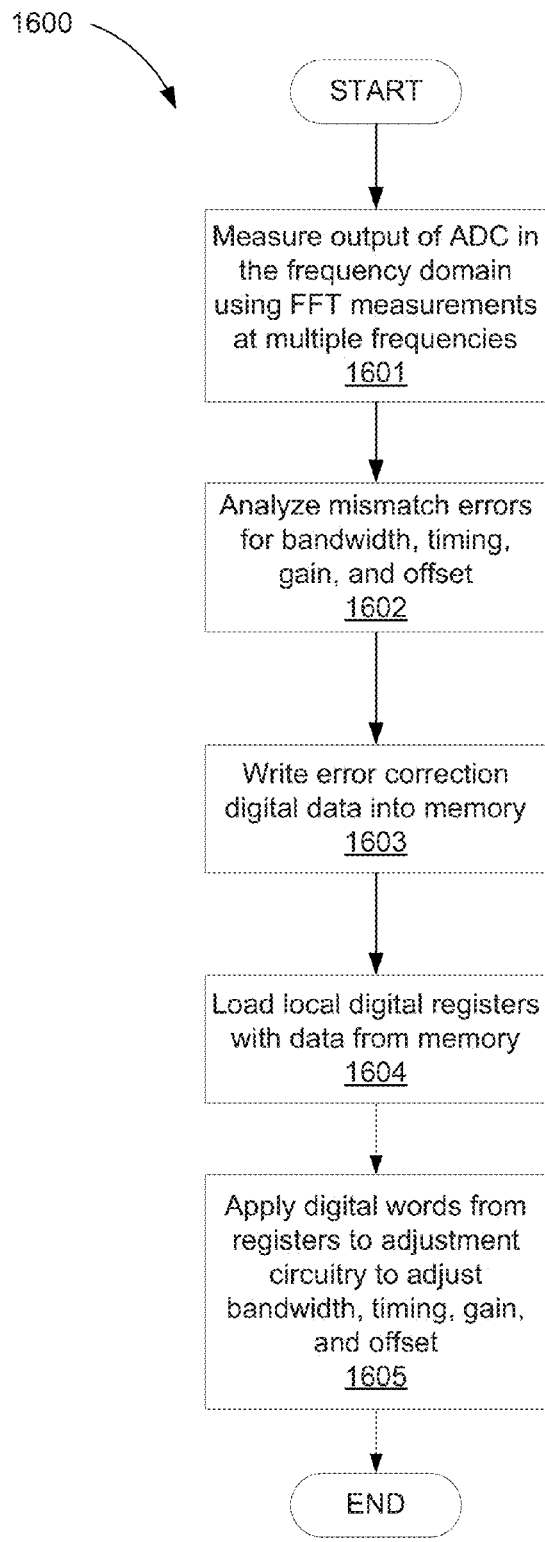
FIG. 16 is a flowchart showing illustrative method for reducing mismatch in a time interleaving ADC using memory elements, according to one example of principles described herein.

FIG. 16 is a flowchart showing memory used to match a time interleaving ADC. According to certain illustrative principles, mismatch errors occurring in a time interleaving ADC (100, 110, 500) system may be reduced using correction coefficients stored in memory elements to adjust bandwidth, timing, gain, and offset settings. As described above in connection with FIGS. 4A and 4B, memory elements are used to store correction coefficients that may be used for a number of frequencies and circuitry to set these correction coefficients in the system (400 and 410) to match ADCs bandwidth, timing, gain, and offset. According to certain illustrative examples, the method includes measuring (1601) output of ADC in the frequency domain using FFT measurements as described in FIGS. 4A and 4B, analyzing (1602) mismatch errors for bandwidth, timing, gain and offset, writing (1603) error correction digital data into memory for each correction coefficient, loading (1604) local digital registers with data from memory, and applying (1605) digital words from registers to adjustment circuitry to adjust bandwidth, timing, gain, and offset. Thus, correction coefficients can be stored in memory and retrieved from memory to adjust bandwidth, timing, gain, and offset to reduce mismatch as described above.

Through use of methods and systems embodying principles described herein, a time interleaving ADC can be manufactured to pseudo randomly sample each ADC. It also has components to adjust the bandwidth, timing, gain, and offset. Digital correction coefficients needed for adjusting key parameter such as bandwidth, gain, timing and offset mismatch is obtained by measurements of a number of sample input frequencies and an analysis of the resulting output data. The coefficients are obtained by a mathematical function that minimizes error over a band of frequencies of interest. The digital coefficients to correct mismatch errors are stored in memory, and circuitry is used to adjust these values to match components in which the performance of the overall circuit is optimized. Additionally, jitter in the clock used to adjust delay between sampling clocks of the interleaved ADCs is mitigated in order to have less impact compared to jitter impacts on SNR caused by the main sampling clock. Jitter in sampling clocks degrades the SNR. Delaying the sampling interval involves delaying the sampling clock and any increased jitter in this process is undesirable. Delay circuits can increase jitter in the delayed digital clocks. However, the circuit of FIG. 1B is not as sensitive to jitter on 109-$n$ as it is to jitter on main sampling clock 155. This technique of delay adjustment when used with the sampling circuitry shown in FIG. 1B, can achieve the timing adjustment needed without substantially degrading SNR due to jitter in the delayed clocks.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A time interleaving Analog-to-Digital Converter (ADC), comprising:
    a plurality of ADCs;
    a timing generator that generates a clock signal for each of the plurality of ADCs such that edges of said clock signals trigger sampling of an input signal by the plurality of ADCs; and
    a timing adjustment circuit to receive and independently adjust the clock signals before the clock signals are received by the ADCs such that samplings of said input signal are equally spaced in time and occur at a rate of 1/N times a desired sampling rate,
    a random number generator to pseudo randomly select which ADC samples the input signal; and
    a circuit for adjusting the bandwidth of the plurality of ADCs, wherein the bandwidth of each of the plurality of ADC's is independently adjusted in conjunction with adjustment to the clock signals such that samplings of said input signal are equally spaced in time.

2. The time interleaving ADC of claim 1, wherein the time interleaving ADCs adjusts bandwidth, timing, offset and gain mismatches by using mismatch adjustment coefficients determined by a mathematical function.

3. The time interleaving ADC of claim 2, wherein the time interleaving ADCs are pipelined ADCs.

4. A time interleaving Analog-to-Digital Converter (ADC), comprising:
    a plurality of ADCs;
    a timing generator that generates a clock signal for each of the plurality of ADCs such that edges of said clock signals trigger sampling of an input signal by the plurality of ADCs; and
    a timing adjustment circuit to receive and adjust the clock signals before the clock signals are received by the ADCs such that samplings of said input signal are spaced in time and occur at a rate of 1/N times a desired sampling rate; and
    a random number generator to pseudo randomly select which ADC samples the input signal;
    a circuit for adjusting the bandwidth of the plurality of ADCs; and
    at least three ADCs when increasing the sample rate by two times; and once one ADC is sampled, the next ADC to be sampled is pseudo randomly selected from the two remaining ADCs.

5. The time interleaving ADC of claim 1, wherein the first interleaved stage of a multistage ADC is pseudo randomly sampled.

6. The time interleaving ADC of claim 1, further comprising a controller to randomly select one of N samplings paths for sampling the input signal and gating the outputs of N interleaved samplers to select only one output corresponding to the randomly selected sampled path.

7. A time interleaving Analog-to-Digital Converter (ADC), comprising:
    a plurality of ADCs;
    a timing generator that generates a clock signal for each of the plurality of ADCs such that edges of said clock signals trigger sampling of an input signal by the plurality of ADCs; and
    a timing adjustment circuit to receive and adjust the clock signals before the clock signals are received by the ADCs such that samplings of said input signal are spaced in time and occur at a rate of 1/N times a desired sampling rate; and
    a random number generator to pseudo randomly select which ADC samples the input signal;
    a circuit for adjusting the bandwidth of the plurality of ADCs; and
    wherein each of the interleaved ADCs comprises:
    an input to receive an input signal;
    a first filter connected to the input signal, the output of the first filter connected to a quantizer means to sample the signal received by the quantizer; and
    a second filter connected to the input signal, with the output of the second filter connected to a residue generator;
    such residue generator coupled to said quantizer and a sample-and-hold circuit;
    in which the sample-and-hold circuit samples the signal received by the residue generator separately from the quantizer path; and
    in which the sample and hold in both paths have adjustable bandwidth.

8. The time interleaving ADC of claim 7, in which the input is connected to said first filter with said adjustable bandwidth and the output of said first filter is connected to the sample-and-hold circuit.

9. The time interleaving ADC of claim 8, wherein said sample and holds do not have adjustable bandwidth.

10. The time interleaving ADC of claim 1, in which the timing adjustment includes time increments smaller than smallest delay created by the clock adjustment circuitry when applied to the ADC.

11. The time interleaving ADC of claim 10, wherein time modulation of said time adjusted values from said clock adjustment circuitry is used to create smaller time increment values.

12. The time interleaving ADC of claim 11, wherein said time modulation is pseudorandom with programmable average delay values.

13. The time interleaving ADC of claim 1, wherein multiple sample and hold circuits use a common sampling switch.

14. The time interleaving ADC of claim 7, wherein multiple sample and hold circuits use a common sampling switch.

15. The time interleaving ADC of claim 7, wherein at least N−1 of said sample-and-hold circuits adjusts the bandwidth for at least N of said time interleaved ADCs.

16. The time interleaving ADC of claim 8, further comprising a digital multiplexor to combine outputs from the individual ADC's into a single, time-interleaved output stream.

17. The time interleaving ADC of claim 1, wherein an actual delay adjustment achieved in the sampling time of the ADCs is less than a delay adjustment in a corresponding clocking waveform made by said timing adjustment circuit.

18. The time-interleaving ADC of claim 1, further comprising:
    memory to store a bandwidth coefficient for each of said ADCs; and
    a bandwidth adjusting component to use the bandwidth coefficient stored in said memory to alter the bandwidth of the ADCs in the analog domain.

19. The time interleaving ADC of claim 1, further comprising:
    memory to store a gain adjustment value for each of the ADCs; and
    a gain adjusting component to minimize gain error between each ADC using a gain adjustment value.

20. The time interleaving ADC of claim 1, further comprising:
    memory to store an offset adjustment value for each of the ADCs; and
    an offset adjusting component to minimize offset mismatch between each ADC using the offset adjustment value.

21. The time interleaving ADC of claim 1, further comprising:
    memory to store a gain coefficient, gain adjustment value for each of the ADCs; and
    a gain adjusting component to modify a digital output value of each of the ADCs to equalize a gain for each path through the time-interleaving ADCs using the gain coefficient values stored in the memory.

22. The time interleaving ADC of claim 1, further comprising:
    memory to store an offset coefficient for each of the ADCs; and
    an offset adjusting component to modify a digital output value of each of the ADCs such that the ADCs match an offset between an analog input and an output for each path through the time-interleaving ADCs using the offset coefficient values stored in the memory.

23. The time interleaving ADC of claim 1, wherein bandwidth mismatch, sample time mismatch, gain mismatch, and offset mismatch are minimized using a correction coefficient that adjusts a bandwidth, sample time delay, gain, and offset mismatch for each path through the time-interleaving ADC.

24. The time interleaving ADC of claim 23, further comprising a function that uses output data from Fast Fourier Transformation (FFT) of said ADC outputs at multiple input frequencies to determine said bandwidth mismatch, sample time mismatch, gain mismatch, and offset mismatch such that said correction coefficients suitable for input into digital memory of said time-interleaving ADC are obtained.

25. A method for operating a time interleaving Analog-to-Digital Converter (ADC), said time interleaving Analog-to-Digital Converter comprising:
    a plurality of ADCs each comprising a plurality of sample-and-hold (S/H) circuits;
    a timing generator that generates a clock signal for each of the plurality of S/H circuits such that edges of said clock signals trigger sampling of an input signal by the S/H circuits; and
    a random number generator; and
    a timing adjustment circuit;
    said method comprising, with said timing adjustment circuit:
    receiving and adjusting the clock signals before the clock signals are received by the plurality of S/H circuits; and
    adjusting a bandwidth of the plurality of S/H circuits; and
    connecting an output from each of the plurality of S/H circuits to a single, common operational amplifier, the output of said amplifier then being digitized.

26. The method of claim 25, further comprising equally spacing said samplings of said input signal in time by operation of said timing adjustment circuit.

27. The method of claim 25, further comprising adjusting a bandwidth of each of the plurality of ADCs individually.

28. The method of claim 25, further comprising adjusting a gain of a digital output value of each of the plurality of ADCs.

29. The method of claim 25, further comprising adjusting an offset of a digital output value of each path through the time-interleaved ADC using an offset coefficient to match an offset of an analog input and an output for each path through the time-interleaved ADC.

30. The method of claim 29, further comprising adjusting a gain of a digital output value of each path through the time-interleaved ADC using gain coefficient to match gain offset between an analog input and an output for each path through the time-interleaved ADC.

31. The method of claim 30, further comprising minimizing each of bandwidth mismatch, sample time mismatch, gain mismatch, and offset mismatch using correction coefficients that adjusts the bandwidth, sample time delay, gain, and offset mismatch for each path through one of the ADCs.

32. The method of claim 31, further comprising determining the bandwidth mismatch, sample time mismatch, gain mismatch and offset mismatch of individual ADC's by employing Fast Fourier Transforms (FFTs) on data collected from operation of the time interleaving Analog-to-Digital Converter at a number of frequencies.

33. A time interleaving Analog-to-Digital Converter (ADC), comprising:
   a plurality of ADCs;
   a timing generator which generates a clock signal for each of the plurality of ADCs such that edges of said clock signals trigger sampling of an input signal by the plurality of ADCs; and
   a random number generator to pseudo randomly select which ADC samples the input signal; and
   a timing adjustment circuit to receive and adjust the clock signals before the clock signals are received by the ADCs such that samplings of said input signal are spaced in time and occur at a rate of 1/N times a desired sampling rate and time adjustment values;
   in which the timing adjustment includes time increments smaller than smallest delay created by the clock adjustment circuitry when applied to the ADC.

34. A time interleaving Analog-to-Digital Converter (ADC), comprising:
   a plurality of sample-and-hold (S/H) circuits;
   a timing generator that generates a clock signal for each of the plurality of S/H circuits such that edges of said clock signals trigger sampling of an input signal by the plurality of S/H circuits; and
   a timing adjustment circuit to receive and adjust the clock signals before the clock signals are received by the S/H circuits such that samplings of said input signal are equally spaced in time and occur at a rate of 1/N times a desired sampling rate; and
   a random number generator to pseudo randomly select which S/H circuit samples the input signal;
   a circuit for adjusting the bandwidth of the plurality of S/H circuits; and
   an ADC for digitizing the output of the selected S/H circuit.

35. The ADC of claim 34, wherein the S/H circuits are connected directly or indirectly to single ended or differential inputs.

36. The ADC of claim 34, wherein each S/H circuit comprises two-scaled S/H circuits.

* * * * *